US008071874B2

(12) United States Patent
Beckenbaugh et al.

(10) Patent No.: US 8,071,874 B2
(45) **Date of Patent: *Dec. 6, 2011**

(54) PHOTOVOLTAIC CELLS INCORPORATING RIGID SUBSTRATES

(75) Inventors: Bill Beckenbaugh, New Castle, NH (US); Russell Gaudiana, Merrimack, NH (US); Kethinni G. Chittibabu, Westford, MA (US)

(73) Assignee: Konarka Technologies, Inc., Lowell, MA (US)

( * ) Notice: Subject to any disclaimer, the term of this patent is extended or adjusted under 35 U.S.C. 154(b) by 1414 days.

This patent is subject to a terminal disclaimer.

(21) Appl. No.: 11/603,448

(22) Filed: Nov. 22, 2006

(65) Prior Publication Data

US 2007/0102040 A1 May 10, 2007

Related U.S. Application Data

(63) Continuation of application No. 10/351,265, filed on Jan. 24, 2003, now abandoned, which is a continuation-in-part of application No. 10/057,394, filed on Jan. 25, 2002, now Pat. No. 6,706,963.

(60) Provisional application No. 60/351,691, filed on Jan. 25, 2002, provisional application No. 60/368,832, filed on Mar. 29, 2002, provisional application No. 60/400,289, filed on Jul. 31, 2002, provisional application No. 60/427,642, filed on Nov. 19, 2002.

(51) Int. Cl.
*H01L 31/00* (2006.01)

(52) U.S. Cl. ... 136/263; 136/256; 136/252; 252/183.11; 252/183.13; 516/31; 516/33; 516/198

(58) Field of Classification Search .................. 136/263, 136/252, 256; 117/68, 73, 78; 252/183.11, 252/183.13; 427/180, 190, 205, 343, 189; 516/31, 33, 198

See application file for complete search history.

(56) References Cited

U.S. PATENT DOCUMENTS

| | | |
|---|---|---|
| 3,037,122 A | 5/1962 | Strother |
| 3,069,487 A | 12/1962 | Strother |
| 3,206,831 A | 9/1965 | Strother |

(Continued)

FOREIGN PATENT DOCUMENTS

| | | |
|---|---|---|
| DE | 42 20 762 | 1/1993 |

(Continued)

OTHER PUBLICATIONS

Bach et al, "Solid-state dye-sensitized mesoporous $TiO_2$ solar cells with high photon-to-electron conversion efficiencies," *Nature*, vol. 395, pp. 583-585, Oct. 1998.

(Continued)

*Primary Examiner* — Basia Ridley
*Assistant Examiner* — Thanh-Truc Trinh
(74) *Attorney, Agent, or Firm* — Fish & Richardson P.C.

(57) ABSTRACT

The invention, in one aspect, provides a photovoltaic cell including a charge carrier material and a photosensitized interconnected nanoparticle material including nanoparticles linked by a polymeric linking agent, both disposed between first and second rigid, significantly light-transmitting substrates. In one embodiment, the charge carrier material and the photosensitized interconnected nanoparticle material are disposed between a first and second flexible, significantly light-transmitting substrate that are themselves disposed between the first and second rigid, significantly light-transmitting substrates.

30 Claims, 31 Drawing Sheets

U.S. PATENT DOCUMENTS 3,206,832 A 9/1965 Strother
3,679,949 A 7/1972 Uekusa et al.
3,872,047 A 3/1975 Jandourek
3,969,163 A 7/1976 Wakefield
3,984,256 A 10/1976 Fletcher et al.
4,080,488 A 3/1978 Chen et al.
4,232,108 A 11/1980 Dessauer
4,243,432 A 1/1981 Jordan et al.
4,295,329 A 10/1981 Windley
4,385,102 A 5/1983 Fitzky et al.
4,436,558 A 3/1984 Russak
4,492,743 A 1/1985 Howe
4,500,880 A 2/1985 Gomersall et al.
4,589,194 A 5/1986 Roy
4,684,537 A 8/1987 Graetzel et al.
4,821,291 A 4/1989 Stevens et al.
4,872,925 A 10/1989 McMaster
4,913,744 A 4/1990 Hoegl et al.
4,927,721 A 5/1990 Gratzel et al.
4,937,586 A 6/1990 Stevens et al.
4,962,466 A 10/1990 Revesz et al.
5,084,365 A 1/1992 Gratzel et al.
5,178,685 A 1/1993 Borenstein et al.
5,248,349 A 9/1993 Foote et al.
5,273,911 A 12/1993 Sasaki et al.
5,331,183 A 7/1994 Sariciftci et al.
5,343,519 A 8/1994 Feldman
5,350,644 A 9/1994 Graetzel et al.
5,385,614 A 1/1995 Albright et al.
5,437,736 A 8/1995 Cole
5,441,827 A 8/1995 Gratzel et al.
5,454,879 A 10/1995 Bolger
5,454,880 A 10/1995 Sariciftci et al.
5,463,057 A 10/1995 Graetzel et al.
5,474,621 A 12/1995 Barnard
5,482,570 A 1/1996 Saurer et al.
5,525,440 A 6/1996 Kay et al.
5,548,282 A 8/1996 Escritt et al.
5,569,561 A 10/1996 Exnar et al.
5,637,156 A 6/1997 Kubota et al.
5,641,362 A 6/1997 Meier
5,728,487 A 3/1998 Gratzel et al.
5,751,257 A 5/1998 Sutherland
5,789,592 A 8/1998 Gratzel
5,830,597 A 11/1998 Hoffmann et al.
5,869,206 A 2/1999 Sotomura
5,881,083 A 3/1999 Diaz-Garcia et al.
5,885,368 A 3/1999 Lupo et al.
5,902,416 A 5/1999 Kern et al.
5,906,004 A 5/1999 Lebby et al.
5,986,206 A 11/1999 Kambe et al.
6,013,871 A 1/2000 Curtin
6,024,807 A 2/2000 Pappas et al.
6,043,428 A 3/2000 Han et al.
6,067,184 A 5/2000 Bonhote et al.
6,067,313 A 5/2000 Cafarella et al.
6,069,313 A 5/2000 Kay
6,075,203 A 6/2000 Wang et al.
6,080,690 A 6/2000 Lebby et al.
6,084,176 A 7/2000 Shiratsuchi et al.
6,121,540 A 9/2000 Takeda et al.
6,130,378 A 10/2000 Hatano et al.
6,175,075 B1 1/2001 Shiotsuka et al.
6,232,547 B1 5/2001 Meissner et al.
6,239,355 B1 * 5/2001 Salafsky ....................... 136/250
6,245,988 B1 6/2001 Gratzel et al.
6,278,056 B1 8/2001 Sugihara et al.
6,281,429 B1 8/2001 Takada et al.
6,288,324 B1 9/2001 Komori et al.
6,288,325 B1 9/2001 Jansen et al.
6,288,326 B1 9/2001 Hayashi et al.
6,291,763 B1 * 9/2001 Nakamura .................... 136/256
6,310,282 B1 10/2001 Sakurai et al.
6,319,747 B1 11/2001 Todisco et al.
6,335,480 B1 1/2002 Bach et al.
6,350,946 B1 * 2/2002 Miyake et al. ................ 136/252
6,355,125 B1 * 3/2002 Tahon et al. .................... 156/99
6,376,765 B1 4/2002 Warishi et al.
6,384,321 B1 5/2002 Mikoshiba et al.
6,426,827 B1 7/2002 Bonhote et al.
6,441,297 B1 8/2002 Keller et al.
6,444,189 B1 9/2002 Wang et al.
6,469,243 B2 10/2002 Yamanaka et al.
6,538,194 B1 3/2003 Koyanagi et al.
6,580,026 B1 6/2003 Koyanagi et al.
6,580,027 B2 6/2003 Forrest et al.
6,657,119 B2 12/2003 Lindquist et al.
6,664,623 B1 12/2003 Phani et al.
6,706,963 B2 3/2004 Gaudiana et al.
6,858,158 B2 2/2005 Chittibabu et al.
6,900,382 B2 5/2005 Chittibabu et al.
6,913,713 B2 7/2005 Chittibabu et al.
6,924,427 B2 8/2005 Eckert et al.
2001/0004901 A1 6/2001 Yamanaka et al.
2001/0027806 A1 10/2001 Yamanaka et al.
2001/0032665 A1 10/2001 Han et al.
2002/0042343 A1 4/2002 Akui et al.
2002/0150613 A1 10/2002 Govil et al.
2002/0189666 A1 * 12/2002 Forrest et al. ................. 136/263
2003/0021566 A1 1/2003 Shustack et al.
2003/0056821 A1 3/2003 Chittibabu et al.
2003/0127130 A1 7/2003 Murai et al.
2003/0140959 A1 7/2003 Gaudiana et al.
2003/0145885 A1 8/2003 Kang et al.
2003/0164188 A1 9/2003 Murai et al.
2003/0188776 A1 10/2003 Li et al.
2003/0188777 A1 10/2003 Gaudiana et al.
2003/0189402 A1 10/2003 Gaudiana et al.
2003/0192583 A1 10/2003 Ryan
2003/0192584 A1 10/2003 Beckenbaugh et al.
2003/0192585 A1 10/2003 Beckenbaugh et al.
2003/0196692 A1 10/2003 Koyanagi et al.
2003/0230337 A1 12/2003 Gaudiana et al.
2004/0025933 A1 2/2004 Chittibabu et al.
2004/0025934 A1 2/2004 Chittibabu et al.
2004/0031520 A1 2/2004 Ryan
2004/0187911 A1 9/2004 Gaudiana et al.
2004/0194821 A1 10/2004 Chittibabu et al.
2005/0019414 A1 1/2005 Chittibabu et al.

FOREIGN PATENT DOCUMENTS

DE 42 21 084 A1 1/1994
DE G 93 08 513.3 3/1994
DE 195 28 401 A1 2/1997
DE 19710685 A1 9/1998
EP 0 739 020 A2 10/1996
EP 0 785 527 7/1997
EP 859386 8/1998
EP 0901175 9/1998
EP 0 993 050 4/2000
EP 1 033 762 A2 9/2000
EP 1087412 A2 3/2001
EP 1 089 305 A2 4/2001
EP 1 209 708 A1 5/2002
JP 59-125670 7/1984
JP 59-144177 8/1984
JP 62-205669 9/1987
JP 7-116503 A 5/1995
JP 8-116078 5/1996
JP 10-1334 A 1/1998
JP 2000-196192 A 7/2000
JP 2000-294306 A 10/2000
JP 2001-109956 4/2001
JP 2001-320069 11/2001
WO WO91/16719 10/1991
WO 92/09061 11/1991
WO WO 93/18532 9/1993
WO WO 96/00198 1/1996
WO 96/08006 3/1996
WO WO 96/29715 9/1996
WO WO 98/05084 2/1998
WO WO 00/42674 7/2000
WO WO 00/76660 A1 12/2000
WO WO 01/25316 A1 4/2001
WO WO 01/86734 * 11/2001

OTHER PUBLICATIONS

Cao et al., "A Solid State, Dye Sensitized Photoelectrochemical Cell," *J. Phys. Chem.*, vol. 99, pp. 17071-17073 (1995).
Carotta et al., "Preparation and Characterization of Nanostructured Titania Thick Films," *Advanced Materials*, vol. 11, No. 11, pp. 943-946 (1999).
Gomez et al., "Nanocrystalline Ti-oxide-based solar cells made by sputter deposition and dye sensitization: Efficiency versus film thickness," *Solar Energy Materials & Solar Cells*, vol. 62, pp. 259-263 (2000).
Green, "Photovoltaics: technology overview," *Energy Policy*, vol. 28, pp. 989-998 (2000).
Gregg, "Bilayer molecular solar cells on spin-coated $TiO_2$ substrates," *Chemical Physics Letters*, vol. 258, pp. 376-380 (1996).
Hagfeldt et al., "Molecular Photovoltaics", *Accounts of Chemical Research*, vol. 33, pp. 269-277 (2000).
Li et al., "Titanium dioxide films for photovoltaic Cells derived from a sol-gel process," *Solar Energy Materials and Solar Cells*, vol. 56, pp. 167-174 (1999).
Mikoshiba et al., "Highly efficient photoelectrochemical cell with novel polymer gel electrolytes", Conference Organizers: WIP, Syfvensteinstr. 2. D-81369 Munchen, Germany, 3 pages, undated.
Nasr et al., "Role of Iodide in Photoelectrochemical Solar Cells. Electron Transfer between Iodide Ions and Ruthenium Polypyridyl Complex Anchored on Nanocrystalline $SiO_2$ and $SnO_2$ Films," *J. Phys. Chem.* B, vol. 102, pp. 4944-4951 (1998).
Park et al., "Comparison of Dye-Sensitized Rutile- and Anatase-Based $TiO_2$ Solar Cells," *J. Phys. Chem.* B, vol. 104, pp. 8989-8994 (2000).
Petritsch et al., "Dye-based donor/acceptor solar cells," *Solar Energy Materials and Solar Cells*, vol. 61, pp. 63-72 (2000).
Phani et al., "Titania solar cells: new photovoltaic technology," *Renewable Energy*, vol. 22, pp. 303-309 (2001).
Pichot et al., "Low-Temperature Sitnering of $TiO_2$ Colloids: Application to Flexible Dye-Sensitized Solar Cells", *Langmuir*, vol. 16, pp. 5626-5630 (2000).
Pichot et al., "The Photovoltage-Determining Mechanism in Dye-Sensitized Solar Cells", *J Phys. Chem.* B, vol. 104, pp. 6-10 (2000).
Ruile et al., "Novel sensitizers for photovoltaic cells. Structural variations of Ru (II) complexes containing 2,6-bis (1-methylbenzimidazol-2-yl) pyridine," *Inorganica Chimica Acta*, vol. 261, pp. 129-140 (1997).
Schawarzburg et al., "Origin of Photovoltage and Photocurrent in the Nanoporous Dye-Sensitized Electrochemical Solar Cell," *J. Phys. Chem* B, vol. 103, No. 28, pp. 5743-5746 (1999).
Smestad, "Education and solar conversion: Demonstrating electron transfer," *Solar Energy Materials and Solar Cells*, vol. 55, pp. 157-178 (1998).
Sommeling et al., "Flexible Dye-Sensitized Nanocrystalline $TiO_2$ Solar Cells," ECN Solar Energy, 5 pages, undated.
Trupke et al., "Dependence of the Photocurrent Conversion Efficiency of Dye-Sensitized Solar Cells on the Incident Light Intensity," *J. Phys. Chem B.*, vol. 104, pp. 11484-11488 (2000).
Patent Cooperation Treaty (PCT) ISR; International Application No. PCT/US02/18922; mailed Mar. 19, 2004.
Patent Cooperation Treaty (PCT) IPER; International Application No. PCT/US02/18922; mailed Sep. 2, 2004.
Patent Cooperation Treaty (PCT) ISR; International Application No. PCT/US03/02355; mailed Jan. 26, 2004.
Patent Cooperation Treaty (PCT) ISR; International Application No. PCT/US03/02263; mailed Feb. 17, 2004.
Patent Cooperation Treaty (PCT) International Search Report; International Application No. PCT/US03/02262; mailed Feb. 5, 2004.
Patent Cooperation Treaty (PCT) International Search Report; International Application No. PCT/US03/02094; mailed Sep. 23, 2003.
Patent Cooperation Treaty (PCT) International Search Report; International Application No. PCT/US03/02261; mailed Sep. 26, 2003.
Baps et al., "Ceramic Based Solar Cells in Fiber Form," Key Engineering Materials, 206-213, 2002, pp. 937-940.
Blum et al., "Nanocomposites by Covalent Bonding between Inorganic Nanoparticles and Polymers," Materials Research Society Symposium Proceedings, 676, 2001, pp. Y1.8.1-Y1.8.6.
Kang et al., "Enhanced Stability of Photocurrent-Voltage Curves in Ru(II)-Dye-Sensitized nanocrystalline $TiO_2$ Electrodes with Carboxylic Acids," Journal of the Electrochemical Society, 147, (8), 2000, pp. 3049-3053.
Mosurkal et al., "Rod-like Dinuclear Ruthenium Complexes for Dye-sensitized Photovoltaics," Materials Research Society Symposium Proceedings, 708, 2002, pp. 367-373.
Nazeeruddin et al., "Conversion of Light into Electricity with Trinuclear Ruthenium Complexes Adsorbed on Textured $TiO_2$ Films," Helvetica Chimica Acta, 73, 1990, pp. 1788-1803.
Zuo et al., "Photo-rechargeable battery with $TiO_2$/carbon fiber electrodes prepared by laser deposition," Solar Energy Materials & Solar Cells, 62, 2000, pp. 133-142.
Annex to Form PCT/ISA/206; International Application No. PCT/US03/02355.
Annex to Form PCT/ISA/206; International Application No. PCT/US03/02263.
O'Regan and Gratzel, "A Low-Cost, High-Efficiency Solar Cell Based on Dye-Sensitized Colloidal $TiO_2$ Films," *Nature*, 353, 737-739 (1991).
Fan and Bard, "Spectral Sensitization of the Heterogeneous Photocatalytic Oxidation of Hydroquinone in Aqueous Solutions at Phthalocyanine—Coated $TiO_2$ Powders," *American Chemical Society* 101, 6139-6140 (1979).
Borgarello et al., "Sustained Water Cleavage by Visible Light," *Journal American Society* 103, 6324-6329 (1981).
Duonghong et al., "Integrated Systems for Water Clevage by Visible Light: Sensitization of $TiO_2$ Particles by Surface Derivation with Ruthenium Complexes," *Helvetica Chimica Acta*, 67, 1012-118 (1984).
Moser and Gratzel, "Photosensitized Electron Injection in Colloidal Semiconductors," *Journal American Chemistry Society*, 106, 6557-6564 (1984).
Kalyanasundaram et al., "Sensitization of $TiO_2$ in the Visible Light Region Using Zinc Porphyrins," *J. Phys. Chem.* 91, 2342-2347 (1987).
Argazzi et al., "Light-induced charge separation across Ru(II)-modified nanocrystalline $TiO_2$ interfaces with phenothiazin donors," *J. Phys. Chem. B* 101, 2591-2597 (1997).
Bonhote et al., "Efficient lateral electron transport inside a monolayer of aromatic amines anchored on nanocrystalline metal oxide films," *J. Phys. Chem. B* 102, 1498-1507 (1998).
Bonhote et al., "Long-lived photoinduced charge separation and redox-type photochromism on mesoporous oxide films sensitized by molecular dyads," *J. Am. Chem. Soc.* 121, 132401336 (1999).

* cited by examiner 502
504
506
508
510
512

PHOTOVOLTAIC CELLS INCORPORATING RIGID SUBSTRATES

CROSS-REFERENCE TO RELATED APPLICATIONS

This application is a continuation of U.S. patent application Ser. No. 10/351,265 filed on Jan. 24, 2003, now abandoned which is a continuation-in-part of U.S. patent application Ser. No. 10/057,394 filed on Jan. 25, 2002, now U.S. Pat. No. 6,706,963, the entire disclosures of which are herein incorporated by reference. U.S. patent application Ser. No. 10/351,265 also claims the benefits of and priority to U.S. Provisional Patent Application Ser. No. 60/351,691 filed on Jan. 25, 2002, to U.S. Provisional Patent Application Ser. No. 60/368,832 filed on Mar. 29, 2002, to U.S. Provisional Patent Application Ser. No. 60/400,289 filed on Jul. 31, 2002, and to U.S. Provisional Patent Application Ser. No. 60/427,642 filed on Nov. 19, 2002, all of which are owned by the assignee of the instant application and the disclosures of which are incorporated herein by reference in their entireties.

FIELD OF THE INVENTION

The invention relates generally to the field of photovoltaic devices, and more specifically to interconnecting nanoparticles at low temperatures on rigid substrates to form photovoltaic cells and modules.

BACKGROUND OF THE INVENTION

Thin film solar cells composed of percolating networks of liquid electrolyte and dye-coated sintered titanium dioxide were developed by Dr. Michael Gratzel and coworkers at the Swiss Federal Institute of Technology. These photovoltaic devices fall within a general class of cells referred to as dye-sensitized solar cells ("DSSCs"). Conventionally, fabrication of DSSCs requires a high temperature sintering process (>about 400° C.) to achieve sufficient interconnectivity between the nanoparticles and enhanced adhesion between the nanoparticles and a transparent substrate. Although the photovoltaic cells of Grätzel are fabricated from relatively inexpensive raw materials, the high-temperature sintering technique used to make these cells limits the cell substrate to rigid transparent materials, such as glass. In addition, the high-temperature sintering technique precludes the use of tempered glass, which is significantly more resistant to thermal and mechanical stresses and strains than ordinary glass, but which loses its temper at the temperatures inherent to a high-temperature sintering technique.

SUMMARY OF THE INVENTION

The invention, in one embodiment, addresses the deficiencies of the prior art by providing photovoltaic cells and modules formed by interconnecting nanoparticles at relatively low temperature (<about 300° C.) on rigid substrates. More particularly, the durability and longevity of photovoltaic cells and modules is enhanced by their fabrication on tempered glass substrates.

In one aspect, the invention provides a photovoltaic cell including a charge carrier material and a photosensitized interconnected nanoparticle material including nanoparticles linked by a polymeric linking agent, both disposed between first and second rigid, significantly light-transmitting substrates. The charge carrier material and the photosensitized interconnected nanoparticle material may be disposed between flexible, significantly light-transmitting substrates that are themselves disposed between the first and second rigid, significantly light-transmitting substrates. In one embodiment of the photovoltaic cell, the photosensitized interconnected nanoparticle material includes particles with an average size substantially in the range of about 5 nm to about 80 nm. The photosensitized interconnected nanoparticle material may include, for example, titanium oxides, zirconium oxides, zinc oxides, tungsten oxides, niobium oxides, lanthanum oxides, tantalum oxides, terbium oxides, tin oxides, or one or more combinations thereof. The photosensitized interconnected nanoparticle material may include a photosensitizing agent such as a xanthine, cyanine, merocyanine, phthalocyanine, and/or pyrrole. The photosensitizing agent may include a metal ion, such as a divalent or trivalent metal. The photosensitizing agent may also include at least one of a ruthenium transition metal complex, an osmium transition metal complex, and an iron transition metal complex. In one embodiment of the photovoltaic cell, the charge carrier material includes a redox electrolyte system involving, for example, a polymeric electrolyte.

In one embodiment, at least one of the first and second flexible, significantly light-transmitting substrates includes a polyethylene terephthalate or polyethylene naphthalate material. At least one of the first and second rigid, significantly light-transmitting substrates may be tempered glass. In one embodiment, the photovoltaic module includes a catalytic media layer disposed between the first and second rigid, significantly light-transmitting substrates. The catalytic media layer is, for example, platinum. In one embodiment, the photovoltaic cell also includes an electrical conductor material applied to at least one of the first and second rigid, significantly light-transmitting substrates. The electrical conductor material may include indium tin oxide.

In another aspect, the photovoltaic cell includes a charge carrier material and a photosensitized interconnected nanoparticle material including nanoparticles linked by a polymeric linking agent, both disposed between a rigid, significantly light-transmitting substrate and a flexible, significantly light-transmitting substrate.

In another aspect, the invention provides a method of interconnecting nanoparticles at low temperatures on a rigid substrate. The method includes providing a rigid substrate, applying a solution comprising a polymeric linking agent and a solvent to the rigid substrate, and contacting a plurality of metal oxide nanoparticles with the solution at a temperature below about 300° C. to interconnect at least a portion of the plurality of metal oxide nanoparticles. In various embodiments, the temperature is below about 200° C., below about 100° C., or about room temperature. The polymeric linking agent may include a long chain macromolecule, which has (i) a backbone structure substantially similar to a chemical structure of the plurality of metal oxide nanoparticles, and (ii) one or more reactive groups chemically bonded to the backbone structure. In one embodiment, the plurality of metal oxide nanoparticles includes a chemical structure, $M_xO_y$, where x and y are integers. M may be Ti, Zr, Sn, W, Nb, Ta, and Th. In one embodiment, the polymeric linking agent is poly(n-butyl titanate). The solvent may be n-butanol. In one embodiment, the rigid substrate is significantly light-transmitting (e.g., tempered glass). The plurality of metal oxide nanoparticles may include titanium oxide, zirconium oxide, zinc oxide, tungsten oxide, niobium oxide, lanthanum oxide, tin oxide, tantalum oxide, terbium oxide, and combinations thereof.

Other aspects and advantages of the invention will become apparent from the following drawings, detailed description, and claims, all of which illustrate the principles of the invention, by way of example only.

BRIEF DESCRIPTION OF THE DRAWINGS

The foregoing and other objects, features, and advantages of the invention described above will be more fully understood from the following description of various illustrative embodiments, when read together with the accompanying drawings. In the drawings, like reference characters generally refer to the same parts throughout the different views. The drawings are not necessarily to scale, and emphasis instead is generally placed upon illustrating the principles of the invention.

DESCRIPTION OF THE ILLUSTRATIVE EMBODIMENTS

A. Low Temperature Interconnection of Nanoparticles

As discussed in the summary above, the invention, in one embodiment, provides a polymeric linking agent (hereinafter a "polylinker") that enables the fabrication of thin film solar cells at relatively low "sintering" temperatures (<about 300° C.). Although the term "sintering" conventionally refers to high temperature (>about 400° C.) processes, as used herein, the term "sintering" is not temperature specific, but instead refers generally to the process of interconnecting nanoparticles at any suitable temperature. In one illustrative embodiment, the invention provides a method for using polylinkers to interconnect nanoparticles in thin film solar cells. According to another illustrative embodiment, the relatively low temperature sintering process enables the manufacture of such photovoltaic cells using flexible polymer substrates. By employing flexible substrates, the invention also enables a continuous roll-to-roll or web manufacturing process to be employed.

Figure 1:
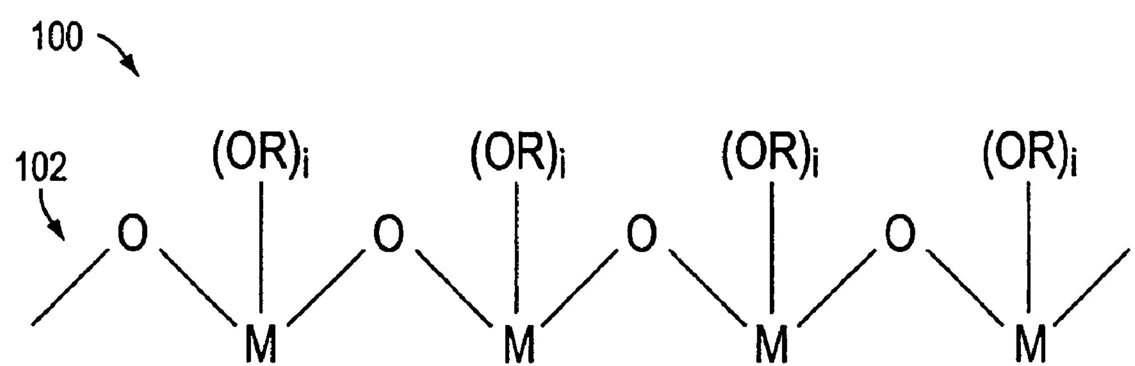
FIG. 1 depicts an exemplary chemical structure of an illustrative embodiment of a polylinker for nanoparticles of an oxide of metal M, in accordance with the invention.
Figure 2:
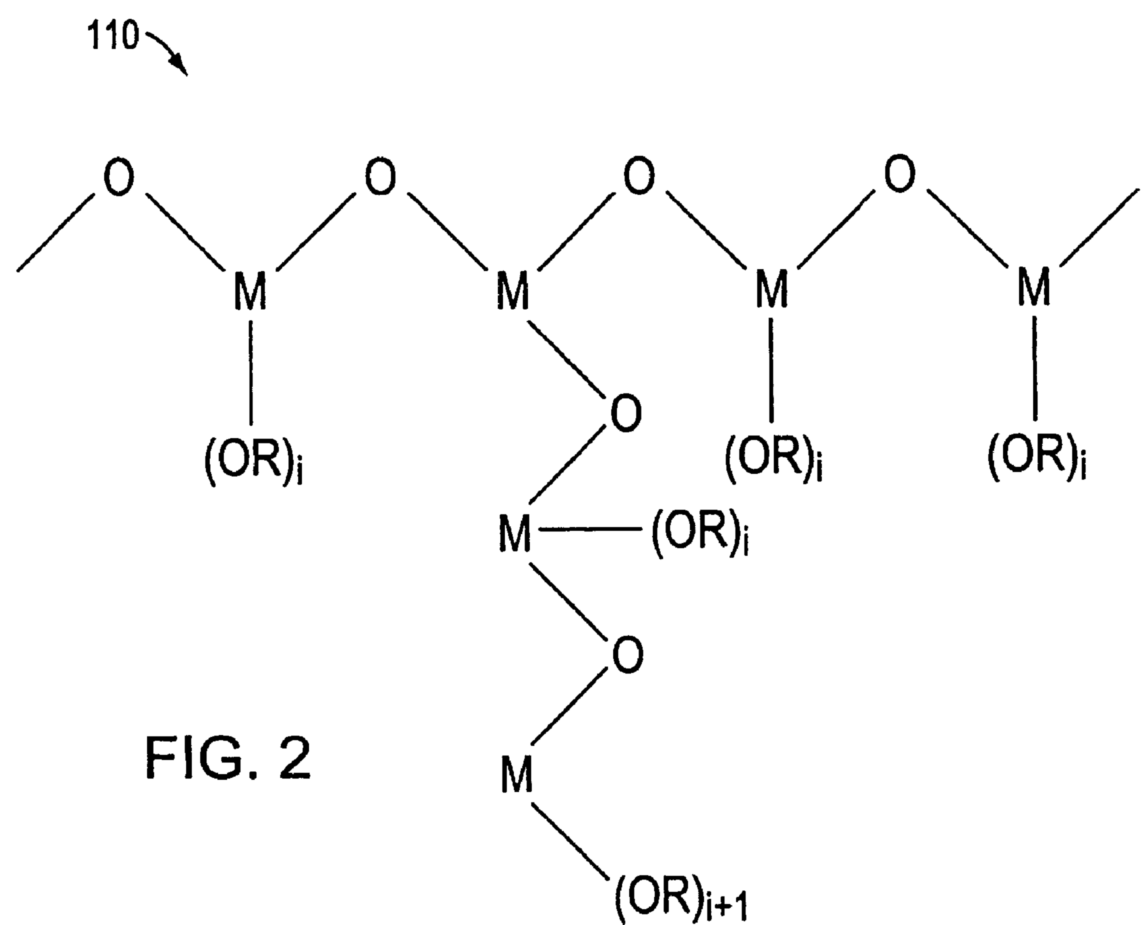
FIG. 2 depicts another exemplary chemical structure of an illustrative embodiment of a polylinker, according to the invention, for nanoparticles of an oxide of metal M.

FIGS. 1 and 2 schematically depict chemical structures of illustrative polylinkers, according to the invention. The particular polylinker structures depicted are for use with nanoparticles of the formula $M_xO_y$, where M may be, for example, titanium (Ti), zirconium (Zr), tungsten (W), niobium (Nb), lanthanum (La), tantalum (Ta), terbium (Tb), or tin (Sn) and x and y are integers greater than zero. According to the illustrative embodiment of FIG. 1, the polylinker 100 includes a backbone structure 102, which is similar in structure to the metal oxide nanoparticles, and $(OR)_i$ reactive groups, where R may be, for example, acetate, an alkyl, alkene, alkyne, aromatic, or acyl group; or a hydrogen atom and i is an integer greater than zero. Suitable alkyl groups include, but are not limited to, ethyl, propyl, butyl, and pentyl groups. Suitable alkenes include, but are not limited to, ethene, propene, butene, and pentene. Suitable alkynes include, but are not limited to, ethyne, propyne, butyne, and pentyne. Suitable aromatic group include, but are not limited to, phenyl, benzyl, and phenol. Suitable acyl groups include, but are not limited to, acetyl and benzoyl. In addition, a halogen including, for example, chlorine, bromine, and iodine may be substituted for the $(OR)_i$ reactive groups.

Referring to FIG. 2, the polylinker 110 has a branched backbone structure that includes two -M-O-M-O-M-O— backbone structures, which include $(OR)_i$ reactive groups and $(OR)_{i+1}$ reactive groups, where R may be, for example, one of the atoms, molecules, or compounds listed above and i is an integer greater than zero. The two backbone structures have similar structures to the metal oxide nanoparticles. Collectively, the structure depicted in FIG. 2 can be represented by $-M(OR)_i—O-(M(OR)_i—O)_n-M(OR)_{i+1}$, where i and n are integers greater than zero.

Figure 3A:
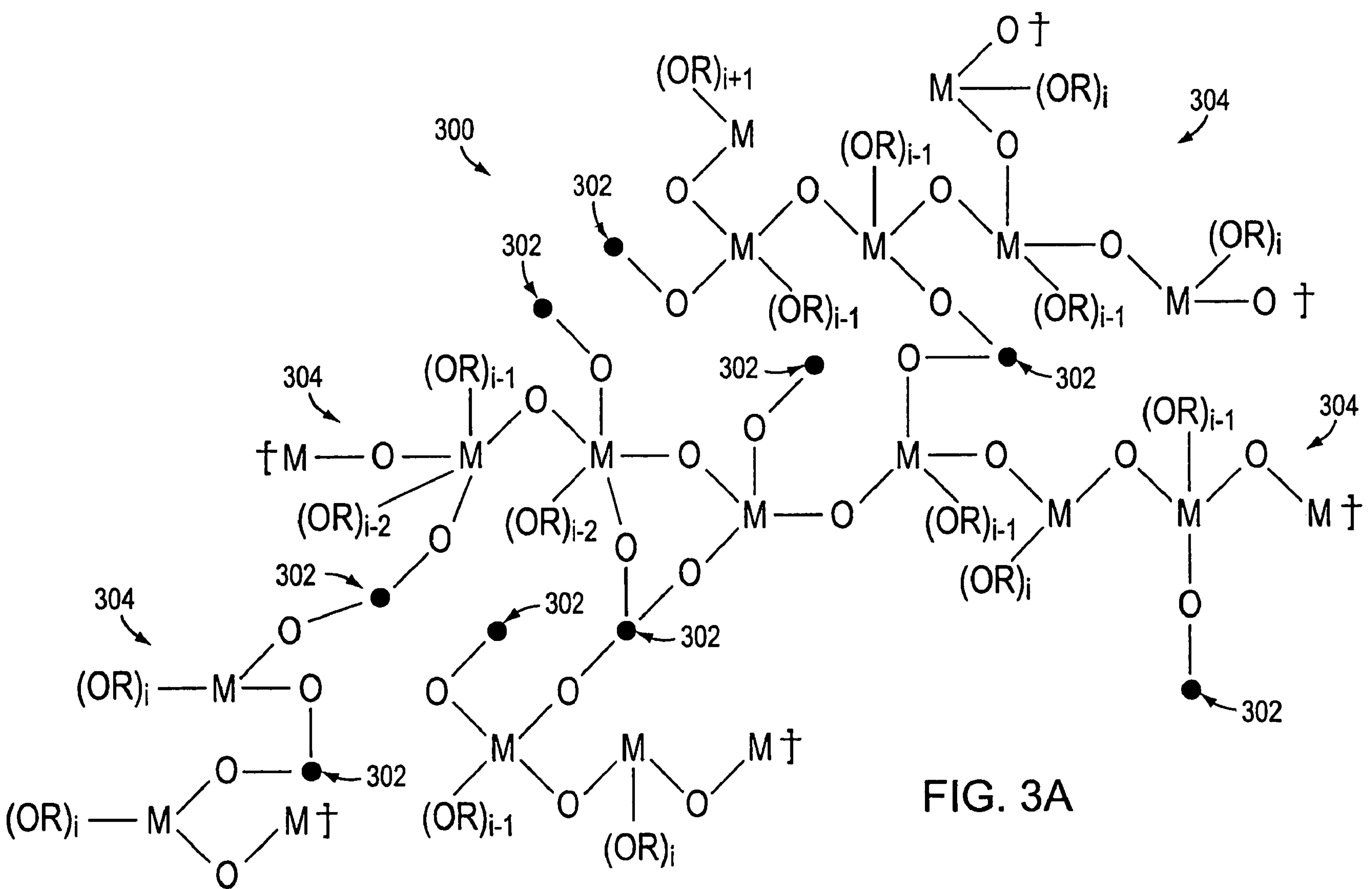
FIG. 3A shows an exemplary chemical structure for an interconnected nanoparticle film with a polylinker, according to an illustrative embodiment of the invention.

FIG. 3A depicts schematically the chemical structure 300 resulting from interconnecting the $M_xO_y$ nanoparticles 302 with a polylinker 304. In various embodiments, the polylinker 304 has the chemical structure of the polylinkers 100 and 110 depicted in FIGS. 1 and 2, respectively. According to the illustrative embodiment, the nanoparticles 302 are interconnected by contacting the nanoparticles 302 with a polylinker 304 at or below room temperature or at elevated temperatures that are less than about 300° C. Preferably, the polylinker 304 is dispersed in a solvent to facilitate contact with the nanoparticles 302. Suitable solvents include, but are not limited to, various alcohols, chlorohydrocarbons (e.g., chloroforrn), ketones, cyclic and linear chain ether derivatives, and aromatic solvents among others. It is believed that the reaction between surface hydroxyl groups of the nanoparticles 302 with alkoxy groups on the polymer chain of the polylinker 304 leads to bridging (or linking) the many nanoparticles 302 together through highly stable covalent links, and as a result, to interconnecting the nanoparticles 302. It also is believed that since the polylinker 304 is a polymeric material with a chemical structure similar to that of the nanoparticles 302, even a few binding (or linking) sites between the nanoparticles 302 and the polylinker 304 leads to a highly interconnected nanoparticle film with a combination of electrical and mechanical properties superior to those of a non-sintered or non-interconnected nanoparticle film. The electrical properties include, for example, electron and/or hole conducting properties that facilitate the transfer of electrons or holes from one nanoparticle to another through, for example, π-conjugation. The mechanical properties include, for example, improved flexibility.

Still referring to FIG. 3A, at low concentrations of the polylinker 304, a single polylinker 304 polymer can link many nanoparticles 302 forming a cross-linked nanoparticle network. However, by increasing the concentration of the polylinker 304 polymer, more polylinker 304 molecules may be attached to the surface of the nanoparticles 302 forming polymer-coated nanoparticles 300. Such polymer-coated nanoparticles 300 may be processed as thin films due to the flexibility of the polymer. It is believed that the electronic properties of the polymer-coated nanoparticles are not affected to a significant extent due to the similar electronic and structural properties between the polylinker polymer and the nanoparticles.

Figure 3B:
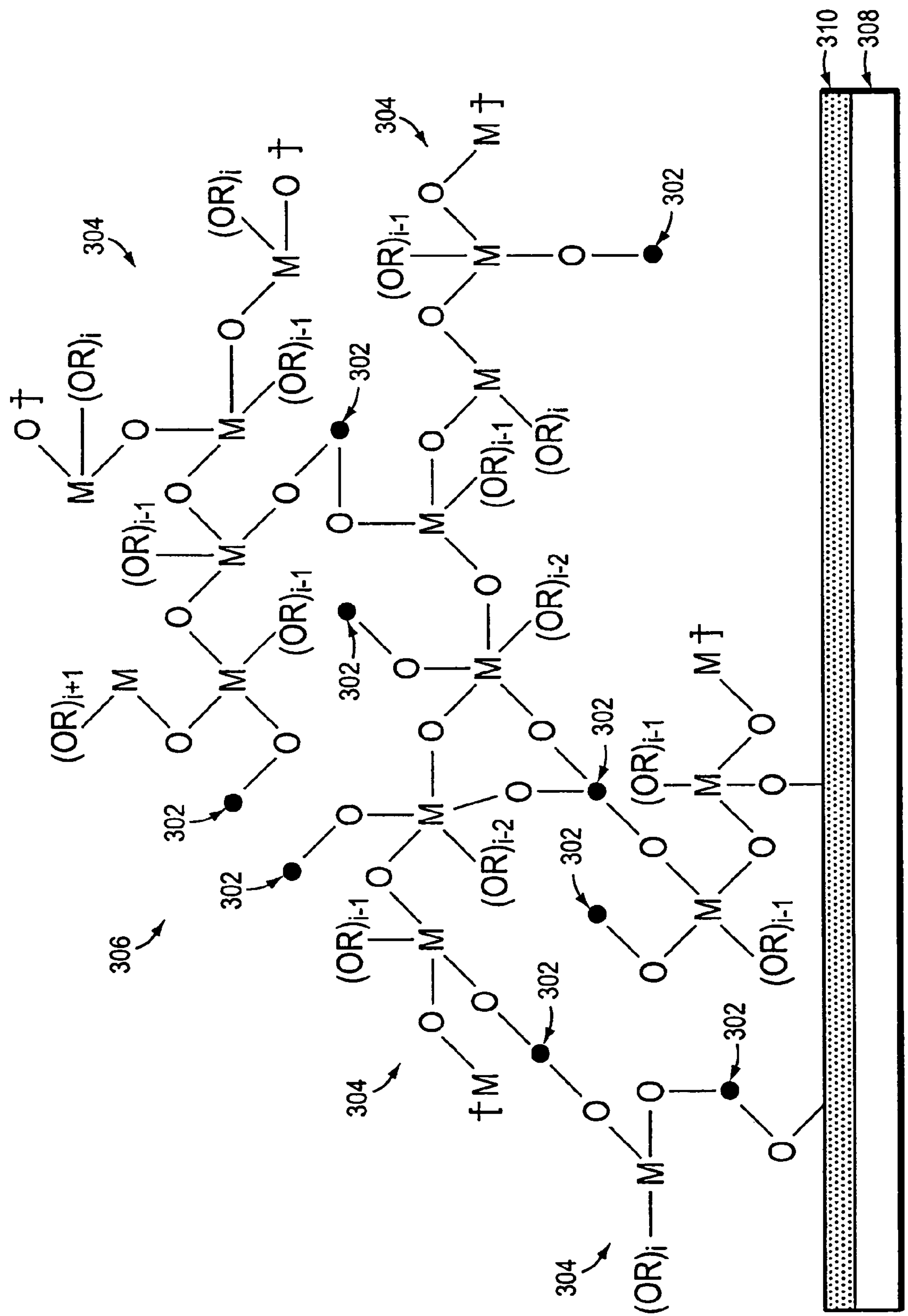
FIG. 3B shows the interconnected nanoparticle film of FIG. 3A attached to a substrate oxide layer, according to an illustrative embodiment of the invention.

FIG. 3B depicts the chemical structure 306 of an illustrative embodiment of the interconnected nanoparticle film 300 from FIG. 3A formed on a flexible substrate 308 that includes an oxide layer coating 310, which is an electrical conductor. In particular, the polylinkers may be used to facilitate the formation of such nanoparticle films 300 on flexible, significantly light transmitting substrates 308. As used herein, the term "significantly light transmitting substrate" refers to a substrate that transmits at least about 60% of the visible light incident on the substrate in a wavelength range of operation. Examples of flexible substrates 308 include polyethylene terephthalates (PETs), polyimides, polyethylene naphthalates (PENs), polymeric hydrocarbons, cellulosics, combinations thereof, and the like. PET and PEN substrates may be coated with one or more electrical conducting, oxide layer coatings 310 of, for example, indium tin oxide (ITO), a fluorine-doped tin oxide, tin oxide, zinc oxide, and the like.

According to one preferred embodiment, by using the illustrative polylinkers, the methods of the invention interconnect nanoparticles 302 at temperatures significantly below 400° C., and preferably below about 300° C. Operating in such a temperature range enables the use of the flexible substrates 308, which would otherwise be destructively deformed by conventional high temperature sintering methods. In one illustrative embodiment, the exemplary structure 306 is formed by interconnecting the nanoparticles 302 using a polylinker 304 on a substrate 308 at temperatures below about 300° C. In another embodiment, the nanoparticles 302 are interconnected using a polylinker 304 at temperatures below about 100° C. In still another embodiment, the nanoparticles 302 are interconnected using a polylinker 304 at about room temperature and room pressure, from about 18 to about 22° C. and about 760 mm Hg, respectively.

In embodiments where the nanoparticles are deposited on a substrate, the reactive groups of the polylinker bind with the substrate, substrate coating and/or substrate oxide layers. The reactive groups may bind to the substrate, substrate coating and/or substrate oxide layers by, for example, covalent, ionic and/or hydrogen bonding. It is believed that reactions between the reactive groups of the polylinker with oxide layers on the substrate result in connecting nanoparticles to the substrate via the polylinker.

According to various embodiments of the invention, metal oxide nanoparticles are interconnected by contacting the nanoparticles with a suitable polylinker dispersed in a suitable solvent at or below room temperature or at elevated temperatures below about 300° C. The nanoparticles may be contacted with a polylinker solution in many ways. For example, a nanoparticle film may be formed on a substrate and then dipped into a polylinker solution. A nanoparticle film may be formed on a substrate and the polylinker solution sprayed on the film. The polylinker and nanoparticles may be dispersed together in a solution and the solution deposited on a substrate. To prepare nanoparticle dispersions, techniques such as, for example, microfluidizing, attritting, and ball milling may be used. Further, a polylinker solution may be deposited on a substrate and a nanoparticle film deposited on the polylinker.

In embodiments where the polylinker and nanoparticles are dispersed together in a solution, the resultant polylinker-nanoparticle solution may be used to form an interconnected nanoparticle film on a substrate in a single step. In various versions of this embodiment, the viscosity of the polylinker-nanoparticle solution may be selected to facilitate film deposition using printing techniques such as, for example, screen-printing and gravure-printing techniques. In embodiments where a polylinker solution is deposited on a substrate and a nanoparticle film deposited on the polylinker, the concentration of the polylinker can be adjusted to achieve a desired adhesive thickness. In addition, excess solvent may be removed from the deposited polylinker solution prior to deposition of the nanoparticle film.

The invention is not limited to interconnection of nanoparticles of a material of formula $M_xO_y$. Suitable nanoparticle materials include, but are not limited to, sulfides, selenides, tellurides, and oxides of titanium, zirconium, lanthanum, niobium, tin, tantalum, terbium, and tungsten, and combinations thereof. For example, $TiO_2$, $SrTiO_3$, $CaTiO_3$, $ZrO_2$, $WO_3$, $La_2O_3$, $Nb_2O_5$, $SnO_2$, sodium titanate, and potassium niobate are suitable nanoparticle materials.

The polylinker may contain more than one type of reactive group. For example, the illustrative embodiments of FIGS. 1-3B depict one type of reactive group OR. However, the polylinker may include several types of reactive groups, e.g., OR, OR', OR", etc.; where R, R' and R" are one or more of a hydrogen, alkyl, alkene, alkyne, aromatic, or acyl group or where one or more of OR, OR', and OR" are a halide. For example, the polylinker may include polymer units of formulas such as, —[O-M(OR)$_i$(OR')$_j$—]—, and —[O-M(OR)$_i$(OR')$_j$(OR")$_k$—]—, where i, j and k are integers greater than zero.

Figure 4:
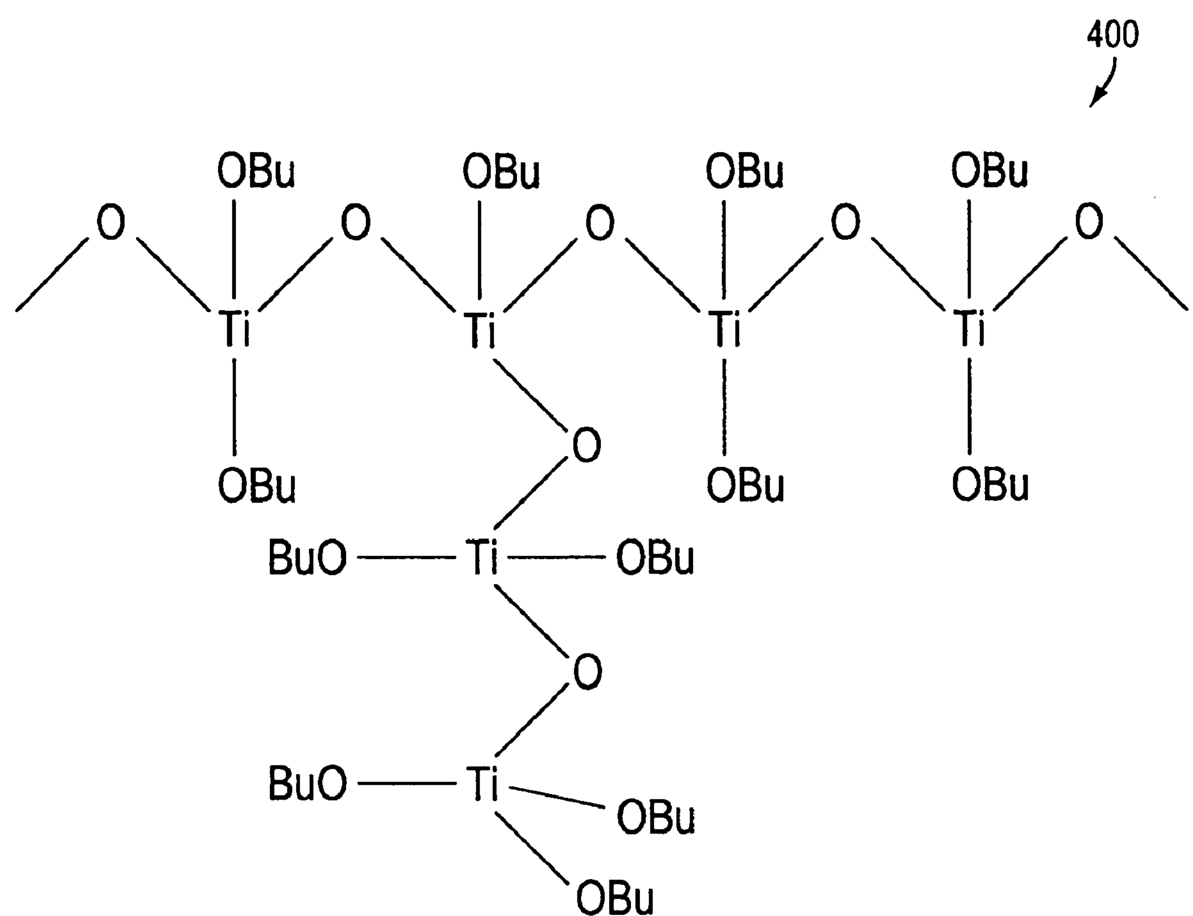
FIG. 4 depicts the chemical structure of poly(n-butyl titanate)

FIG. 4 depicts the chemical structure of a representative polylinker, poly(n-butyl titanate) 400 for use with titanium dioxide ($TiO_2$) nanoparticles. Suitable solvents for poly(n-butyl titanate) 400 include, but are not limited to, various alcohols, chlorohydrocarbons (e.g., chloroform), ketones, cyclic and linear chain ether derivatives, and aromatic solvents among others. Preferably, the solvent is n-butanol. The poly(n-butyl titanate) polylinker 400 contains a branched —Ti—O—Ti—O—Ti—O— backbone structure with butoxy (OBu) reactive groups.

Figure 5A:
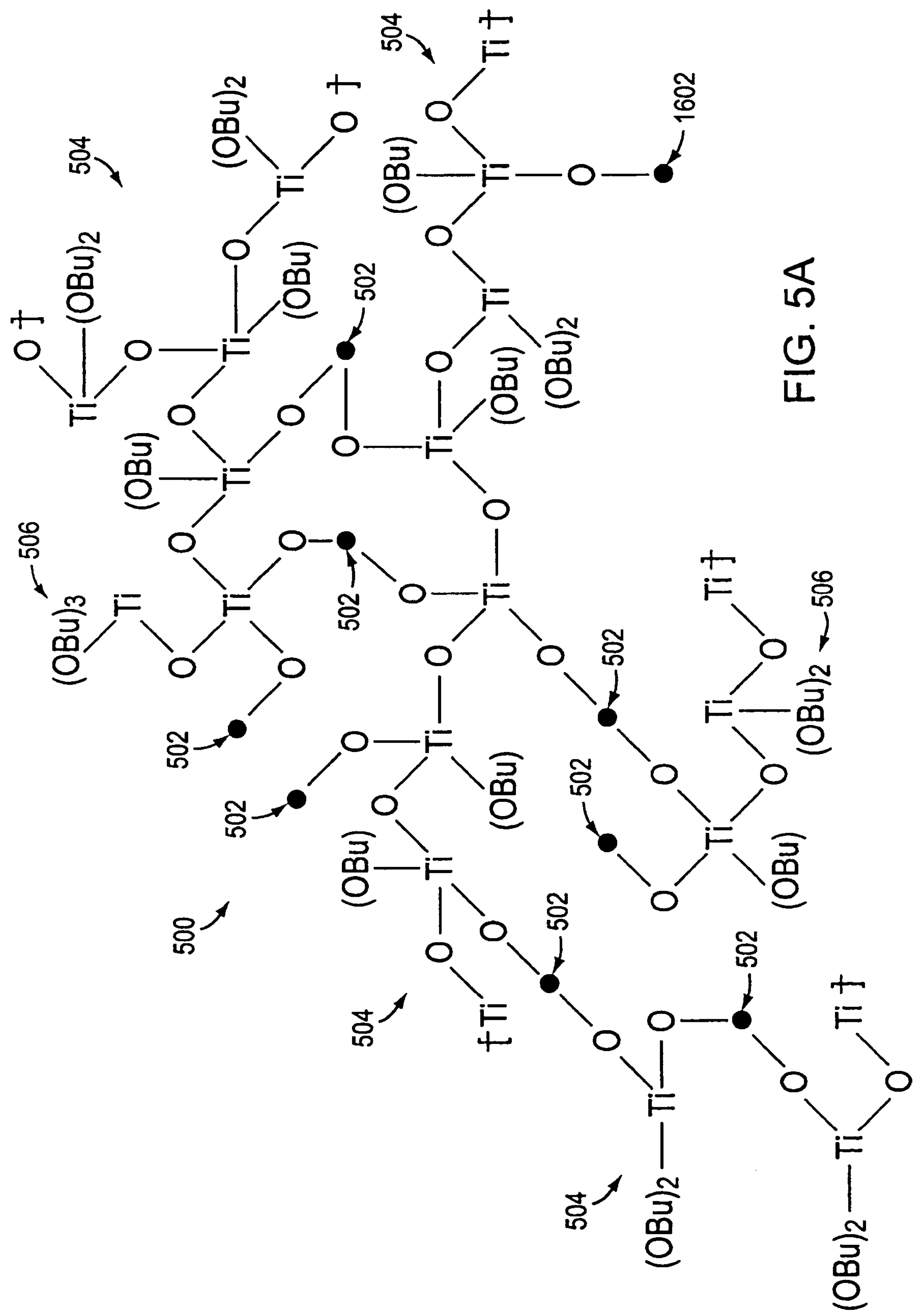
FIG. 5A shows the chemical structure of a titanium dioxide nanoparticle film interconnected with poly(n-butyl titanate), according to the invention.

FIG. 5A depicts the chemical structure of a nanoparticle film 500, which is constructed from titanium dioxide nanoparticles 502 interconnected by poly(n-butyl titanate) polylinker molecules 504. It is believed that the reaction between surface hydroxyl groups of the $TiO_2$ nanoparticles 502 with butoxy groups 506 (or other alkoxy groups) of the polylinker 504 leads to the bridging (or linking) of many nanoparticles 502 together through highly stable covalent links, and as a result, interconnecting the nanoparticles 502. Furthermore, it is believed that since the polylinker 504 is a polymeric material with a chemical structure similar to that of $TiO_2$, even a few binding (or linking) sites between nanoparticles 502 and polylinker 504 will lead to a highly interconnected nanoparticle film 500, with electronic and mechanical properties superior to those of a non-sintered or non-interconnected nanoparticle film.

Figure 5B:
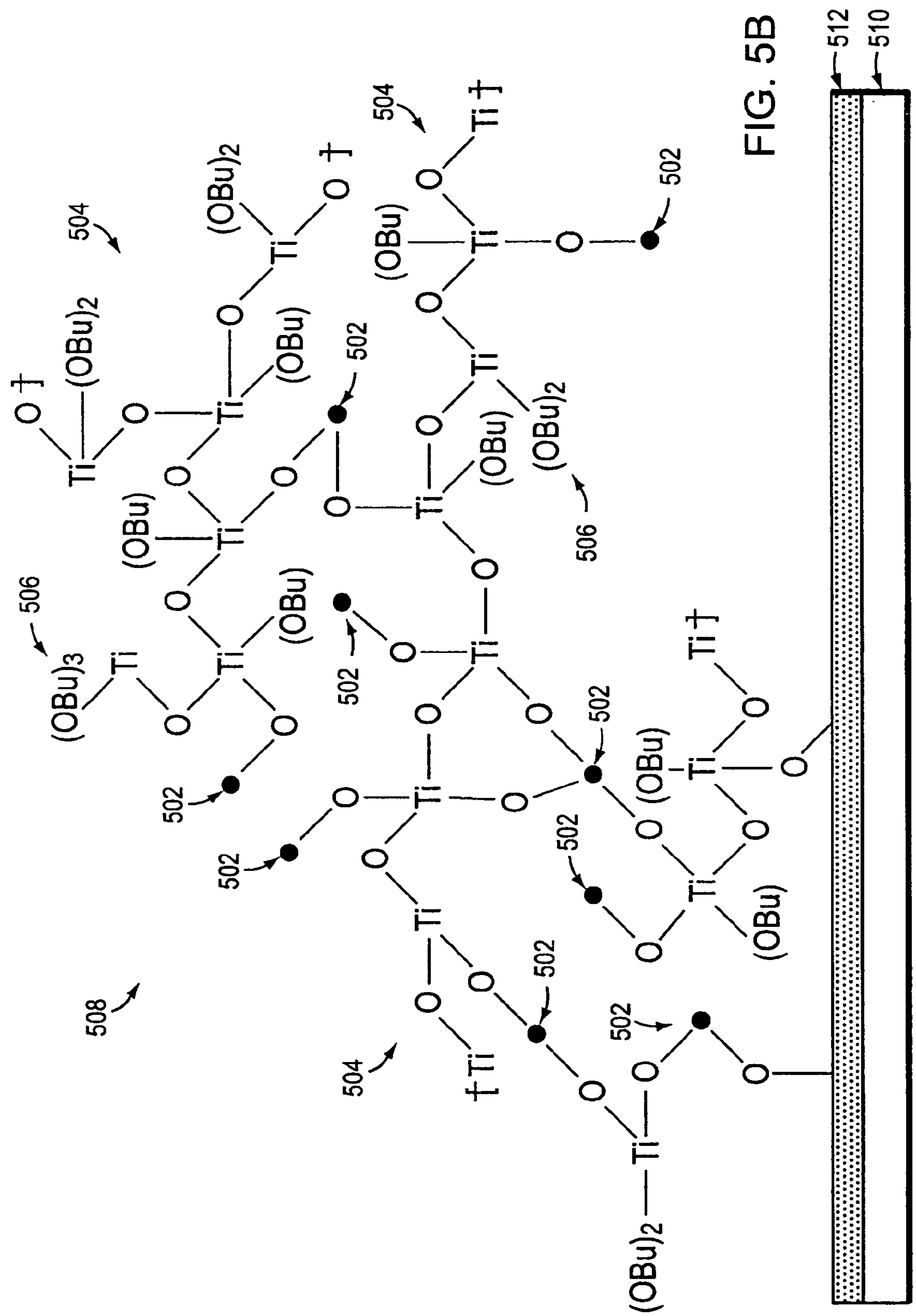
FIG. 5B shows the interconnected titanium dioxide nanoparticle film of FIG. 5A attached to a substrate oxide layer, according to an illustrative embodiment of the invention.

FIG. 5B depicts the chemical structure 508 of the nanoparticle film 500 from FIG. 5A formed on a substrate 510, which includes an electrically-conducting oxide layer coating 512, by applying the polylinker solution to the substrate 510 and then depositing the nanoparticles 502 on the polylinker 504. In the illustrative example using titanium dioxide nanoparticles 502, a polylinker solution including poly(n-butyl titanate) 504 is dissolved in n-butanol and applied to the substrate 510. The concentration of the polylinker 504 can be adjusted to achieve a desired adhesive thickness for the polylinker solution. A titanium dioxide nanoparticulate film 500 is then deposited on the polylinker coated substrate 510. Reaction between the surface hydroxyl groups of the $TiO_2$ nanoparticles with reactive butoxy groups 506 (or other alkoxy groups) of poly(n-butyl titanate) 504 results in interconnecting the nanoparticles 502, as well as connecting nanoparticles 502 with the oxide layers 512 on the substrate 510.

Figure 6:
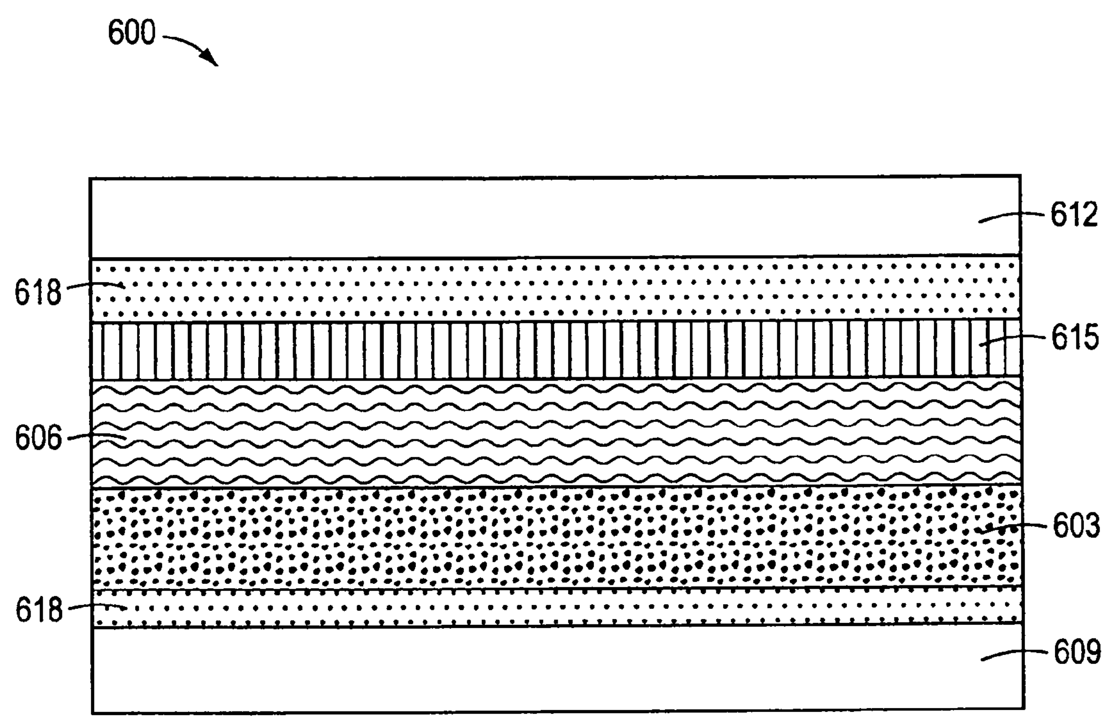
FIG. 6 is a cross-sectional view of a flexible photovoltaic cell, according to an illustrative embodiment of the invention.

FIG. 6 depicts a flexible photovoltaic cell 600, in accordance with the invention, that includes a photosensitized interconnected nanoparticle material 603 and a charge carrier material 606 disposed between a first flexible, significantly light transmitting substrate 609 and a second flexible, significantly light transmitting substrate 612. In one embodiment, the flexible photovoltaic cell further includes a catalytic media layer 615 disposed between the first substrate 609 and second substrate 612. Preferably, the photovoltaic cell 600 also includes an electrical conductor 618 deposited on one or both of the substrates 609 and 612. The methods of nanoparticle interconnection provided herein enable construction of the flexible photovoltaic cell 600 at temperatures and heating times compatible with such substrates 609 and 612.

The flexible, significantly light transmitting substrates 609 and 612 of the photovoltaic cell 600 preferably include polymeric materials. Suitable substrate materials include, but are not limited to, PET, polyimide, PEN, polymeric hydrocarbons, cellulosics, or combinations thereof. Further, the substrates 609 and 612 may include materials that facilitate the fabrication of photovoltaic cells by a continuous manufacturing process such as, for example, a roll-to-roll or web process. The substrate 609 and 612 may be colored or colorless. Preferably, the substrates 609 and 612 are clear and transparent. The substrates 609 and 612 may have one or more substantially planar surfaces or may be substantially non-planar. For example, a non-planar substrate may have a curved or stepped surface (e.g., to form a Fresnel lens) or be otherwise patterned.

According to the illustrative embodiment, an electrical conductor 618 is deposited on one or both of the substrates 609 and 612. Preferably, the electrical conductor 618 is a significantly light transmitting material such as, for example, ITO, a fluorine-doped tin oxide, tin oxide, zinc oxide, or the like. In one illustrative embodiment, the electrical conductor 618 is deposited as a layer between about 100 nm and about 500 nm thick. In another illustrative embodiment, the electrical conductor 618 is between about 150 nm and about 300 nm thick. According to a further feature of the illustrative embodiment, a wire or lead line may be connected to the electrical conductor 618 to electrically connect the photovoltaic cell 600 to an external load.

The photosensitized interconnected nanoparticle material 603 may include one or more types of metal oxide nanoparticles, as described in detail above. In one embodiment, the photosensitized interconnected nanoparticle material 603 includes nanoparticles with an average size of between about 2 nm and about 100 nm. In another embodiment, the photosensitized nanoparticle material 603 includes nanoparticles with an average size of between about 10 nm and about 40 nm. Preferably, the nanoparticles are titanium dioxide particles having an average particle size of about 20 nm.

A wide variety of photosensitizing agents may be applied to and/or associated with the nanoparticles to produce the photosensitized interconnected nanoparticle material 603. The photosensitizing agent facilitates conversion of incident visible light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the interconnected nanoparticles 603. This electron transfer results in an effective separation of charge and the desired photovoltaic effect. Accordingly, the electrons in the conduction band of the interconnected nanoparticles are made available to drive an external load electrically connected to the photovoltaic cell. In one illustrative embodiment, the photosensitizing agent is sorbed (e.g., chemisorbed and/or physisorbed) on the interconnected nanoparticles 603. The photosensitizing agent may be sorbed on the surfaces of the interconnected nanoparticles 603, throughout the interconnected nanoparticles 603, or both. The photosensitizing agent is selected, for example, based on its ability to absorb photons in a wavelength range of operation, its ability to produce free electrons (or electron holes) in a conduction band of the interconnected nanoparticles 603, and its effectiveness in complexing with or sorbing to the interconnected nanoparticles 603. Suitable photosensitizing agents may include, for example, dyes that include functional groups, such as carboxyl and/or hydroxyl groups, that can chelate to the nanoparticles, e.g., to Ti(IV) sites on a $TiO_2$ surface. Examples of suitable dyes include, but are not limited to, anthocyanins, porphyrins, phthalocyanines, merocyanines, cyanines, squarates, eosins, and metal-containing dyes such as, for example, cis-bis(isothiocyanato)bis(2,2'-bipyridyl-4,4'-dicarboxylato)-ruthenium(II) ("N3 dye"); tris (isothiocyanato)-ruthenium(II)-2,2':6',2"-terpyridine-4,4',4"-tricarboxylic acid; cis-bis(isothiocyanato)bis(2,2'-bipyridyl-4,4'-dicarboxylato)-ruthenium(II) bis-tetrabutylammonium; cis-bis(isocyanato) (2,2'-bipyridyl-4, 4'dicarboxylato) ruthenium (II); and tris(2,2'-bipyridyl-4,4'-dicarboxylato) ruthenium (II) dichloride, all of which are available from Solaronix.

The charge carrier material 606 portion of the photovoltaic cells may form a layer in the photovoltaic cell, be interspersed with the material that forms the photosensitized interconnected nanoparticle material 603, or be a combination of both. The charge carrier material 606 may be any material that facilitates the transfer of electrical charge from a ground potential or a current source to the interconnected nanoparticles 603 (and/or a photosensitizing agent associated therewith). A general class of suitable charge carrier materials can include, but are not limited to solvent based liquid electrolytes, polyelectrolytes, polymeric electrolytes, solid electrolytes, n-type and p-type transporting materials (e.g., conducting polymers), and gel electrolytes, which are described in more detail below.

Other choices for the charge carrier material 606 are possible. For example, the electrolyte composition may include a lithium salt that has the formula LiX, where X is an iodide, bromide, chloride, perchlorate, thiocyanate, trifluoromethyl sulfonate, or hexafluorophosphate. In one embodiment, the charge carrier material 606 includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are >1. X is an anion, and M is selected from the group consisting of Li, Cu, Ba, Zn, Ni, lanthanides, Co, Ca, Al, and Mg. Suitable anions include, but are not limited to, chloride, perchlorate, thiocyanate, trifluoromethyl sulfonate, and hexafluorophosphate.

In some illustrative embodiments the charge carrier material 606 includes a polymeric electrolyte. In one version, the polymeric electrolyte includes poly(vinyl imidazolium halide) and lithium iodide. In another version, the polymeric electrolyte includes poly(vinyl pyridinium salts). In still another embodiment, the charge carrier material 606 includes a solid electrolyte. In one version, the solid electrolyte includes lithium iodide and pyridinium iodide. In another version, the solid electrolyte includes substituted imidazolium iodide.

According to some illustrative embodiments, the charge carrier material 606 includes various types of polymeric polyelectrolytes. In one version, the polyelectrolyte includes between about 5% and about 100% (e.g., 5-60%, 5-40%, or 5-20%) by weight of a polymer, e.g., an ion-conducting polymer, about 5% to about 95%, e.g., about 35-95%, 60-95%, or 80-95%, by weight of a plasticizer and about 0.05 M to about 10 M of a redox electrolyte, e.g., about 0.05 M to about 10 M, e.g., 0.05-2 M, 0.05-1 M, or 0.05-0.5 M, of organic or inorganic iodides, and about 0.01 M to about 1 M, e.g., 0.05-5 M, 0.05-2 M, or 0.05-1 M, of iodine. The ion-conducting polymer may include, for example, polyethylene oxide (PEO), polyacrylonitrile (PAN), polymethylmethacrylate (acrylic) (PMMA), polyethers, and polyphenols. Examples of suitable plasticizers include, but are not limited to, ethyl carbonate, propylene carbonate, mixtures of carbonates, organic phosphates, butyrolactone, and dialkylphthalates.

Preferably, the flexible photovoltaic cell 600 also includes a catalytic media layer 615 disposed between the substrates 609 and 612. According to the illustrative embodiment, the catalytic media layer 615 is in electrical contact with the charge carrier material 606. The catalytic media 615 may include, for example, ruthenium, osmium, cobalt, rhodium, iridium, nickel, activated carbon, palladium, platinum, or hole transporting polymers (e.g., poly(3,4-ethylene dioxythiophene and polyaniline). Preferably, the catalytic media 615 further includes titanium, or some other suitable metal, to facilitate adhesion of the catalytic media to a substrate and/or substrate coating. Preferably, the titanium is deposited in regions or a layer about 10 Å thick. In one embodiment, the catalytic media 615 includes a platinum layer between about 13 Å and about 35 Å thick. In another embodiment, the catalytic media 615 includes a platinum layer between about 15 Å and about 50 Å thick. In another embodiment, the catalytic media 615 includes a platinum layer between about 50 Å and about 800 Å thick. Preferably, the catalytic media 615 includes a platinum layer about 25 Å thick.

In another aspect, the invention also provides methods of forming a layer of interconnected metal oxide nanoparticles on a substrate using a continuous manufacturing process, such as, for example, a roll-to-roll or web process. These methods may be used, for example, to produce DSSCs. The current processes for producing DSSCs in large numbers, for example using a continuous and cost effective assembly line process, are extremely difficult at best. The difficulties associated with a continuous assembly process for a DSSC may arise from the cell support or substrate, which is generally rigid and typically includes thermally resistant materials such as glass and metal. The primary reason for this is related to the high temperature sintering process for producing fused nanocrystals (typically about 400-500° C.). Rigid substrate materials, by their very nature, generally do not lend themselves to a continuous process for manufacture, but rather to a more expensive batch process.

Figure 7:
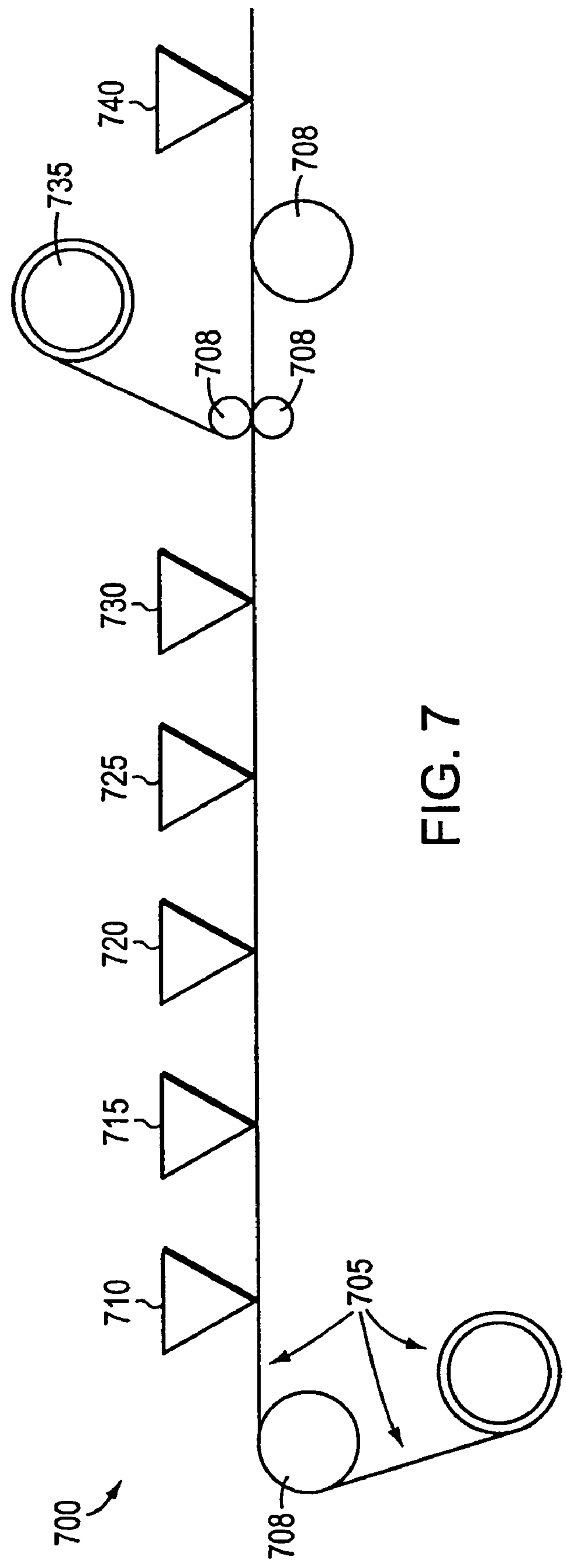
FIG. 7 depicts an illustrative embodiment of a continuous manufacturing process that may be used to form the flexible photovoltaic cell shown in FIG. 6.

FIG. 7 depicts an illustrative embodiment of a continuous manufacturing process 700 that may be used to form the photovoltaic cell shown in FIG. 6. According to the illustrative embodiment, an interconnected nanoparticle film is formed on an advancing substrate sheet 705, which may be continuously advanced, periodically advanced, and/or irregularly advanced during a manufacturing run using rollers 708. In this illustrative embodiment, the electrical conductor material 710, which serves as the basis for one electrode of a photovoltaic cell, is deposited on the advancing substrate 705. In various embodiments, the electrical conductor material 710 may be deposited on a target region of the substrate 705 by thermal evaporation or low temperature sputtering. In addition, the electrical conductor material 710 may be deposited, for example, by vacuum deposition.

According to the illustrative embodiment shown in FIG. 7, the photosensitized nanoparticle material 715 is then deposited. As described above, the photosensitized nanoparticle material 715 may be formed by applying a solution having a polylinker and metal oxide nanoparticles onto the advancing substrate sheet 705. The polylinker-nanoparticle solution may be applied by any suitable technique including, but not limited to, dip tanks, extrusion coating, spray coating, screen printing, and gravure printing. In other illustrative embodiments, the polylinker solution and metal oxide nanoparticles are separately applied to the advancing substrate sheet 705 to form the photosensitized nanoparticle material 715. In one illustrative embodiment, the polylinker solution is applied to the advancing substrate 705 and the metal oxide nanoparticles (preferably dispersed in a solvent) are disposed on the polylinker. In another illustrative embodiment, the metal oxide nanoparticles (preferably dispersed in a solvent) are applied to the advancing substrate 705 and the polylinker solution is applied to the nanoparticles to form the photosensitized nanoparticle material 715. As described above with regard to FIG. 6, a wide variety of photosensitizing agents may be applied to and/or associated with the nanoparticles to produce the photosensitized nanoparticle material 715.

After deposition of the photosensitized nanomatrix material 715, the substrate sheet 705 may proceed to further processing stations depending on the ultimate product desired. According to this illustrative embodiment, the charge carrier material 720, which facilitates the transfer of electrical charge from a ground potential or a current source to the photosensitized nanoparticle material 715, is deposited. The charge carrier material 720 may be applied by, for example, spray coating, roller coating, knife coating, or blade coating. The charge carrier media 720 may be prepared by forming a solution having an ion-conducting polymer, a plasticizer, and a mixture of iodides and iodine. The polymer provides mechanical and/or dimensional stability; the plasticizer helps the gel/liquid phase transition temperature; and the iodides and iodine act as redox electrolytes.

Still referring to FIG. 7, the catalytic media layer 725, which facilitates the transfer of electrons ejected by the photoexcited molecules within the photovoltaic cell, is then deposited. Subsequently, a second electrical conductor layer 730 is deposited. The second electrical conductor layer 730 serves as the basis for a second electrode of the photovoltaic cell. A second, flexible substrate 735 is then unwound and applied to the advancing sheet 705 to complete the photovoltaic cell using the continuous manufacturing process 700. An ultrasonic slitting device 740 may be employed to simultaneously cut and seal a leading and trailing edge of a plurality of photovoltaic cells, thus forming photovoltaic modules. The ultrasonic slitting procedure is discussed in more detail below.

Further illustrative examples of the invention in the context of a DSSC including titanium dioxide nanoparticles are provided below. The following examples are illustrative and not intended to be limiting. Accordingly, it is to be understood that the invention may be applied to a wide range of nanoparticles including, but not limited to, $SrTiO_3$, $CaTiO_3$, $ZrO_2$, $WO_3$, $La_2O_3$, $Nb_2O_5$, sodium titanate, and potassium niobate nanoparticles. In addition, it should be realized that the invention is generally applicable to formation of interconnected nanoparticles for a wide variety of applications in addition to DSSC, such as, for example, metal oxide and semiconductor coatings.

Example 1

Dip-Coating Application of Polylinker

Figure 8:
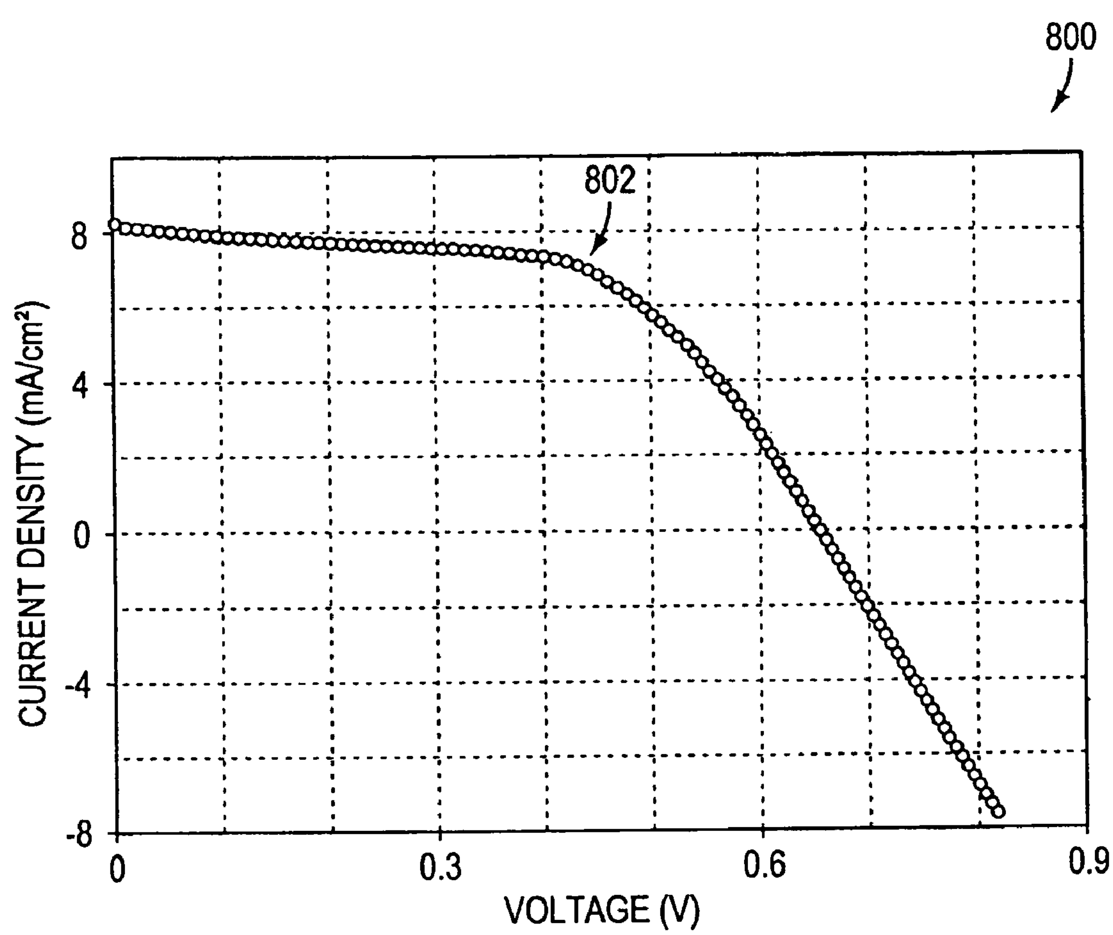
FIG. 8 depicts a current-voltage curve for an exemplary solar cell, according to the invention.

In this illustrative example, a DSSC was formed as follows. A titanium dioxide nanoparticle film was coated on a $SnO_2$:F coated glass slide. The polylinker solution was a 1% (by weight) solution of the poly(n-butyl titanate) in n-butanol. In this embodiment, the concentration of the polylinker in the solvent was preferably less than 5% by weight. To interconnect the particles, the nanoparticle film coated slide was dipped in the polylinker solution for 15 minutes and then heated at 150° C. for 30 minutes. The polylinker treated $TiO_2$ film was then photosensitized with a $3\times10^{-4}$ N3 dye solution for 1 hour. The polylinker treated $TiO_2$ film coated slide was then fabricated into a 0.6 $cm^2$ photovoltaic cell by sandwiching a triiodide based liquid redox electrolyte between the $TiO_2$ film coated slide a platinum coated $SnO_2$:F glass slide using 2 mil SURLYN 1702 hot melt adhesive available from DuPont. The platinum coating was approximately 60 nm thick. The cell exhibited a solar conversion efficiency of as high as 3.33% at AM 1.5 solar simulator conditions (i.e., irradiation with light having an intensity of 1000 $W/m^2$). The completed solar cells exhibited an average solar conversion efficiency ("$\eta$") of 3.02%; an average open circuit voltage ("$V_{oc}$") of 0.66 V; an average short circuit current ("$I_{sc}$") of 8.71 $mA/cm^2$, and an average fill factor of 0.49 (0.48 to 0.52). FIG. 8 depicts a graph 800 that shows the current-voltage curve 802 for the dip-coated photovoltaic cell.

Example 2

Polylinker-Nanoparticle Solution Application

Figure 9:
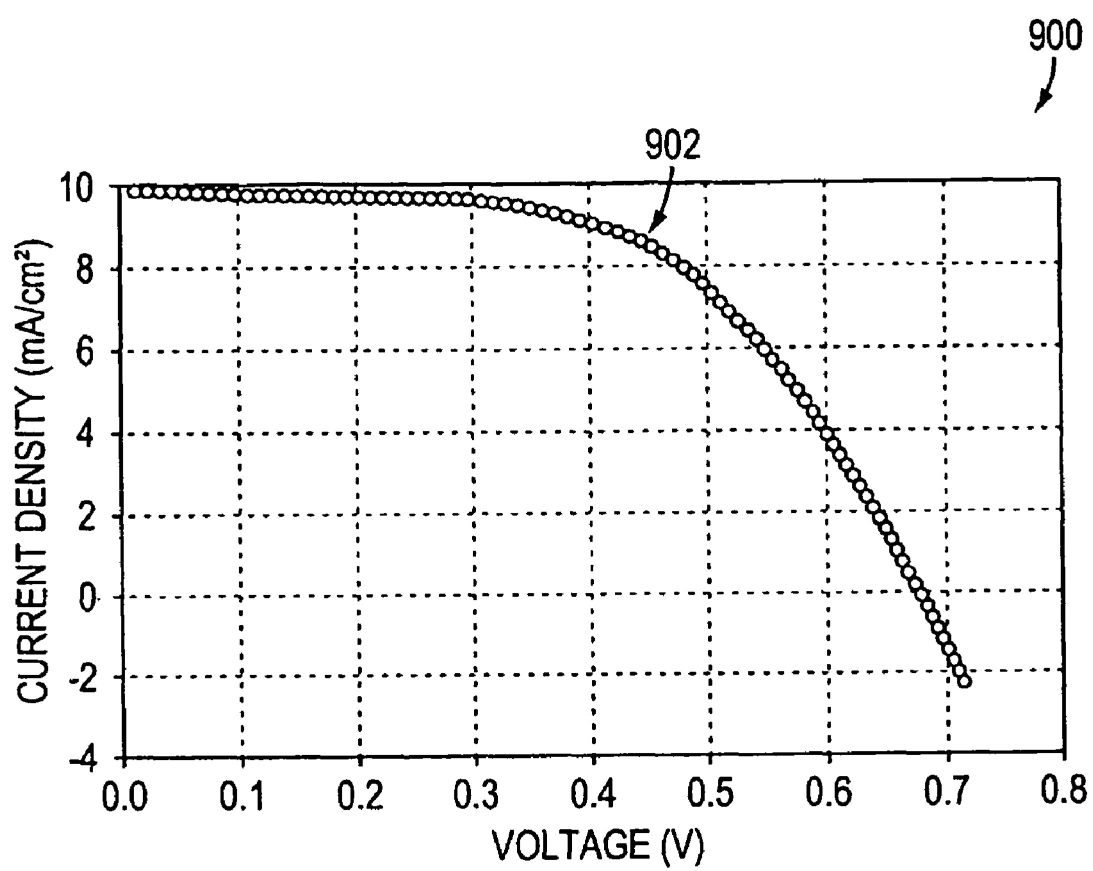
FIG. 9 shows a current-voltage curve for an exemplary solar cell, according to an illustrative embodiment of the invention.

In this illustrative example, a 5.0 mL suspension of titanium dioxide (P25, which is a titania that includes approximately 80% anatase and 20% rutile crystalline $TiO_2$ nanoparticles and which is available from Degussa-Huls) in n-butanol was added to 0.25 g of poly(n-butyl titanate) in 1 mL of n-butanol. In this embodiment, the concentration of the polylinker in the polylinker-nanoparticle solution was preferably less than about 50% by weight. The viscosity of the suspension changed from milk-like to toothpaste-like with no apparent particle separation. The paste was spread on a patterned $SnO_2$:F coated glass slide using a Gardner knife with a 60 μm thick tape determining the thickness of wet film thickness. The coatings were dried at room temperature forming the films. The air-dried films were subsequently heat treated at 150° C. for 30 minutes to remove solvent, and sensitized overnight with a $3\times10^{-4}$ M N3 dye solution in ethanol. The sensitized photoelectrodes were cut into desired sizes and sandwiched between a platinum (60 nm thick) coated $SnO_2$:F coated glass slide and a tri-iodide based liquid electrolyte. The completed solar cells exhibited an average $\eta$ of 2.9% (2.57% to 3.38%) for six cells at AM 1.5 conditions. The average $V_{oc}$ was 0.68 V (0.66 to 0.71 V); the average $I_{sc}$ was 8.55 $mA/cm^2$ (7.45 to 10.4 $mA/cm^2$); and the average fill factor was 0.49 (0.48 to 0.52). FIG. 9 depicts a graph 900 showing the current-voltage curve 902 for the photovoltaic cell formed from the polylinker-nanoparticle solution.

Example 3

DSSC Cells Formed Without Polylinker

Figure 10:
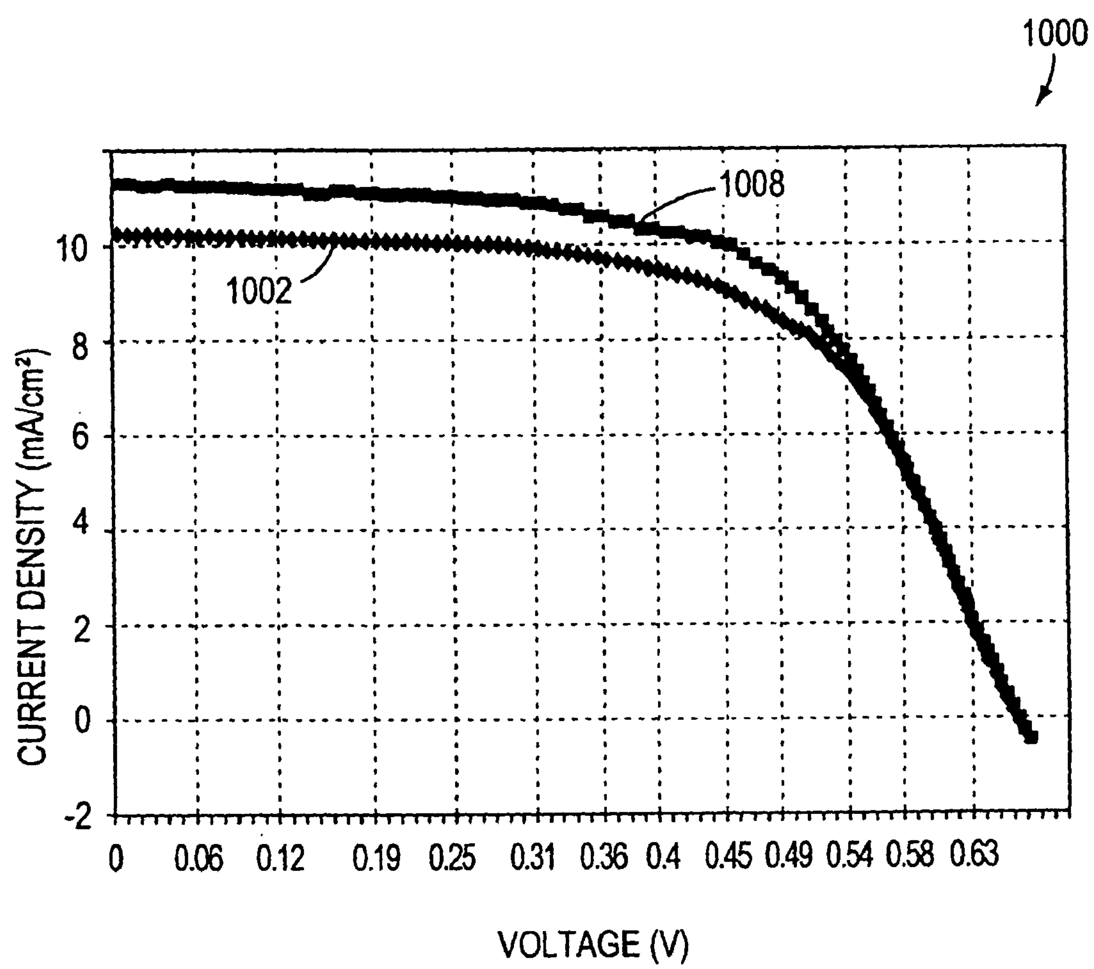
FIG. 10 shows current-voltage curves for two additional exemplary solar cells, according to an illustrative embodiment of the invention.

In this illustrative example, an aqueous titanium dioxide suspension (P25) containing about 37.5% solid content was prepared using a microfluidizer and was spin coated on a fluorinated $SnO_2$ conducting electrode (15 $\Omega/cm^2$) that was itself coated onto a coated glass slide. The titanium dioxide coated slides were air dried for about 15 minutes and heat treated at 150° C. for 15 minutes. The slides were removed from the oven, cooled to about 80° C., and dipped into $3\times10^{-4}$ M N3 dye solution in ethanol for about 1 hour. The sensitized titanium dioxide photoelectrodes were removed from dye solution rinsed with ethanol and dried over a slide warmer at 40° C. The sensitized photoelectrodes were cut into small pieces (0.7 cm×0.5-1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitrile was applied between the photoelectrode and platinized conducting electrode through capillary action. Thus constructed photocells exhibited an average solar conversion efficiency of about 3.83% at AM 1.5 conditions. The η at AM 1.5 conditions and the photovoltaic characteristics $I_{sc}V_{oc}$, voltage at maximum power output ("$V_m$"), and current at maximum power output ("$I_m$") of these cells are listed in Table 1 under column A. FIG. 10 depicts a graph 1000 showing the current-voltage curve 1002 for the photovoltaic cell formed without the polylinker.

TABLE 1

| | A Untreated | B 0.1% polymer soln. | C 0.4% polymer soln. | D 1% polymer soln. | E 2% polymer soln. |
|---|---|---|---|---|---|
| η (%) | Avg = 3.83 (3.37-4.15) | Avg. = 4.30 (4.15-4.55) | Avg = 4.55 (4.4-4.82) | Avg = 4.15 (3.48-4.46) | Avg = 4.15 (3.7-4.58) |
| $I_{sc}$ (mA/cm$^2$) | Avg = 10.08 (8.88-10.86) | Avg = 10.96 (10.44-11.5) | Avg = 10.60 (9.79-11.12) | Avg = 11.00 (10.7-11.28) | Avg = 11.24 (10.82-11.51) |
| $V_{oc}$ (V) | Avg = 0.65 (0.65-0.66) | Avg = 0.66 (0.6-0.7) | Avg = 0.71 (0.69-0.74) | Avg = 0.7 (0.69-0.71) | Avg = 0.69 (0.68-0.71) |
| $V_m$ (V) | Avg = 0.454 (0.43-0.49) | Avg = 0.46 (0.43-0.477) | Avg = 0.50 (0.47-0.53) | Avg = 0.45 (0.4-0.47) | Avg = 0.44 (0.42-0.46) |
| $I_m$ (mA/cm$^2$) | Avg = 8.4 (7.5-8.96) | Avg = 9.36 (8.75-9.71) | Avg = 9.08 (8.31-9.57) | Avg = 9.14 (8.70-9.55) | Avg = 9.28 (8.66-9.97) |

Example 4

DSSC Cells Formed With Various Concentrations of Polylinker Solution

In this illustrative example, a P25 suspension containing about 37.5% solid content was prepared using a microfluidizer and was spin coated on fluorinated $SnO_2$ conducting electrode (15 Ω/cm$^2$) coated glass slide. The titanium dioxide coated slides were air dried for about 15 minutes and heat treated at 150° C. for 15 minutes. The titanium dioxide coated conducting glass slide were dipped into a polylinker solution including poly(n-butyl titanate) in n-butanol for 5 minutes in order to carry out interconnection (polylinking) of nanoparticles. The polylinker solutions used were 0.1 wt % poly(n-butyl titanate), 0.4 wt % poly(n-butyl titanate), 1 wt % poly (n-butyl titanate), and 2 wt % poly(n-butyl titanate). After 5 minutes, the slides were removed from the polylinker solution, air dried for about 15 minutes and heat treated in an oven at 150° C. for 15 minutes to remove solvent. The slides were removed from the oven, cooled to about 80° C., and dipped into $3\times10^{-4}$ M N3 dye solution in ethanol for about 1 hour. The sensitized titanium dioxide photoelectrodes were removed from dye solution, rinsed with ethanol, and dried over a slide warmer at 40° C. The sensitized photoelectrodes were cut into small pieces (0.7 cm×0.5-1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitrile was applied between the photoelectrode and platinized conducting electrode through capillary action. The η at AM 1.5 conditions and the photovoltaic characteristics $I_{sc}$, $V_{oc}$, $V_m$, and $I_m$ of the constructed cells are listed in Table 1 for the 0.1 wt % solution under column B, for the 0.4 wt % solution under column C, for the 1 wt % solution under column D, and for the 2 wt % solution under column E. FIG. 10 depicts the current-voltage curve 1008 for the photovoltaic cell formed with the polylinker.

Example 5

Modifier Solutions

In this illustrative example, titanium dioxide coated transparent conducting oxide coated glass slides were prepared by spin coating process as described in Example 4. The titanium oxide coated conducting glass slides were treated with polylinker solution including, a 0.01 M poly(n-butyl titanate) solution in n-butanol for 5 minutes to interconnect the nanoparticles. The slides were air dried for about 5 minutes after removing from the polylinker solution. The slides were later dipped into a modifier solution for about 1 minute. The modifier solutions used were 1:1 water/ethanol mixture, 1 M solution of t-butyl pyridine in 1:1 water/ethanol mixture, 0.05 M HCl solution in 1:1 water/ethanol mixture. One of the slides was treated with steam from humidifier for 15 seconds. The slides were air dried for 15 minutes and heat-treated at 150° C. for 15 minutes to remove solvent and then sensitized with a $3\times10^{-4}$M N3 dye solution for 1 hour. The sensitized photoelectrodes were sandwiched between platinized $SnO_2$:F coated glass slides and studied for photovoltaic characteristics using a liquid electrolyte containing 1 M LiI, 0.05 M iodine, and 1 M t-butyl pyridine in 3-methoxybutyronitrile. Acid seems to help in increasing the photoconductivity and efficiency of these photocells. The η at AM 1.5 conditions and the photovoltaic characteristics of the cells of this example are listed in Table 2 as follows: slides not dipped into a modifier solution and not treated with polylinker solution (column A); slides not dipped into a modifier, but treated with polylinker solution (column B); slides were first treated with polylinker solution and then dipped in 1:1 water/ethanol mixture (column C); slides were first treated with polylinker solution and then dipped in 1 M solution of t-butyl pyridine in 1:1 water/ethanol mixture (column D); slides were first treated with polylinker solution and then dipped in 0.05 M HCl solution in 1:1 water/ethanol mixture (column E); and slides were first treated with polylinker solution and then treated with steam from humidifier (column F).

TABLE 2

| | A Untreated | B Treated with 0.01M TiBut | C Treated with 1:1 $EtOH/H_2O$ | D Treated with 1M t-BuPy/1:1 $EtOH/H_2O$ | E Treated with 0.05M HCl/1:1 $EtOH/H_2O$ | F Steam from Humidifier for 15 sec. |
|---|---|---|---|---|---|---|
| η (%) | Avg = 3.92 (3.75-4.15) | Avg = 4.41 (4.12-4.74) | Avg = 4.11 (4.06-4.15) | Avg = 4.34 (4.27-4.38) | Avg = 4.67 (4.61-4.73) | Avg = 4.41 (4.38-4.45) |
| $V_{oc}$ (V) | Avg = 0.66 (0.66-0.67) | Avg = 0.66 (0.65-0.66) | Avg = 0.65 (0.64-0.65) | Avg = 0.65 (0.64-0.66) | Avg = 0.66 (0.65-0.66) | Avg = 0.66 (0.66-0.67) |
| $I_{sc}$ (mA/cm$^2$) | Avg = 9.97 (9.48-10.56) | Avg = 12.57 (11.7-13.22) | Avg = 11.85 (11.21-12.49) | Avg = 11.85 (11.21-12.49) | Avg = 12.51 (12.15-12.87) | Avg = 11.63 (11.25-12.01) |
| $V_m$ (V) | Avg = 0.468 (0.46-0.48) | Avg = 0.434 (0.4-0.457) | Avg = 0.44 (0.43-0.45) | Avg = 0.45 (0.44-0.456) | Avg = 0.457 (0.453-0.46) | Avg = 0.45 (0.44-0.46) |
| $I_m$ (mA/cm$^2$) | Avg = 8.36 (7.85-8.89) | Avg = 10.08 (9.57-10.37) | Avg = 9.27 (9.01-9.53) | Avg = 9.52 (9.22-9.75) | Avg = 10.23 (10.17-10.29) | Avg = 9.67 (9.38-9.96) |

Example 6

Post-Interconnection Heating to 150° C.

In this illustrative example, a titanium-dioxide-coated, transparent-conducting-oxide-coated glass slide was prepared by a spin coating process as described in Example 4. The slide was dipped into 0.01 M poly(n-butyl titanate) in n-butanol for 30 seconds and was air-dried for 15 minutes. The slide was later heat treated at 150° C. for 10 minutes in an oven. The heat-treated titanium oxide layer was sensitized with N3 dye solution for 1 hour, washed with ethanol, and warmned on a slide warmer at 40° C. for 10 minutes. The sensitized photoelectrodes were cut into 0.7 cm×0.7 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average η of 3.88% (3.83, 3.9 and 3.92), an average $V_{oc}$ of 0.73 V (0.73, 0.74 and 0.73 V), and an average $I_{sc}$ of 9.6 mA/cm$^2$ (9.88, 9.65 and 9.26), all at AM 1.5 conditions.

Example 7

Post-Interconnection Heating to 70° C.

In this illustrative example, a titanium-dioxide-coated, transparent-conducting-oxide-coated glass slide was prepared by a spin coating process as described in Example 4. The slide was dipped into 0.01 M poly(n-butyl titanate) in n-butanol for 30 seconds and was air-dried for 15 minutes. The slide was later heat treated at 70° C. for 10 minutes in an oven. The heat-treated titanium oxide layer was sensitized with N3 dye solution for 1 hour, washed with ethanol, and warmed on a slide warmer at 40° C. for 10 minutes. The sensitized photoelectrodes were cut into 0.7 cm×0.7 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average η of 3.62% (3.55, 3.73 and 3.58), an average $V_{oc}$ of 0.75 V (0.74, 0.74 and 0.76 V), and average $I_{sc}$ of 7.96 mA/cm$^2$ (7.69, 8.22 and 7.97), all at AM 1.5 conditions.

Example 8

Formation on a Flexible, Transparent Substrate

In this illustrative example, a PET substrate about 200 μm thick and about 5 inches by 8 feet square was coated with ITO and loaded onto a loop coater. An 18.0 mL suspension of titanium dioxide (P25 with 25% solid content) in n-butanol and 0.5 g of poly(n-butyl titanate) in 10 mL of n-butanol were in-line blended and coated onto the ITO coated PET sheet. After deposition, the coating was heated at about 50° C. for about 1 minute. The interconnected nanoparticle layer was then dye-sensitized by coating with a $3\times10^{-4}$ M solution of N3 dye in ethanol.

B. Gel Electrolytes for DSSCs

According to further illustrative embodiments, the invention provides electrolyte compositions that include multi-complexable molecules (i.e., molecules containing 2 or more ligands capable of complexing) and redox electrolyte solutions, which are gelled using metal ions, such as lithium ions. The multi-complexable compounds are typically organic compounds capable of complexing with a metal ion at a plurality of sites. The electrolyte composition can be a reversible redox species that may be liquid by itself or solid components dissolved in a non-redox active solvent, which serves as a solvent for the redox species and does not participate in reduction-oxidation reaction cycle. Examples include common organic solvents and molten salts that do not contain redox active ions. Examples of redox species include, for example, iodide/triiodide, $Fe^{2+}/Fe^{3+}$, $Co^{2+}/Co^{3+}$, and viologens, among others. The redox components are dissolved in non-aqueous solvents, which include all molten salts. Iodide based molten salts, e.g., methylpropylimidazolium iodide, methylbutylimidazolium iodide, methylhexylimidazolium iodide, etc., are themselves redox active and can be used as redox active liquids by themselves or diluted with non-redox active materials like common organic solvents or molten salts that do not undergo oxidation-reduction reaction cycles. Multi-dendate inorganic ligands may also be a source of gelling compounds.

Figure 11:
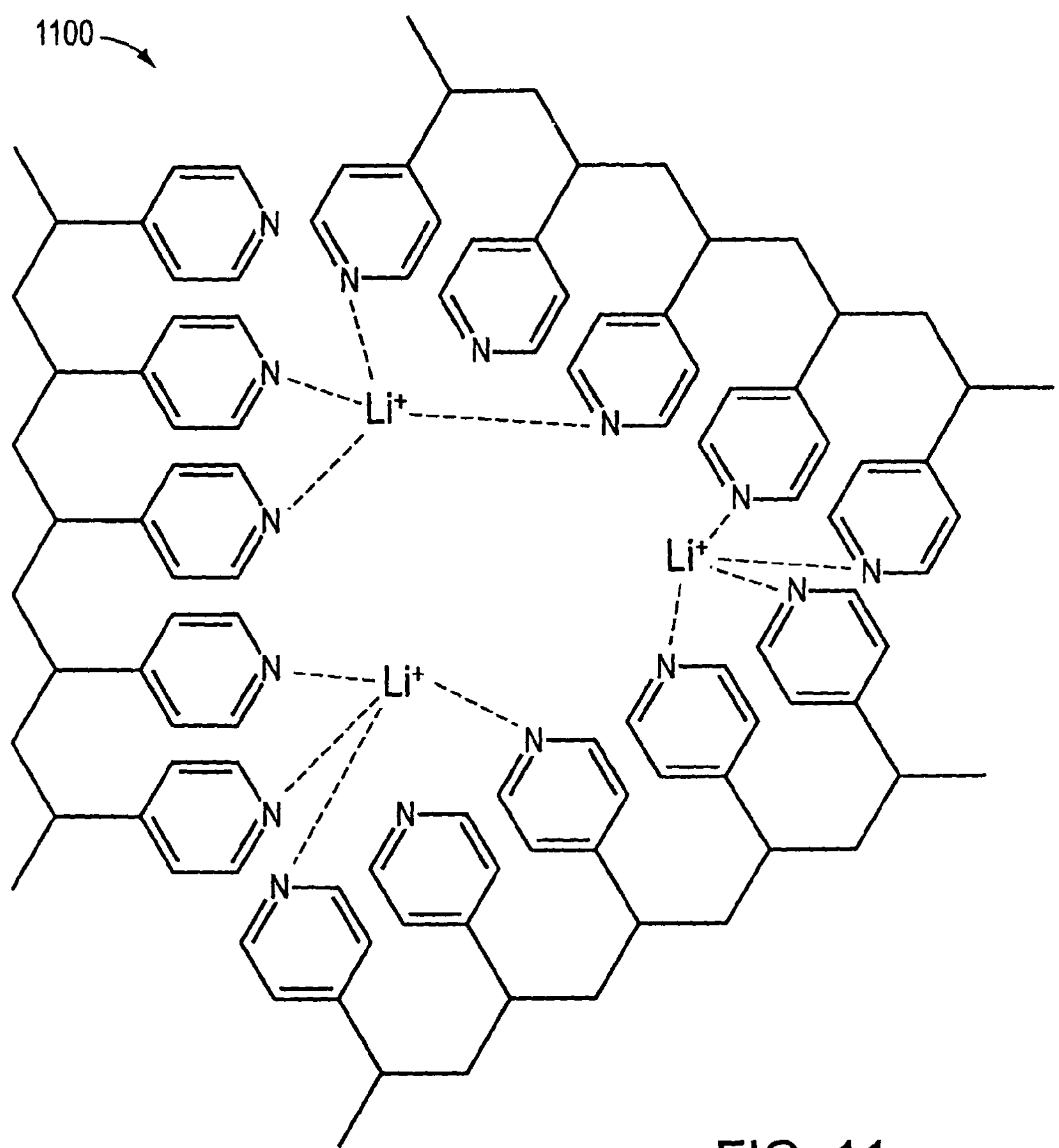
FIG. 11 depicts the chemical structure of gelation induced by a complexing reaction of $Li^+$ ions with complexable poly (4-vinyl pyridine) compounds, in accordance with an illustrative embodiment of the invention.

FIG. 11 depicts an illustrative embodiment of an electrolyte gelled using metal ions. Lithium ions are shown complexed with poly(4-vinyl pyridine). The lithium ions and the organic compounds, in this instance poly(4-vinyl pyridine) molecules capable of complexing at a plurality of sites with the lithium ions, can be used to gel a suitable electrolyte solution. An electrolyte composition prepared in accordance with the invention may include small amounts of water, molten iodide salts, an organic polymer, and other suitable compound gels upon the addition of a metal ion such as lithium.

Gelled electrolytes may be incorporated into individual flexible photovoltaic cells, traditional solar cells, photovoltaic fibers, interconnected photovoltaic modules, and other suitable devices. The dotted lines shown in FIG. 11 represent the type of bonding that occurs in a photovoltaic gel electrolyte when the constituent electrolyte solution and organic compounds gel after the introduction of a suitable metal ion.

A non-exhaustive list of organic compounds that are capable of complexing with the metal ion at a plurality of sites, and which are suitable for use in the invention, include various polymers, starburst/dendrimeric molecules, and other molecules containing multiple functional groups, e.g., urethanes, esters, ethylene/propylene oxide/imines segments, pyridines, pyrimidines, N-oxides, imidazoles, oxazoles, triazoles, bipyridines, quinolines, polyamines, polyamides, ureas, β-diketones, and β-hydroxy ketones.

More generally, the multi-complexable molecules employed in various embodiments may be polymeric or small organic molecules that possess two or more ligand or ligating groups capable of fonning complexes. Ligating groups are functional groups that contain at least one donor atom rich in electron density, e.g., oxygen, nitrogen, sulfur, or phosphorous, among others and form monodentate or multidentate complexes with an appropriate metal ion. The ligating groups may be present in non-polyrneric or polymeric material either in a side chain or part of the backbone, or as part of a dendrimer or starburst molecule. Examples of monodentate ligands include, for example, ethyleneoxy, alkyl-oxy groups, pyridine, and alkyl-imine compounds, among others. Examples of bi- and multidentate ligands include bipyridines, polypyridines, urethane groups, carboxylate groups, and amides.

According to various embodiments of the invention, dye-sensitized photovoltaic cells having a gel electrolyte 1100 including lithium ions are fabricated at or below room temperature or at elevated temperatures below about 300° C. The temperature may be below about 100° C., and preferably, the gelling of the electrolyte solution is performed at room temperature and at standard pressure. In various illustrative embodiments, the viscosity of the electrolyte solution may be adjusted to facilitate gel electrolyte deposition using printing techniques such as, for example, screen-printing and gravure-printing techniques. The complexing of lithium ions with various ligands can be broken at higher temperatures, thereby permitting the gel electrolyte compositions to be easily processed during DSSC based photovoltaic module fabrication. Other metal ions may also be used to form thermally reversible or irreversible gels. Examples of suitable metal ions include: $Li^{+}$, $Cu^{2+}$, $Ba^{2+}$, $Zn^{2+}$, $Ni^{2+}$, $Ln^{3+}$ (or other lanthanides), $Co^{2+}$, $Ca^{2+}$, $Al^{3+}$, $Mg^{2+}$, and any metal ion that complexes with a ligand.

Figure 12:
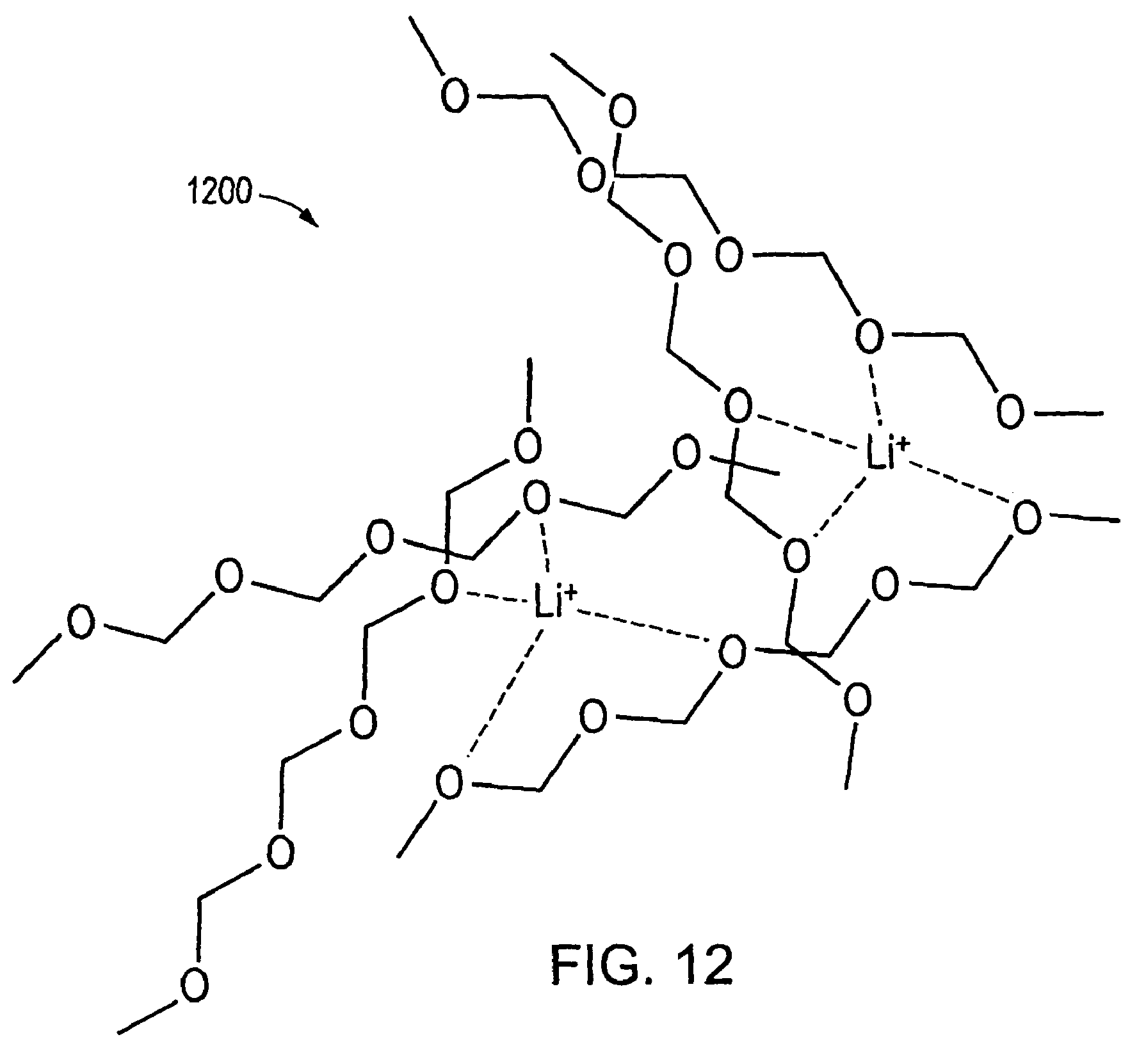
FIG. 12 shows the chemical structure of a lithium ion complexing with polyethylene oxide segments, according to another illustrative embodiment of the invention.

FIG. 12 depicts a gel electrolyte 1200 formed by the complexing of an organic polymer, polyethylene oxide (PEO), by lithium ions. The PEO polymer segments are shown as being complexed about the lithium ions and crosslinked with each other. In another embodiment, the metal ion complexed with various polymer chains can be incorporated into a reversible redox electrolyte species to promote gelation. The gel electrolyte composition that results from the combination is suitable for use in various photovoltaic cell embodiments such as photovoltaic fibers, photovoltaic cells, and electrically interconnected photovoltaic modules.

Referring back to FIG. 6, the charge carrier material 606 can include an electrolyte composition having an organic compound capable of complexing with a metal ion at a plurality of sites; a metal ion such as lithium; and an electrolyte solution. These materials can be combined to produce a gelled electrolyte composition suitable for use in the charge carrier material 606 layer. In one embodiment, the charge carrier material 606 includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$, and viologens.

Further illustrative examples of the invention in the context of a DSSC having a gel electrolyte composition are provided below. The photoelectrodes used in the following illustrative examples were prepared according to the following procedure. An aqueous, titania suspension (P25, which was prepared using a suspension preparation technique with total solid content in the range of 30-37%) was spun cast on $SnO_2$:F coated glass slides (15 Ω/cm$^2$). The typical thickness of the titanium oxide coatings was around 8 μm. The coated slides were air dried at room temperature and sintered at 450° C. for 30 minutes. After cooling the slides to about 80° C., the slides were immersed into $3\times10^{-4}$ M N3 dye solution in ethanol for 1 hour. The slides were removed and rinsed with ethanol and dried over slide a warmer at 40° C. for about 10 minutes. The slides were cut into about 0.7 cm×0.7 cm square active area cells. The prepared gels were applied onto photoelectrodes using a glass rod and were sandwiched between platinum-coated, $SnO_2$:F coated, conducting glass slides. The cell performance was measured at AM 1.5 solar simulator conditions (i.e., irradiation with light having an intensity of 1000 W/m$^2$).

Example 9

Effect of Lithium Iodide in Standard Ionic Liquid Based Electrolyte Composition

In this illustrative example, the standard, ionic, liquid-based redox electrolyte composition that was used contained a mixture containing 99% (by weight) imidazolium iodide based ionic liquid and 1% water (by weight), combined with 0.25 M iodine and 0.3 M methylbenzimidazole. In various experimental trials, electrolyte solutions with at least a 0.10 M iodine concentration exhibit the best solar conversion efficiency. In a standard composition, butylmethylimidazolium iodide (MeBuImI) was used as the ionic liquid. Photovoltage decreased with increases in iodine concentration, while photoconductivity and conversion efficiency increased at least up to 0.25 M iodine concentration. Adding lithium iodide to the standard composition enhanced the photovoltaic characteristics $V_{oc}$ and $I_{sc}$ and the η. Therefore, in addition to lithium's use as a gelling agent, it may serve to improve overall photovoltaic efficiency. Table 3 summarizes the effect of LiI on photovoltaic characteristics.

TABLE 3

| | Standard | Standard + 1 wt % LiI | Standard + 2 wt % LiI | Standard + 3 wt % LiI | Standard + 5 wt % LiI |
|---|---|---|---|---|---|
| η (%) | 2.9% | 3.57 | 3.75 | 3.70 | 3.93 |
| $V_{oc}$ (V) | 0.59 | 0.61 | 0.6 | 0.6 | 0.61 |
| $I_{sc}$ (mA/cm$^2$) | 10.08 | 11.4 | 11.75 | 11.79 | 12.62 |
| $V_m$ (V) | 0.39 | 0.4 | 0.39 | 0.4 | 0.39 |
| Im (mA/cm$_2$) | 7.44 | 9.02 | 9.64 | 9.0 | 10.23 |

The fill factor ("FF") is referenced below and can be calculated from the ratio of the solar conversion efficiency to the product of the open circuit voltage and the short circuit current, i.e., $FF=\eta/[V_{oc}*I_{sc}]$.

Example 10

The Effect of Cations on the Enhancement in Photovoltaic Characteristics

In order to ascertain whether the enhancement in photovoltaic characteristics was due to the presence of lithium or iodide, controlled experimental trials using various iodides in conjunction with cations including lithium, potassium, cesium and tetrapropylammonium iodide were conducted. The iodide concentration was fixed at 376 μmols/gram of standard electrolyte composition. The standard composition used was a mixture containing 99% MeBuImI and 1% water, combined with 0.25 M iodine and 0.3 M methylbenzimidazole. 376 μmols of various iodide salts per gram of standard electrolyte composition were dissolved in the electrolyte. The complete dissolution of LiI was observed. The other salts took a long time to dissolve and did not dissolve completely over the course of the experimental trial. DSSC-based photovoltaic cells were fabricated using prepared electrolytes containing various cations. Table 4 shows the effect of the various cations on the photovoltaic characteristics. It is apparent from the second column of Table 4 that $Li^+$ ion shows enhanced photovoltaic characteristics compared to the standard formula, while the other cations do not appear to contribute to the enhancement of the photovoltaic characteristics.

TABLE 4

| | Standard | Standard + LiI | Standard + $NPR_4I$ | Standard + KI | Standard + CsI |
|---|---|---|---|---|---|
| η (%) | 3.23 | 4.39 | 2.69 | 3.29 | 3.23 |
| $V_{oc}$ (V) | 0.58 | 0.65 | 0.55 | 0.58 | 0.6 |
| $I_{sc}$ (mA/cm$^2$) | 10.96 | 12.03 | 9.8 | 9.91 | 10.14 |
| $V_m$ (V) | 0.36 | 0.44 | 0.36 | 0.4 | 0.4 |
| $I_m$ (mA/cm$^2$) | 8.96 | 9.86 | 7.49 | 8.25 | 8.32 |

Example 11

Effect of Ionic Liquid Type

In one aspect of the invention, MeBuImI-based electrolyte compositions have been found to perform slightly better than MePrImI based electrolytes. In addition, experimental results demonstrate that a 1/1 blend of MeBuImI and MePrImI exhibit better performance than MeBuImI, as shown in Table 5.

TABLE 5

| | 376 μmoles of LiI per 1 gram of MeBuImI based standard electrolyte composition. | 376 μmoles of LiI per 1 gram of MeBuImI/MePrImI based standard electrolyte composition. |
|---|---|---|
| η (%) | 3.64 | 3.99 |
| $V_{oc}$ (V) | 0.63 | 0.63 |
| $I_{sc}$ (mA/cm$^2$) | 11.05 | 11.23 |
| $V_m$ (V) | 0.42 | 0.42 |
| $I_m$ (mA/cm$^2$) | 8.69 | 9.57 |

Example 12

Using Li-Induced Gelling in Composition A Instead of a Dibromocompound

In this illustrative example, a Composition A was prepared by dissolving 0.09 M of iodine in a mixed solvent consisting of 99.5% by weight of 1-methyl-3-propyl imidazolium iodide and 0.5% by weight of water. Then, 0.2 g of poly(4-vinylpyridine) ("P4VP"), a nitrogen-containing compound, was dissolved in 10 g of the Composition A Further, 0.2 g of 1,6-dibromohexane, an organic bromide, was dissolved in the resultant Composition A solution, so as to obtain an electrolyte composition, which was a precursor to a gel electrolyte.

Gelling occurred quickly when 5 wt % of lithium iodide (376 μmols of lithium salt per gram of standard electrolyte composition) was used as the gelling agent in an electrolyte composition containing (i) 2 wt % P4VP and (ii) a mixture containing 99.5% MePrImI and 0.5% water. The gel did not flow when a vial containing the Li-induced gel was tilted upside down. One approach using a dibromo compound produced a phase-segregated electrolyte with cross-linked regions suspended in a liquid, which flows (even after gelling at 100° C. for 30 minutes). A comparison of the photovoltaic characteristics of Composition A, with and without LiI, is presented in the following Tables 6 and 7. The results demonstrate that functional gels suitable for DSSC-based photovoltaic cell fabrication can be obtained using lithium ions, while also improving the photovoltaic characteristics.

TABLE 6

| | Composition A with dibromohexane | Composition A with 2 wt. % P4VP | MeBuImI based electrolyte + 2 wt. % P4VP + 5 wt. % LiI |
|---|---|---|---|
| η (%) | 2.6 | 3.04 | 3.92 |
| $V_{oc}$ (V) | 0.59 | 0.58 | 0.65 |
| $I_{sc}$ (mA/cm$^2$) | 9.73 | 10.0 | 11.45 |
| $V_m$ (V) | 0.38 | 0.38 | 0.42 |
| $I_m$ (mA/cm$^2$) | 6.82 | 8.04 | 9.27 |

TABLE 7

| | (a) Composition A where MePrImI:water is 99.5:0.5 and with 2% P4VP and 0.09 M Iodine | (b) Same composition as (a), but with 5 wt % of LiI |
|---|---|---|
| Physical Properties | Reddish fluid; flows well | Non-scattering Gel; does not flow; can be thinned by applying force using a glass rod. |
| Efficiency | 2.53% | 3.63% |
| $V_{oc}$ | 0.55 V | 0.62 V |
| $I_{sc}$ | 9.82 mA/cm$^2$ | 12.29 mA/cm$^2$ |
| $V_m$ | 0.343 V | 0.378 V |
| FF | 0.47 | 0.47 |

Example 13

Effect of Anions of Lithium Salts on the Efficiency and Photovoltage of DSSCs

Experiments were performed to study the effect of counter ions on lithium, given lithium's apparent role in enhancing the overall efficiency of DSSCs. 376 μmols of LiI, LiBr, and LiCl were used per gram of the electrolyte composition containing MePrImI, 1% water, 0.25 M iodine and 0.3 M methylbenzimidazole in order to study the photovoltaic characteristics of the cells. The photovoltaic characteristics of cells containing these electrolytes are presented in Table 8.

TABLE 8

| | Electrolyte composition with LiI | Electrolyte composition with LiBr | Electrolyte composition with LiCl |
|---|---|---|---|
| Efficiency | 3.26% | 3.64% | 3.71% |
| $V_{oc}$ | 0.59 V | 0.62 V | 0.65 V |
| $I_{sc}$ | 10.98 mA/cm$^2$ | 11.96 mA/cm$^2$ | 11.55 mA/cm$^2$ |
| $V_m$ | 0.385 V | 0.4 V | 0.40 V |
| FF | 0.5 | 0.49 | 0.49 |

Example 14

Passivation and Improved Efficiency and Photovoltage of DSSCs

In the field of photovoltaic cells, the term passivation refers to the process of reducing electron transfer to species within the electrolyte of a solar cell. Passivation typically includes treating a nanoparticle layer by immersion in a solution of t-butylpyridine in methoxypropionitrile or other suitable compound. After the nanomatrix layer, such as a titania sponge, of a photovoltaic cell has been treated with a dye, regions in the nanomatrix layer where the dye has failed to adsorb may exist. A passivation process is typically performed on a DSSC to prevent the reversible electron transfer reaction from terminating as result of reducing agents existing at the undyed regions. The typical passivation process does not appear to be necessary when ionic liquid compositions containing various lithium salts and/or other alkali metal salts are used in the DSSCs. A photovoltage greater than 0.65 V was achieved using a chloride salt of lithium without a passivation process.

In this illustrative example, a DSSC was passivated by immersing it in a solution containing 10 wt % of t-butylpyridine in methoxypropionitrile for 15 minutes. After passivation, the DSSC was dried on a slide warmer maintained at 40° C. for about 10 minutes. Electrolyte compositions containing MePrImI, 1% water, 0.3 M methylbenzimidazole, and 0.25 M iodine were gelled using 376 μmoles of LiI, LiBr, and LiCl per gram of standard electrolyte composition used during this study. Adding a t-butylpyridine-based passivation agent to the electrolyte enhanced the DSSC's photovoltage, but decreased the efficiency of the DSSC by decreasing the photoconductivity. Table 9 summarizes the effects of passivation on photovoltaic characteristics of electrolytes containing various lithium halides.

TABLE 9

| | Electrolyte gelled with LiI | Electrolyte gelled with LiBr | Electrolyte gelled with LiCl |
|---|---|---|---|
| Efficiency | 3.5% | 3.65% | 3.85% |
| $V_{oc}$ | 0.61 V | 0.63 V | 0.65 V |
| $I_{sc}$ | 10.96 mA/cm$^2$ | 11.94 mA/cm$^2$ | 11.75 mA/cm$^2$ |
| $V_m$ | 0.395 V | 0.4 V | 0.405 V |
| FF | 0.52 | 0.49 | 0.5 |

Example 15

Lithium's Role in Gelling the Electrolyte Compositions Containing Polyvinylpyridine and the Effect of Other Alkali Metal Ions on Gelability Lithium cation appears to have a unique effect in gelling ionic liquid composition containing complexable polymers, e.g., P4VP, in as small an amount as 2 wt %. Other alkali metal ions such as sodium, potassium, and cesium were used to carry out gelling experiments. Alkali metal salts such as lithium iodide, sodium chloride, potassium iodide, cesium iodide were added to portions of electrolyte composition containing propylmethylimidazolium iodide (MePrImI), 1% water, 0.25 M iodine, and 0.3 M methylbenzimidazole. Only compositions containing lithium iodide gelled under the experimental conditions used. The remaining three compositions containing sodium, potassium, and cesium did not gel at the experimental conditions used. Divalent metal ions, such as calcium, magnesium, and zinc, or trivalent metals, such as aluminum or other transition metal ions, are other potential gelling salts.

Example 16

Effect of Iodine and Lithium Concentration on Ionic Liquid Electrolyte Gels

In this illustrative example, gels were prepared by adding lithium salts to an electrolyte composition containing MeBuImI, iodine, and 2 wt % P4VP. The photovoltaic characteristics of the gels were tested using high-temperature sintered, N3 dye sensitized titanium-oxide photoelectrodes and platinized $SnO_2$:F coated glass slides. Both LiI and LiCl gelled the ionic liquid-based compositions that contained small amounts (2% was sufficient) of complexable polymers like P4VP. In compositions lacking methylbenzimidazole, the lithium did not effect the photovoltage. 5 wt % corresponds to a composition including about 376 μmoles of lithium salt per gram of ionic liquid and a mixture of 99 wt % butylmethylimidazolium iodide, 1 wt % water, 0.3 M methyl benzimidazole, and 0.25 M iodine. Therefore, 1 wt % corresponds to a 376/5≅75 μmoles of lithium salt per gram of ionic liquid composition. The photovoltaic characteristics are summarized in Table 10.

TABLE 10

| | 5% LiI | 2.5% LiI | 5% LiCl | 2.5% LiCl |
|---|---|---|---|---|
| 0.05 M Iodine | $\eta$ = 1.6%<br>$V_{oc}$ = 0.6 V<br>$I_{sc}$ = 4.89 mA<br>FF = 0.54<br>$V_m$ = 0.445 V | $\eta$ = 1.23%<br>$V_{oc}$ = 0.59 V<br>$I_{sc}$ = 4.21 mA<br>FF = 0.495<br>$V_m$ = 0.415 V | $\eta$ = 0.64%<br>$V_{oc}$ = 0.59 V<br>$I_{sc}$ = 2.95 mA<br>FF = 0.36<br>$V_m$ = 0.4 V | $\eta$ = 1.19%<br>$V_{oc}$ = 0.58 V<br>$I_{sc}$ = 3.87 mA<br>FF = 0.53<br>$V_m$ = 0.426 V |
| 0.1 M Iodine | $\eta$ = 1.22%<br>$V_{oc}$ = 0.48 V<br>$I_{sc}$ = 6.46 mA<br>FF = 0.39<br>$V_m$ = 0.349 V | $\eta$ = 1.29%<br>$V_{oc}$ = 0.56 V<br>$I_{sc}$ = 5.12 mA<br>FF = 0.45<br>$V_m$ = 0.386 V | $\eta$ = 2.83%<br>$V_{oc}$ = 0.57<br>$I_{sc}$ = 9.04 mA<br>FF = 0.55<br>$V_m$ = 0.422 V | $\eta$ = 2.06%<br>$V_{oc}$ = 0.58<br>$I_{sc}$ = 7.14 mA<br>FF = 0.5<br>$V_m$ = 0.42 V |

TABLE 10-continued

| | 5% LiI | 2.5% LiI | 5% LiCl | 2.5% LiCl |
|---|---|---|---|---|
| 0.25 M Iodine | $\eta$ = 2.58%<br>$V_{oc}$ = 0.55 V<br>$I_{sc}$ = 11.49 mA<br>FF = 0.41<br>$V_m$ = 0.338 V | $\eta$ = 3.06%<br>$V_{oc}$ = 0.55 V<br>$I_{sc}$ = 10.78 mA<br>FF = 0.52<br>$V_m$ = 0.36 V | $\eta$ = 3.4%<br>$V_{oc}$ = 0.56 V<br>$I_{sc}$ = 11.32 mA<br>FF = 0.54<br>$V_m$ = 0.369 V | $\eta$ = 2.6%<br>$V_{oc}$ = 0.56 V<br>$I_{sc}$ = 10.18 mA<br>FF = 0.46<br>$V_m$ = 0.364 V |

Example 17

Effect of Polymer Concentration on Gelability and Photovoltaic Characteristics of Redox Electrolyte Gels In this illustrative example, polymer concentration was varied to study its effect on gel viscosity and photovoltaic characteristics. The electrolyte composition used for this study was a mixture containing 99% MeBuImI, 1% water, 0.25 M iodine, 0.6 M LiI, and 0.3 M methylbenzimidazole. The concentration of the polymer, P4VP was varied from 1% to 5%. The electrolyte composition with 1% P4VP did flow slowly when the vial containing the gel was tilted down. The gels with 2%, 3%, and 5% did not flow. The gel with 5% P4VP appeared much more solid when compared to the 2% P4VP preparation. Table 11 summarizes the photovoltaic characteristics of the gels containing the various P4VP contents that were studied.

The results show that the photovoltaic characteristics do not vary with the increases in viscosity achieved by increasing the P4VP content. Therefore, the viscosity of the gel can be adjusted without causing degradation to the photovoltaic characteristics. Methylbenzimidazole may be necessary to achieve high $\eta$. Increasing the iodine concentration up to 0.25 M also increased the efficiency. Beyond 0.25 M, the photovoltage decreased drastically, reducing the overall efficiency. Other metal ions or cations like cesium, sodium, potassium or tetraalkylammonium ions were not found to contribute to the efficiency enhancement and did not cause gelling of the electrolyte solutions. Furthermore, chloride anion was found to enhance the efficiency along with lithium, by improving the photovoltage without causing decreased photoconductivity in compositions containing methylbenzimidazole.

TABLE 11

| Photovoltaic Characteristics | 1% P4VP | 2% P4VP | 3% P4VP | 5% P4VP |
|---|---|---|---|---|
| $\eta$ (%) | 3.23 | 3.48 | 3.09 | 3.19 |
| $I_{sc}$ (mA/cm$^2$) | 10.74 | 10.42 | 12.03 | 10.9 |
| $V_{oc}$ (V) | 0.59 | 0.59 | 0.6 | 0.61 |
| $V_m$ (V) | 0.39 | 0.4 | 0.38 | 0.40 |
| $I_m$ (mA/cm$^2$) | 8.27 | 8.69 | 8.07 | 8.03 |
| FF | 0.51 | 0.57 | 0.43 | 0.48 |

C. Co-Sensitizers

According to one illustrative embodiment, the photosensitizing agent described above includes a first sensitizing dye and second electron donor species, the "co-sensitizer." The first sensitizing dye and the co-sensitizer may be added together or separately to form the photosensitized interconnected nanoparticle material 603 shown in FIG. 6. As mentioned above with respect to FIG. 6, the sensitizing dye facilitates conversion of incident visible light into electricity to produce the desired photovoltaic effect. In one illustrative embodiment, the co-sensitizer donates electrons to an acceptor to form stable cation radicals, which improves the efficiency of charge transfer from the sensitizing dye to the semiconductor oxide nanoparticle material and reduces back electron transfer to the sensitizing dye or co-sensitizer. The co-sensitizer preferably includes (1) conjugation of the free electron pair on a nitrogen atom with the hybridized orbitals of the aromatic rings to which the nitrogen atom is bonded and, subsequent to electron transfer, the resulting resonance stabilization of the cation radicals by these hybridized orbitals; and (2) a coordinating group, such as a carboxy or a phosphate, the function of which is to anchor the co-sensitizer to the semiconductor oxide. Examples of suitable co-sensitizers include, but are not limited to, aromatic amines (e.g., such as triphenylamine and its derivatives), carbazoles, and other fused-ring analogues.

Once again referring back to FIG. 6, the co-sensitizer is electronically coupled to the conduction band of the photosensitized interconnected nanoparticle material 603. Suitable coordinating groups include, but are not limited to, carboxylate groups, phosphates groups, or chelating groups, such as, for example, oximes or alpha keto enolates.

Tables 12-18 below present results showing the increase in photovoltaic cell efficiency when co-sensitizers are co-adsorbed along with sensitizing dyes on the surface of high temperature sintered or low temperature interconnected titania. In Tables 12-18, characterization was conducted using AM 1.5 solar simulator conditions (i.e., irradiation with light having an intensity of 1000 W/m$^2$). A liquid electrolyte including 1 M LiI, 1 M t-butylpyridine, 0.5 M $I_2$ in 3-methoxypropanitrile was employed. The data shown in the tables indicates an enhancement of one or more operating cell parameters for both low-temperature-interconnected (Tables 15, 17 and 18) and high-temperature-sintered (Tables 12, 13, 14 and 16) titania nanoparticles. The solar cells characteristics listed include $\eta$, $V_{oc}$, $I_{sc}$, FF, $V_m$, and $I_m$. The ratios of sensitizer to co-sensitizer are based on the concentrations of photosensitizing agents in the sensitizing solution.

In particular, it was discovered that aromatic amines enhance cell performance of dye sensitized titania solar cells if the concentration of the co-sensitizer is below about 50 mol % of the dye concentration. An example of the general molecular structure of the preferred aromatic amines is shown in FIGS. 13 and 14. Preferably, the concentration of the co-sensitizer is in the range of about 1 mol % to about 20 mol %, and more preferably in the range of about 1 mol % to about 5 mol %.

Figure 13A:
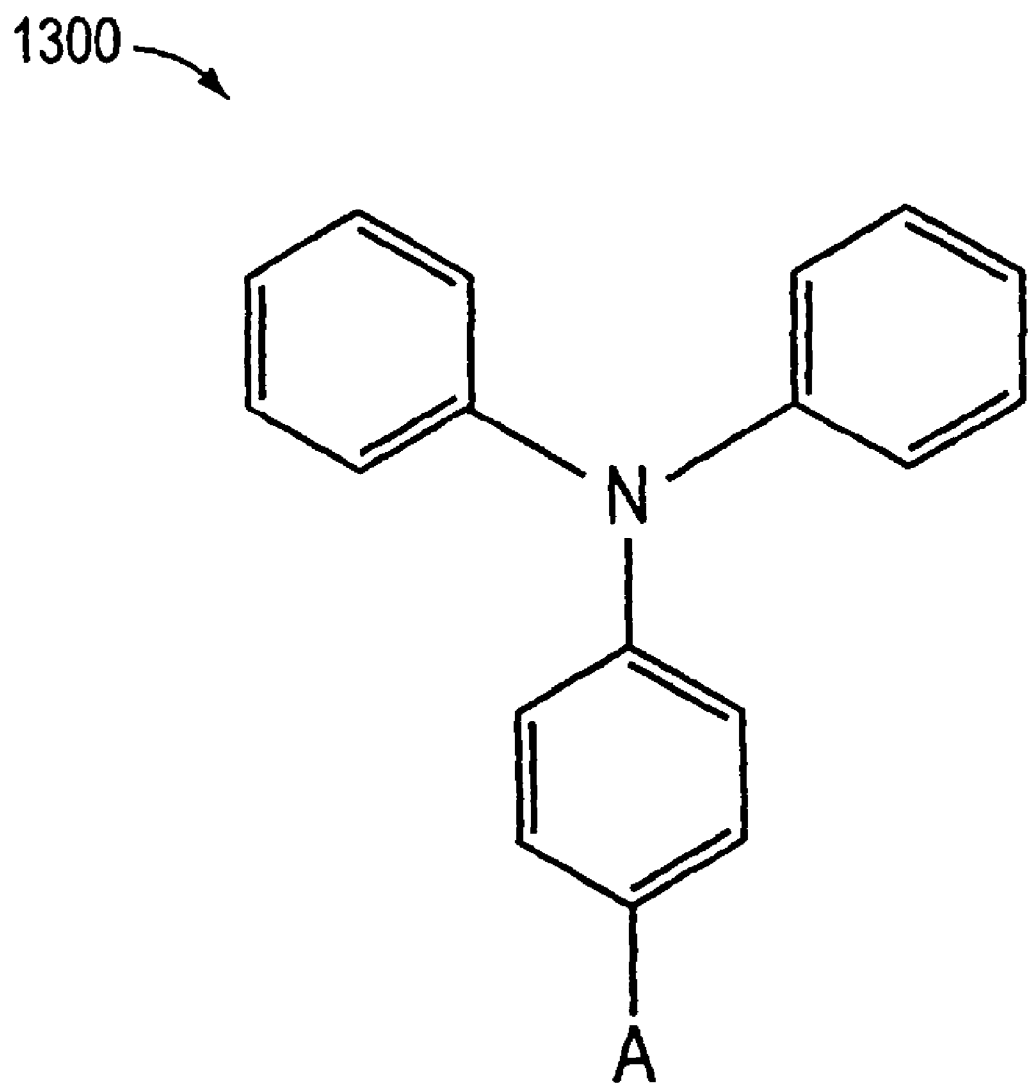
FIGS. 13A-13C depict chemical structures for exemplary co-sensitizers, according to illustrative embodiments of the invention.
Figure 13B:
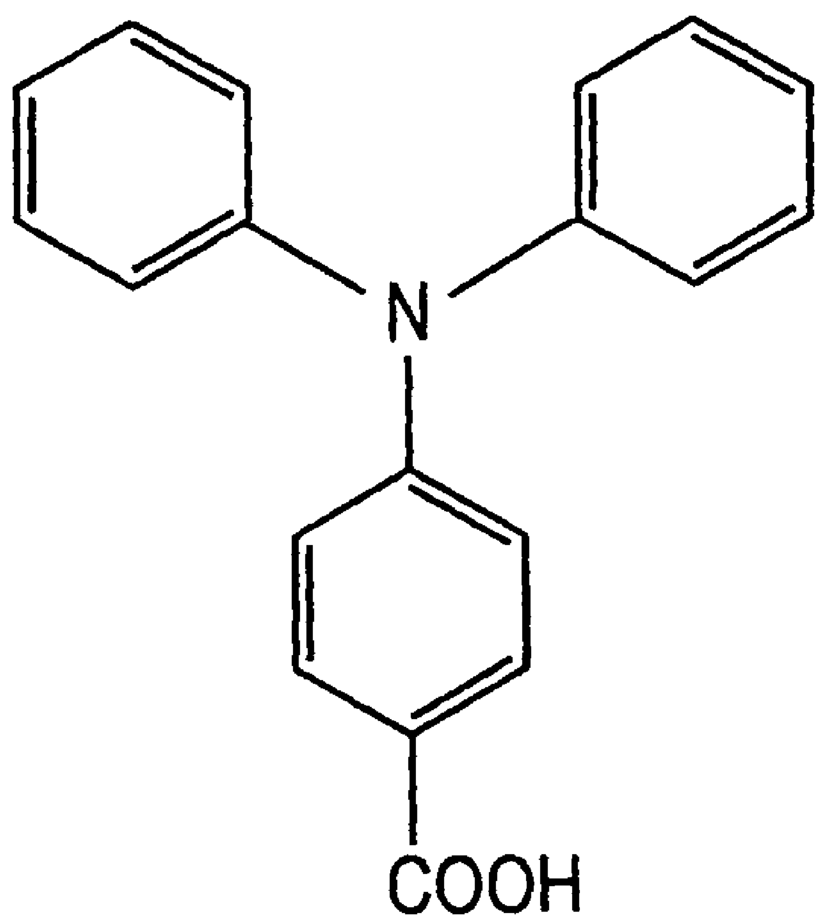
Figure 13C:
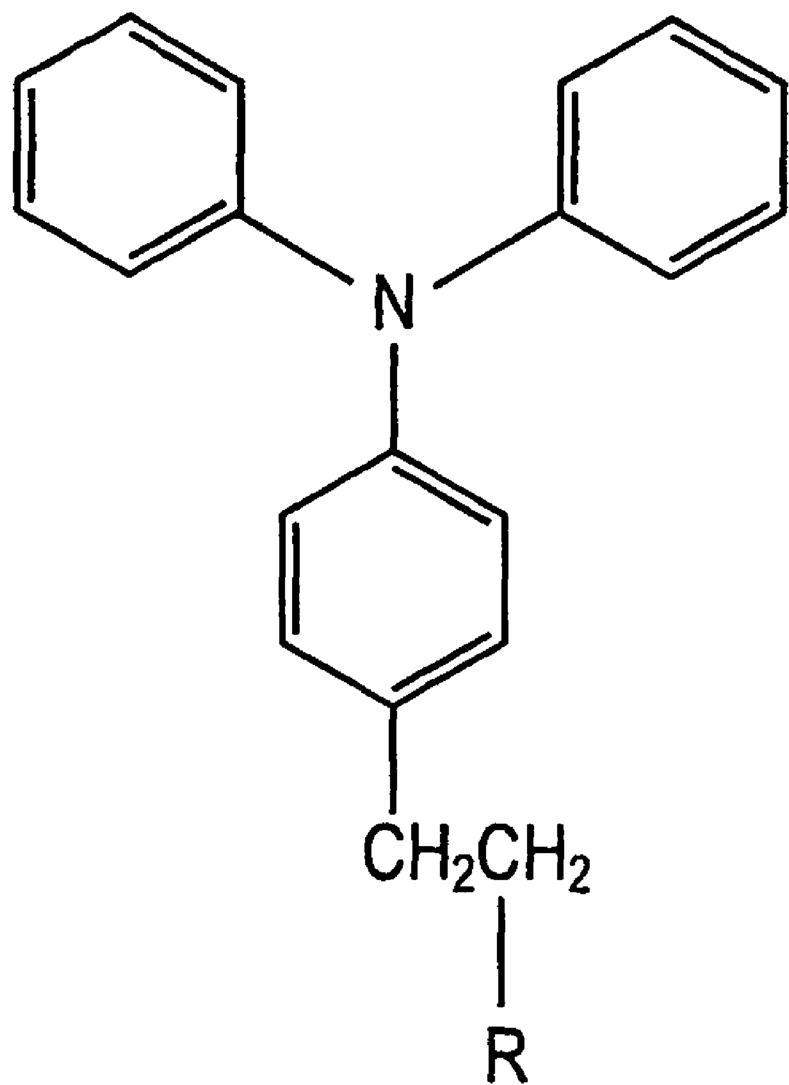

FIG. 13A depicts a chemical structure 1300 that may serve as a co-sensitizer. The molecule 1300 adsorbs to the surface of a nanoparticle layer via its coordinating group or chelating group, A. A may be a carboxylic acid group or derivative thereof, a phosphate group, an oxime or an alpha ketoenolate, as described above. FIG. 13B depicts a specific embodiment 1310 of the structure 1300, namely DPABA (diphenylaminobenzoic acid), where A=COOH. FIG. 13C depicts another specific amine 1320 referred to as DEAPA (N',N-diphenylaminophenylpropionic acid), with A as the carboxy derivative COOH.

Figure 14A:
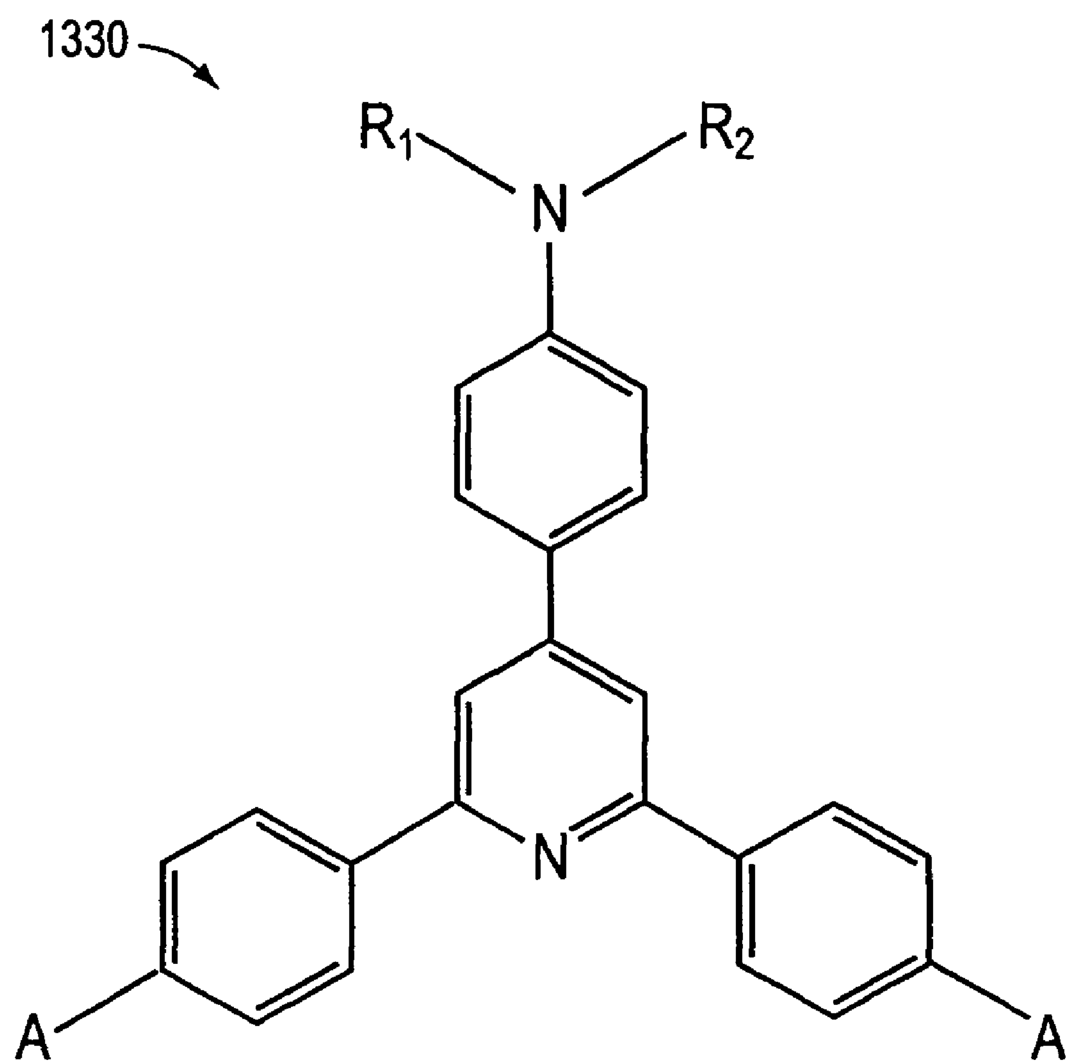
FIGS. 14A-14B depict additional exemplary chemical structures of co-sensitizers, according to illustrative embodiments of the invention.
Figure 14B:
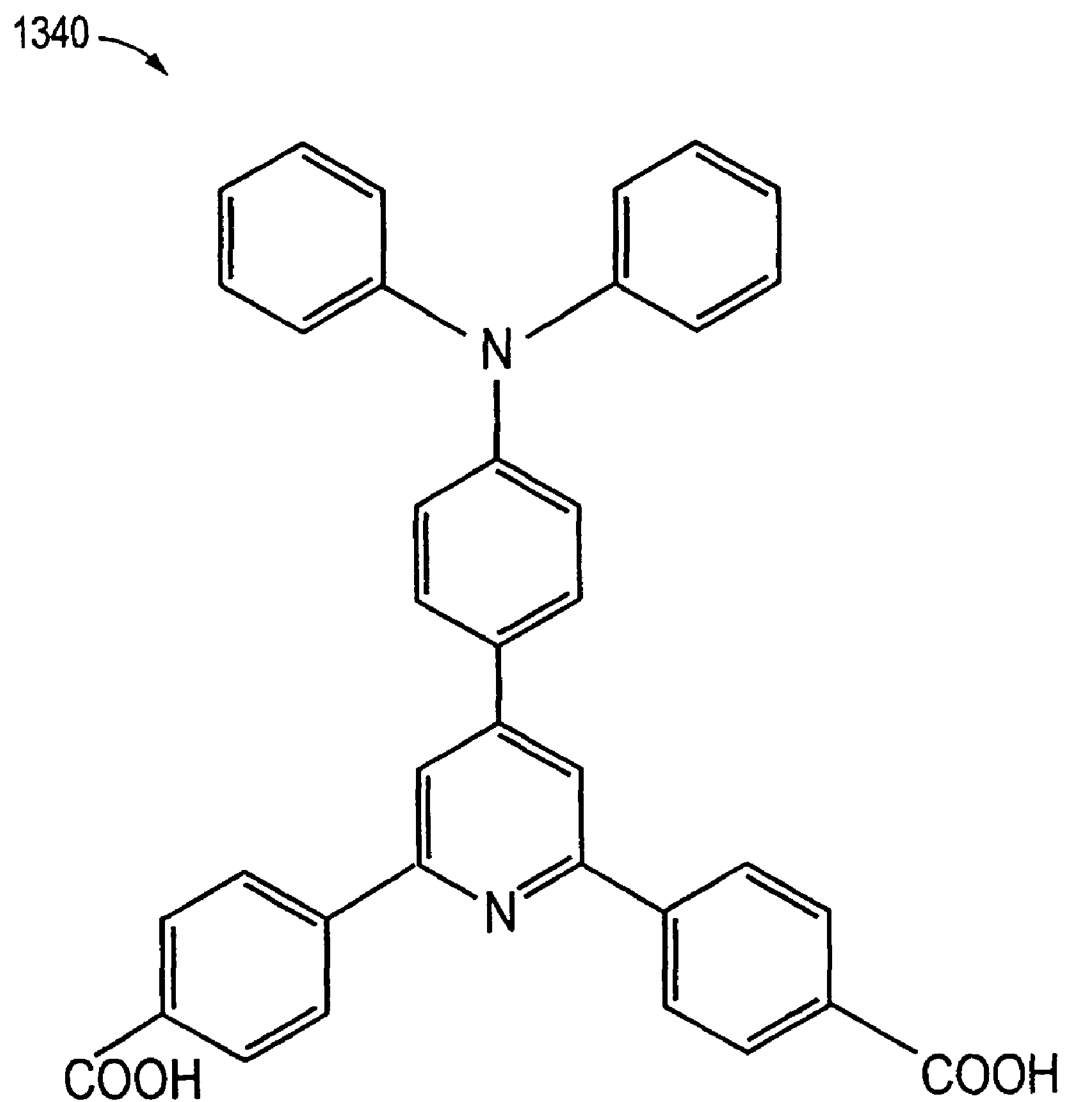

FIG. 14A shows a chemical structure 1330 that may serve as either a co-sensitizer, or a sensitizing dye. The molecule does not absorb radiation above 500 nm, and adsorbs to a surface of the nanoparticle layer via its coordinating or chelating groups, A. A may be a carboxylic acid group or derivative thereof, a phosphate group, an oxime or an alpha ketoenolate. $R_1$ and $R_2$ may each be a phenyl, alkyl, substituted phenyl, or benzyl group. Preferably, the alkyl may contain between 1 and 10 carbons. FIG. 14B depicts a specific embodiment 1340 of the structure 1330, namely DPACA (2,6 bis (4-benzoicacid)-4-(4-N,N-diphenylamino) phenylpyridine carboxylic acid), where $R_1$ and $R_2$ are phenyl and A is COOH.

DPACA 1340 may be synthesized as follows. 1.49 g (9.08 mmol) of 4-acetylbenzoic acid, 1.69 g (6.18 mmol) of 4-N, N-diphenylbenzaldehyde, and 5.8 g (75.2 mmol) of ammonium acetate were added to 60 ml of acetic acid in a 100 ml round bottom flask equipped with a condenser and stirring bar. The solution was heated to reflux with stirring under nitrogen for 5 hours. The reaction was cooled to room temperature and poured into 150 ml of water, which was extracted with 150 ml of dichloromethane. The dichloromethane was separated and evaporated with a rotary evaporator, resulting in a yellow oil. The oil was then eluted on a silica gel column with 4% methanol/dichloromethane to give the product, an orange solid. The solid was washed with methanol and vacuum dried to give 0.920 g of 2,6 bis (4-benzoicacid)-4-(4-N,N-diphenylamino)phenylpyridine (DPACA). The melting point was 199°-200° C., the $\lambda_{max}$ was 421 nm, and the molar extinction coefficient, E was 39,200 L $mole^{-1}$ $cm^{-1}$. The structure was confirmed by NMR spectroscopy.

Table 12 shows the results for high-temperature-sintered titania; photosensitized by overnight soaking in solutions of 1 mM N3 dye and three concentrations of DPABA. Table 12 also shows that the average η is greatest for the preferred 20/1 (dye/co-sensitizer) ratio.

TABLE 12

| | | I-V CHARACTERIZATION | | | | | | | |
|---|---|---|---|---|---|---|---|---|---|
| General conditions | Conditions | Cell area $cm^2$ | $V_{oc}$ V | $I_m$ $mA/cm^2$ | $V_m$ V | $I_{sc}$ $mA/cm^2$ | FF | η % | σ |
| Adsorption | 1 mM | 0.44 | 0.62 | 6.69 | 0.44 | 8.38 | 0.56 | 2.91 | |
| Temp. | N3/EtOH, | 0.52 | 0.64 | 6.81 | 0.43 | 8.59 | 0.54 | 2.94 | |
| RT ° C. | Overnight | | | | | | | | |
| Solvent of Dye | CONTROL | 0.54 | 0.63 | 6.95 | 0.41 | 8.72 | 0.52 | 2.84 | |
| EtOH | Average | 0.50 | 0.63 | 6.82 | 0.43 | 8.56 | 0.54 | 2.90 | 0.05 |
| Dye Concen. | 1 mM N3, | 0.50 | 0.64 | 7.70 | 0.45 | 9.31 | 0.58 | 3.43 | |
| N3, DPABA | 0.05 mM | 0.53 | 0.64 | 7.40 | 0.45 | 9.30 | 0.56 | 3.31 | |
| Sintering | DPABA in | 0.50 | 0.64 | 7.70 | 0.45 | 9.38 | 0.57 | 3.44 | |
| Temp | EtOH for | | | | | | | | |
| 450° C., 30 | Overnight; | | | | | | | | |
| minutes | 20/1 | | | | | | | | |
| | Average | 0.51 | 0.64 | 7.60 | 0.45 | 9.33 | 0.57 | 3.39 | 0.07 |
| Thickness of | 1 mM N3, 1 mM | 0.53 | 0.63 | 7.21 | 0.41 | 8.58 | 0.55 | 2.96 | |
| Film | DPABA | 0.50 | 0.63 | 6.75 | 0.44 | 8.23 | 0.57 | 2.97 | |
| $TiO_2$, ~10 μm | in EtOH for | | | | | | | | |
| | Overnight; | 0.42 | 0.63 | 7.11 | 0.44 | 8.67 | 0.57 | 3.13 | |
| | 1/1 | | | | | | | | |
| | Average | 0.48 | 0.63 | 7.02 | 0.43 | 8.49 | 0.56 | 3.02 | 0.10 |
| Electrolyte | 1 mM N3, 10 mM | 0.33 | 0.58 | 4.95 | 0.42 | 6.02 | 0.60 | 2.08 | |
| | DPABA | 0.52 | 0.60 | 5.51 | 0.42 | 6.67 | 0.58 | 2.31 | |
| AM 1.5 D, l 1 | in EtOH for | | | | | | | | |
| Sun | Overnight; | 0.49 | 0.60 | 5.53 | 0.42 | 6.72 | 0.58 | 2.32 | |
| | 1/10 | | | | | | | | |
| Film pretreatment | Average | 0.45 | 0.59 | 5.33 | 0.42 | 6.47 | 0.58 | 2.24 | 0.14 |

Figure 15:
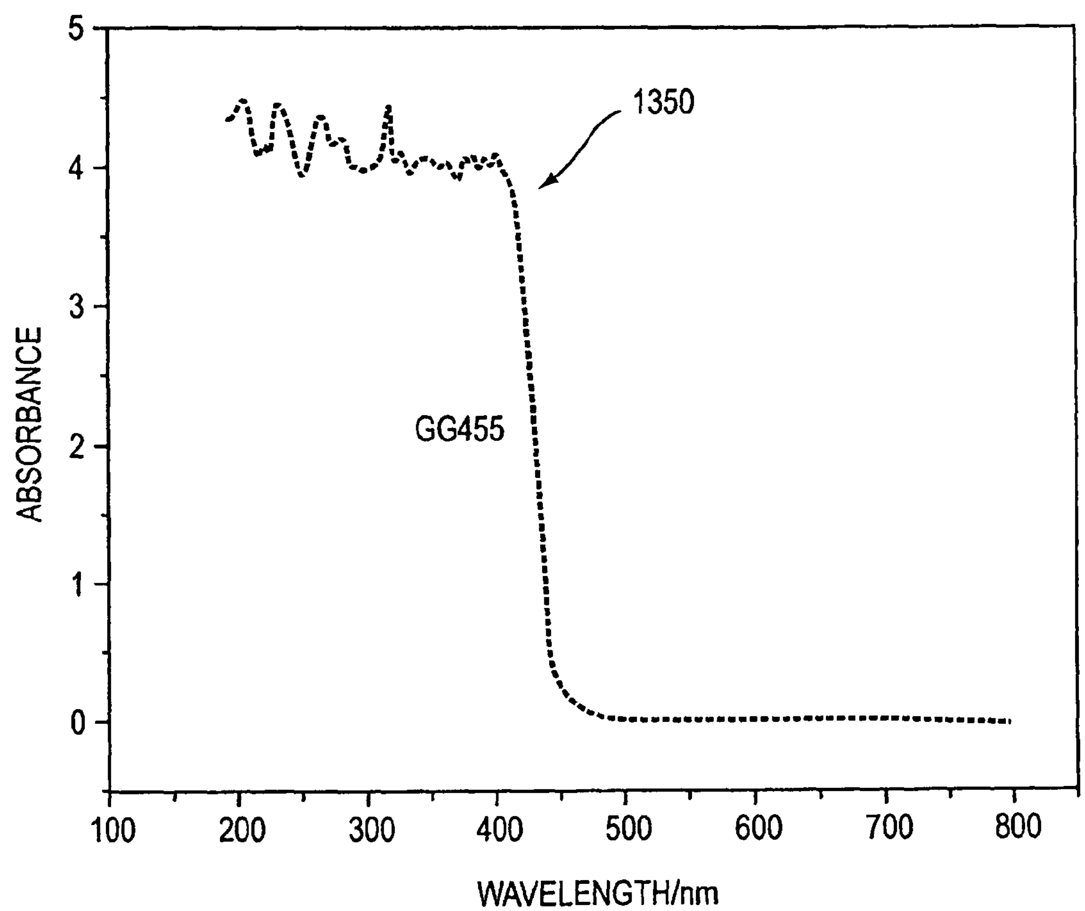
FIG. 15 shows a graph of the absorbance of the 455 nm cut-off filter (GC455) used to characterize photovoltaic cells according to the invention.
Figure 16:
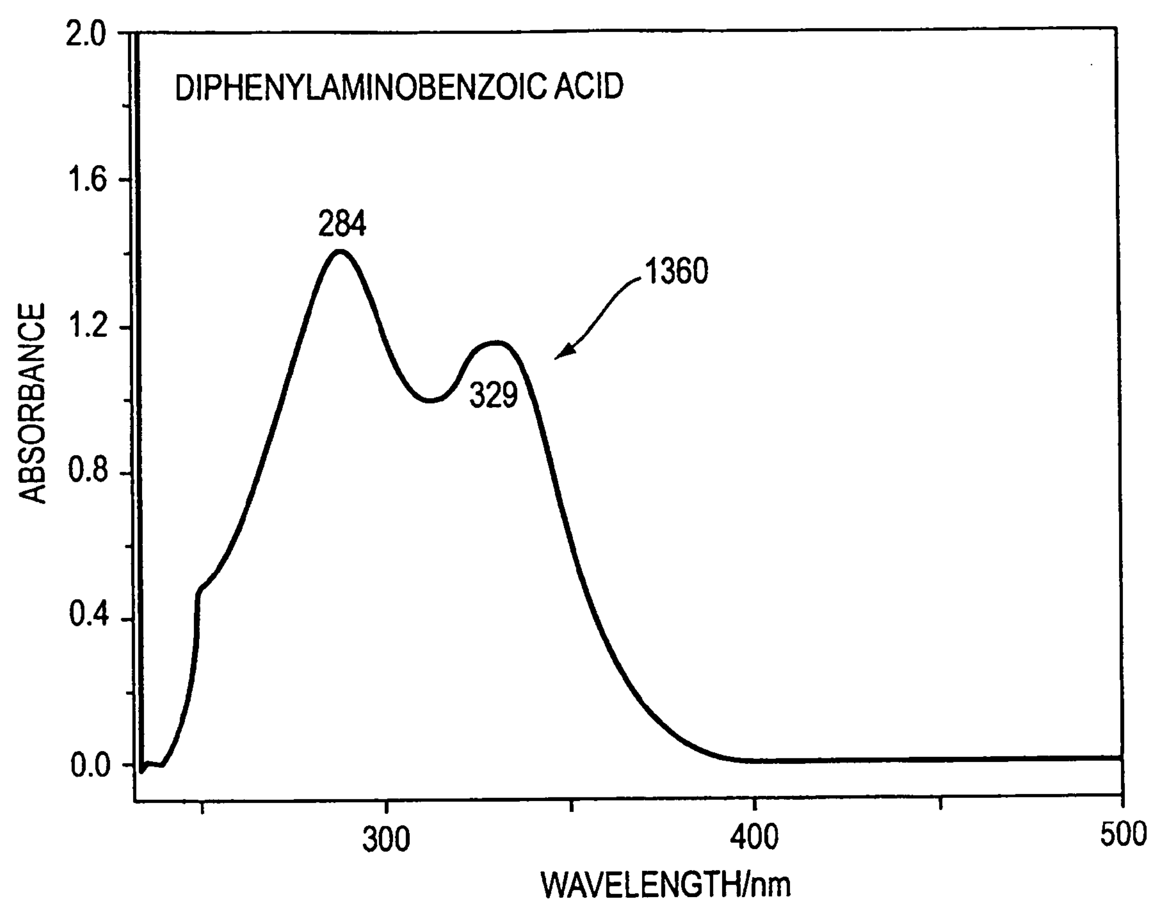
FIG. 16 shows a graph of the absorbance of diphenylaminobenzoic acid.

Table 13 shows the results of using a cut-off filter (third and fourth entries) while irradiating a cell to test its I-V characteristics. Table 13 also shows that the efficiency of the cell still improves when DPABA is present, indicating that its effect when no filter is present is not simply due to absorption of UV light by DPABA followed by charge injection. FIG. 15 shows a plot 1350 of the absorbance versus wavelength for the cut-off filter used to characterize the photovoltaic cells, according to an illustrative embodiment of the invention. FIG. 16 shows a plot 1360 of the absorbance versus wavelength for DPABA, which absorbs below 400 nm. Because the absorbance of the cut-off filter is large, little light reaches the absorption bands of DPABA.

TABLE 13

| | I-V CHARACTERIZATION | | | | | | | |
|---|---|---|---|---|---|---|---|---|
| Conditions | Cell area $cm^2$ | $V_{oc}$ V | $I_m$ $mA/cm^2$ | $V_m$ V | $I_{sc}$ $mA/cm^2$ | FF | η % | σ |
| 1 mM N3 in | 0.49 | 0.70 | 8.62 | 0.46 | 11.02 | 0.51 | 3.97 | |
| EtOH | 0.49 | 0.70 | 8.13 | 0.45 | 10.20 | 0.51 | 3.66 | |

TABLE 13-continued

| Conditions | I-V CHARACTERIZATION | | | | | | | |
|---|---|---|---|---|---|---|---|---|
| | Cell area $cm^2$ | $V_{oc}$ V | $I_m$ $mA/cm^2$ | $V_m$ V | $I_{sc}$ $mA/cm^2$ | FF | η % | σ |
| Overnight control | 0.49 | 0.73 | 7.93 | 0.51 | 9.69 | 0.57 | 4.04 | |
| Average | 0.49 | 0.71 | 8.23 | 0.47 | 10.30 | 0.53 | 3.89 | 0.20 |
| 1 mM N3 | 0.49 | 0.71 | 9.05 | 0.46 | 11.53 | 0.51 | 4.16 | |
| 0.05 mM | 0.49 | 0.71 | 9.24 | 0.46 | 11.56 | 0.52 | 4.25 | |
| DPABA in EtOH, 20/1 Overnight | 0.49 | 0.71 | 9.39 | 0.46 | 11.50 | 0.53 | 4.32 | |
| Average | 0.49 | 0.71 | 9.23 | 0.46 | 11.53 | 0.52 | 4.24 | 0.08 |
| 1 mM N3 in | 0.49 | 0.69 | 6.35 | 0.47 | 7.83 | 0.55 | 4.26 | 455 nm cut |
| EtOH | 0.49 | 0.69 | 6.05 | 0.46 | 7.44 | 0.54 | 3.98 | off filter |
| Overnight control | 0.49 | 0.72 | 5.74 | 0.52 | 6.94 | 0.60 | 4.27 | used, 70 $mW/cm^2$ |
| Average | 0.49 | 0.70 | 6.05 | 0.48 | 7.40 | 0.56 | 4.17 | 0.17 |
| 1 mM N3 | 0.49 | 0.70 | 6.73 | 0.47 | 8.21 | 0.55 | 4.52 | 455 nm cut |
| 0.05 mM | 0.49 | 0.70 | 6.74 | 0.47 | 8.19 | 0.55 | 4.53 | off filter |
| DPABA in EtOH, 20/1 Overnight | 0.49 | 0.70 | 6.74 | 0.49 | 8.25 | 0.57 | 4.72 | used, 70 $mW/cm^2$ |
| Average | 0.49 | 0.70 | 6.74 | 0.48 | 8.22 | 0.56 | 4.59 | 0.11 |

Table 14 shows that the addition of triphenylamine itself (i.e., no titania complexing groups such as carboxy) does not significantly enhance efficiency under the stated conditions.

TABLE 14

| Conditions | I-V CHARACTERIZATION | | | | | | | |
|---|---|---|---|---|---|---|---|---|
| | Cell area $cm^2$ | $V_{oc}$ V | $I_m$ $mA/cm^2$ | $V_m$ V | $I_{sc}$ mA/ $cm^2$ | FF | η % | σ |
| 0.5 mM N3 | 0.49 | 0.70 | 7.96 | 0.45 | 9.82 | 0.52 | 3.58 | |
| in EtOH, | 0.49 | 0.71 | 8.09 | 0.48 | 9.58 | 0.57 | 3.88 | |
| Overnight | 0.49 | 0.70 | 7.47 | 0.48 | 8.83 | 0.58 | 3.59 | |
| Average | 0.49 | 0.70 | 7.84 | 0.47 | 9.41 | 0.56 | 3.68 | 0.17 |
| 0.5 mM N3, | 0.49 | 0.69 | 7.44 | 0.45 | 9.21 | 0.53 | 3.35 | |
| 0.025 mM | 0.49 | 0.69 | 7.61 | 0.47 | 9.75 | 0.53 | 3.58 | |
| TPA in EtOH Overnight 20/1 | 0.49 | 0.69 | 6.98 | 0.45 | 8.56 | 0.53 | 3.14 | |
| Average | 0.49 | 0.69 | 7.34 | 0.46 | 9.17 | 0.53 | 3.36 | 0.22 |
| 0.5 mM N3, | 0.49 | 0.68 | 4.62 | 0.44 | 5.66 | 0.53 | 2.03 | |
| 2.0 mM | 0.49 | 0.66 | 4.18 | 0.45 | 5.38 | 0.53 | 1.88 | |
| TPA in EtOH Overnight ¼ | 0.49 | 0.66 | 4.51 | 0.45 | 5.82 | 0.53 | 2.03 | |
| Average | 0.49 | 0.67 | 4.44 | 0.45 | 5.62 | 0.53 | 1.98 | 0.09 |

Table 15 shows that the effect is present using low temperature interconnected titania and that the 20/1 (dye/co-sensitizer) ratio is preferred.

TABLE 15

| Conditions | I-V CHARACTERIZATION | | | | | | | |
|---|---|---|---|---|---|---|---|---|
| | Cell area $cm^2$ | $V_{oc}$ V | $I_m$ mA/ $cm^2$ | $V_m$ V | $I_{sc}$ $mA/cm^2$ | FF | η % | σ |
| 0.5 mM | 0.49 | 0.73 | 8.32 | 0.50 | 10.56 | 0.54 | 4.16 | |
| N3/EtOH, | 0.51 | 0.72 | 8.13 | 0.49 | 10.30 | 0.54 | 3.98 | |
| overnight, control | 0.50 | 0.72 | 8.56 | 0.47 | 10.65 | 0.52 | 4.02 | |
| Average | 0.50 | 0.72 | 8.34 | 0.49 | 10.50 | 0.53 | 4.06 | 0.09 |
| 0.5 mM N3, | 0.49 | 0.73 | 8.55 | 0.51 | 10.48 | 0.57 | 4.36 | |

TABLE 15-continued

| Conditions | I-V CHARACTERIZATION | | | | | | | |
|---|---|---|---|---|---|---|---|---|
| | Cell area $cm^2$ | $V_{oc}$ V | $I_m$ mA/ $cm^2$ | $V_m$ V | $I_{sc}$ $mA/cm^2$ | FF | η % | σ |
| 0.0125 mM | 0.53 | 0.72 | 8.53 | 0.50 | 11.00 | 0.54 | 4.27 | |
| DPABA in EtOH, 40/1, overnight | 0.49 | 0.74 | 8.08 | 0.54 | 10.96 | 0.54 | 4.36 | |
| Average | 0.50 | 0.73 | 8.39 | 0.52 | 10.81 | 0.55 | 4.33 | 0.06 |
| 0.5 mM N3, | 0.49 | 0.73 | 9.07 | 0.49 | 11.31 | 0.54 | 4.44 | |
| 0.017 mM | 0.49 | 0.75 | 8.64 | 0.52 | 10.97 | 0.55 | 4.49 | |
| DPABA in EtOH, 30/1, overnight | 0.52 | 0.73 | 8.19 | 0.52 | 10.88 | 0.54 | 4.26 | |
| Average | 0.50 | 0.74 | 8.63 | 0.51 | 11.05 | 0.54 | 4.40 | 0.12 |
| 0.5 mM N3, | 0.50 | 0.75 | 8.57 | 0.52 | 11.56 | 0.51 | 4.46 | |
| 0.025 mM | 0.49 | 0.74 | 8.88 | 0.52 | 11.45 | 0.54 | 4.62 | |
| DPABA in EtOH, 20/1, overnight | 0.53 | 0.74 | 9.01 | 0.51 | 12.08 | 0.51 | 4.60 | |
| Average | 0.51 | 0.74 | 8.82 | 0.52 | 11.70 | 0.52 | 4.56 | 0.09 |
| 0.5 mM N3, | 0.49 | 0.72 | 8.85 | 0.48 | 10.78 | 0.55 | 4.25 | |
| 0.5 mM | 0.51 | 0.74 | 8.62 | 0.47 | 10.37 | 0.53 | 4.05 | |
| DPABA in EtOH, 1/1, overnight | 0.50 | 0.75 | 8.38 | 0.49 | 10.02 | 0.55 | 4.11 | |
| Average | 0.50 | 0.74 | 8.62 | 0.48 | 10.39 | 0.54 | 4.14 | 0.10 |
| 0.5 mM N3, | 0.49 | 0.68 | 7.56 | 0.44 | 9.09 | 0.54 | 3.33 | |
| 5 mM | 0.51 | 0.69 | 7.62 | 0.46 | 9.34 | 0.54 | 3.51 | |
| DPABA in EtOH, 1/10, overnight | 0.49 | 0.67 | 7.25 | 0.45 | 8.84 | 0.55 | 3.26 | |
| Average | 0.50 | 0.68 | 7.48 | 0.45 | 9.09 | 0.54 | 3.36 | 0.13 |

Table 16 shows results for high-temperature-sintered titania sensitized with a high concentration of N3 dye while maintaining a 20/1 ratio of dye to co-sensitizer. Entries 1 and 2 show the increase in cell performance due to co-sensitizer. Entry 3 shows the effect of DPABA alone as a sensitizer, demonstrating that this material acts as a sensitizer by itself when irradiated with the full solar spectrum, which includes low-intensity UV radiation.

TABLE 16

| | I-V CHARACTERIZATION | | | | | | | | |
|---|---|---|---|---|---|---|---|---|---|
| General Conditions | Conditions | Cell area cm$^2$ | $V_{oc}$ V | $I_m$ mA/cm$^2$ | $V_m$ V | $I_{sc}$ mA/cm$^2$ | FF | η % | σ |
| Adsorption | 8 mM | 0.49 | 0.68 | 8.51 | 0.44 | 10.07 | 0.55 | 3.74 | |
| Temp. | N3/aprotic | 0.49 | 0.67 | 8.28 | 0.44 | 9.75 | 0.56 | 3.64 | |
| RT ° C. | polar solvent, | | | | | | | | |
| Solvent of Dye | 1 hour | 0.49 | 0.68 | 9.16 | 0.42 | 10.80 | 0.52 | 3.85 | |
| Aprotic polar | CONTROL | | | | | | | | |
| solvent | average | 0.49 | 0.68 | 8.65 | 0.43 | 10.21 | 0.54 | 3.74 | 0.10 |
| | 8 mM N3, 0.4 mM | 0.49 | 0.68 | 9.52 | 0.44 | 11.18 | 0.55 | 4.19 | |
| | DPABA | 0.49 | 0.68 | 9.96 | 0.44 | 11.59 | 0.56 | 4.38 | |
| | in aprotic polar | 0.49 | 0.65 | 9.81 | 0.42 | 12.13 | 0.52 | 4.12 | |
| | solvent, | | | | | | | | |
| | 20/1 | | | | | | | | |
| | 1 hour | | | | | | | | |
| | average | 0.49 | 0.67 | 9.76 | 0.43 | 11.63 | 0.54 | 4.23 | 0.14 |
| | 5 mM DPABA | 0.49 | 0.55 | 1.02 | 0.42 | 1.22 | 0.64 | 0.43 | |
| | in aprotic polar | 0.49 | 0.55 | 0.94 | 0.41 | 1.13 | 0.62 | 0.39 | |
| | solvent | 0.49 | 0.58 | 0.89 | 0.44 | 1.07 | 0.63 | 0.39 | |
| | Overnight | | | | | | | | |
| | | 0.49 | 0.56 | 0.95 | 0.42 | 1.14 | 0.63 | 0.40 | 0.02 |

Table 17 shows results for low-temperature-interconnected titania. Entry 5 shows the affect of DPACA alone as a sensitizer, demonstrating that this material acts as a sensitizer by itself when irradiated with the full solar spectrum, which includes low-intensity UV radiation.

TABLE 17

| I-V CHARACTERIZATION | | | | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | η % | σ |
| 0.5 mM | 0.51 | 0.73 | 8.40 | 0.50 | 10.84 | 0.53 | 4.20 | |
| N3/EtOH, | 0.53 | 0.72 | 8.13 | 0.49 | 10.30 | 0.54 | 3.98 | |
| overnight, | 0.50 | 0.72 | 8.77 | 0.47 | 10.87 | 0.53 | 4.12 | |
| control | | | | | | | | |
| average | 0.51 | 0.72 | 8.43 | 0.49 | 10.67 | 0.53 | 4.10 | 0.11 |
| 0.5 mM N3, | 0.49 | 0.73 | 8.10 | 0.51 | 10.39 | 0.54 | 4.13 | |
| 0.01 mM | 0.50 | 0.74 | 7.95 | 0.50 | 10.01 | 0.54 | 3.98 | |
| DPACA in | 0.49 | 0.72 | 8.10 | 0.50 | 9.85 | 0.57 | 4.05 | |
| EtOH, 50/1, | | | | | | | | |
| overnight | | | | | | | | |
| average | 0.49 | 0.73 | 8.05 | 0.50 | 10.08 | 0.55 | 4.05 | 0.08 |
| 0.5 mM N3, | 0.49 | 0.74 | 8.38 | 0.50 | 10.48 | 0.54 | 4.19 | |
| 0.02 mM | 0.52 | 0.73 | 8.18 | 0.48 | 9.74 | 0.55 | 3.93 | |
| DPACA in | 0.49 | 0.76 | 8.08 | 0.54 | 9.45 | 0.61 | 4.36 | |
| EtOH, 25/1, | | | | | | | | |
| overnight | | | | | | | | |
| average | 0.50 | 0.74 | 8.21 | 0.51 | 9.89 | 0.57 | 4.16 | 0.22 |
| 0.5 mM N3, | 0.49 | 0.73 | 9.07 | 0.46 | 11.31 | 0.51 | 4.17 | |

TABLE 17-continued

| I-V CHARACTERIZATION | | | | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | η % | σ |
| 0.5 mM | 0.49 | 0.75 | 7.41 | 0.53 | 9.24 | 0.57 | 3.93 | |
| DPACA in | 0.52 | 0.76 | 7.93 | 0.52 | 9.12 | 0.59 | 4.12 | |
| EtOH, 1/1, | | | | | | | | |
| overnight | | | | | | | | |
| average | 0.50 | 0.75 | 8.14 | 0.50 | 9.89 | 0.56 | 4.07 | 0.13 |
| 0.5 mM N3, | 0.56 | 0.73 | 6.36 | 0.49 | 7.59 | 0.56 | 3.12 | |
| 5.0 mM | 0.52 | 0.73 | 6.63 | 0.49 | 7.84 | 0.57 | 3.25 | |
| DPACA in | 0.50 | 0.72 | 6.53 | 0.49 | 7.59 | 0.59 | 3.20 | |
| EtOH, 1/10, | | | | | | | | |
| overnight | | | | | | | | |
| average | 0.53 | 0.73 | 6.51 | 0.49 | 7.67 | 0.57 | 3.19 | 0.07 |
| 5.0 mM | 0.43 | 0.65 | 3.12 | 0.49 | 3.77 | 0.62 | 1.53 | |
| DPACA in | 0.45 | 0.65 | 2.93 | 0.49 | 3.51 | 0.63 | 1.44 | |
| EtOH, | 0.49 | 0.66 | 2.83 | 0.49 | 3.40 | 0.62 | 1.39 | |
| overnight | | | | | | | | |
| average | 0.46 | 0.65 | 2.96 | 0.49 | 3.56 | 0.62 | 1.45 | 0.07 |

Table 18 shows results for low-temperature-interconnected titania. Entry 6 shows the affect of DEAPA alone as a sensitizer, demonstrating that this material acts as a sensitizer by itself when irradiated with the full solar spectrum, which includes low-intensity UV radiation.

TABLE 18

| | I–V CHARACTERIZATION | | | | | | | | |
|---|---|---|---|---|---|---|---|---|---|
| General conditions | Conditions | Cell area cm$^2$ | $V_{oc}$ V | $I_m$ mA/cm$^2$ | $V_m$ V | $I_{sc}$ mA/cm$^2$ | FF | η % | σ |
| Adsorption | 0.5 mM | 0.51 | 0.72 | 8.67 | 049 | 10.60 | 0.56 | 4.25 | |
| Temp. | N3/EtOH, | 0.49 | 0.75 | 8.15 | 0.47 | 10.50 | 0.49 | 3.83 | |
| RT° C. | overnight, | | | | | | | | |
| Solvent of | control | 0.49 | 0.74 | 8.74 | 0.44 | 10.63 | 0.49 | 3.85 | |
| Dye | average | 0.50 | 0.74 | 8.52 | 0.47 | 10.58 | 0.51 | 3.97 | 0.24 |
| EtOH | | | | | | | | | |
| Dye Concen. | 0.5 mM N3, | 0.49 | 0.70 | 8.68 | 0.44 | 11.00 | 0.50 | 3.82 | |

TABLE 18-continued

| General conditions | Conditions | Cell area $cm^2$ | $V_{oc}$ V | $I_m$ $mA/cm^2$ | $V_m$ V | $I_{sc}$ $mA/cm^2$ | FF | η % | σ |
|---|---|---|---|---|---|---|---|---|---|
| | I–V CHARACTERIZATION | | | | | | | | |
| N3, DEAPA | 0.01 mM | 0.52 | 0.71 | 8.57 | 0.45 | 11.11 | 0.49 | 3.86 | |
| Sintering | DEAPA in | 0.50 | 0.72 | 8.40 | 0.45 | 10.61 | 0.49 | 3.78 | |
| Temp | EtOH, 50/1, | | | | | | | | |
| 120° C., 10 | overnight | | | | | | | | |
| minutes | average | 0.50 | 0.71 | 8.55 | 0.45 | 10.91 | 0.49 | 3.82 | 0.04 |
| Thickness of | 0.5 mM N3, | 0.51 | 0.74 | 8.90 | 0.44 | 10.92 | 0.48 | 3.92 | |
| Film | 0.02 mM | 0.53 | 0.73 | 8.76 | 0.44 | 10.51 | 0.50 | 3.85 | |
| $TiO_2$, ~7 μm | DEAPA in | | | | | | | | |
| Liquid | EtOH, 25/1, | 0.49 | 0.73 | 8.40 | 0.45 | 10.21 | 0.51 | 3.78 | |
| | overnight | | | | | | | | |
| | average | 0.51 | 0.73 | 8.69 | 0.44 | 10.55 | 0.50 | 3.85 | 0.07 |
| | 0.5 mM N3, | 0.49 | 0.71 | 8.94 | 0.43 | 10.78 | 0.50 | 3.84 | |
| Electrolyte | 0.5 mM | 0.51 | 0.71 | 8.83 | 0.44 | 10.37 | 0.53 | 3.89 | |
| AM 1.5D, 1 | DEAPA in | 0.50 | 0.70 | 8.18 | 0.42 | 9.71 | 0.51 | 3.44 | |
| Sun | EtOH, 1/1, | | | | | | | | |
| | overnight | | | | | | | | |
| Film | average | 0.50 | 0.71 | 8.65 | 0.43 | 10.29 | 0.51 | 3.72 | 0.25 |
| pretreatment | 0.5 mM N3, | 0.52 | 0.60 | 0.88 | 0.45 | 1.08 | 0.61 | 0.40 | |
| | 5.0 mM | 0.49 | 0.59 | 0.71 | 0.44 | 0.85 | 0.62 | 0.31 | |
| | DEAPA in | 0.49 | 0.59 | 0.75 | 0.44 | 0.91 | 0.61 | 0.33 | |
| | EtOH, 1/10, | | | | | | | | |
| | overnight | | | | | | | | |
| | average | 0.50 | 0.59 | 0.78 | 0.44 | 0.95 | 0.62 | 0.35 | 0.04 |
| | 5.0 mM | 0.49 | 0.54 | 0.41 | 0.42 | 0.49 | 0.65 | 0.17 | |
| | DEAPA in | 0.49 | 0.54 | 0.35 | 0.39 | 0.46 | 0.55 | 0.14 | |
| | CHCl3, | 0.51 | 0.52 | 0.45 | 0.40 | 0.52 | 0.67 | 0.18 | |
| | overnight | | | | | | | | |
| | average | 0.50 | 0.53 | 0.40 | 0.40 | 0.49 | 0.62 | 0.16 | 0.02 |

D. Semiconductor Oxide Formulations

In a further illustrative embodiment, the invention provides semiconductor oxide formulations for use with DSSCs formed using a low temperature semiconductor oxide nanoparticle interconnection, as described above. The semiconductor oxide formulations may be coated at room temperature and, upon drying at temperatures between about 50° C. and about 150° C., yield mechanically stable semiconductor nanoparticle films with good adhesion to the transparent conducting oxide (TCO) coated plastic substrates. In one embodiment, the nanoparticle semiconductor of the photosensitized interconnected nanoparticle material 603 is formed from a dispersion of commercially available $TiO_2$ nanoparticles in water, a polymer binder, with or without acetic acid. The polymer binders used include, but are not limited to, polyvinylpyrrolidone (PVP), polyethylene oxide (PEO), hydroxyethyl cellulose (HOEC), hydroxypropyl cellulose, polyvinyl alcohol (PVA) and other water-soluble polymers. The ratio of semiconductor oxide particles, e.g., $TiO_2$, to polymer can be between about 100:0.1 to 100:20 by weight, and preferably is between about 100:1 to 100:10 by weight. The presence of acetic acid in the formulation helps to improve the adhesion of the coating to the TCO coated substrate. However, acetic acid is not essential to this aspect of the invention and semiconductor oxide dispersions without acetic acid perform satisfactorily. In another embodiment, the $TiO_2$ nanoparticles are dispersed in an organic solvent, such as, e.g., isopropyl alcohol, with polymeric binders such as, e.g., PVP, butvar, ethylcellulose, etc.

In another illustrative embodiment, the mechanical integrity of the semiconductor oxide coatings and the photovoltaic performance of the dye sensitized cells based on these coatings can be further improved by using a crosslinking agent to interconnect the semiconductor nanoparticles. The polylinkers described above may be used for this purpose. These crosslinking agents can be applied, e.g., in the titania coating formulation directly or in a step subsequent to drying the titania coating as a solution in an organic solvent such as ethanol, isopropanol or butanol. For example, subsequent heating of the films to temperatures in the range of about 70° C. to about 140° C. leads to the formation of $TiO_2$ bridges between the $TiO_2$ nanoparticles. Preferably, the concentration of the polylinker in this example ranges from about 0.01 to about 20 weight % based on titania.

E. Semiconductor Primer Layer Coatings

Figure 17:
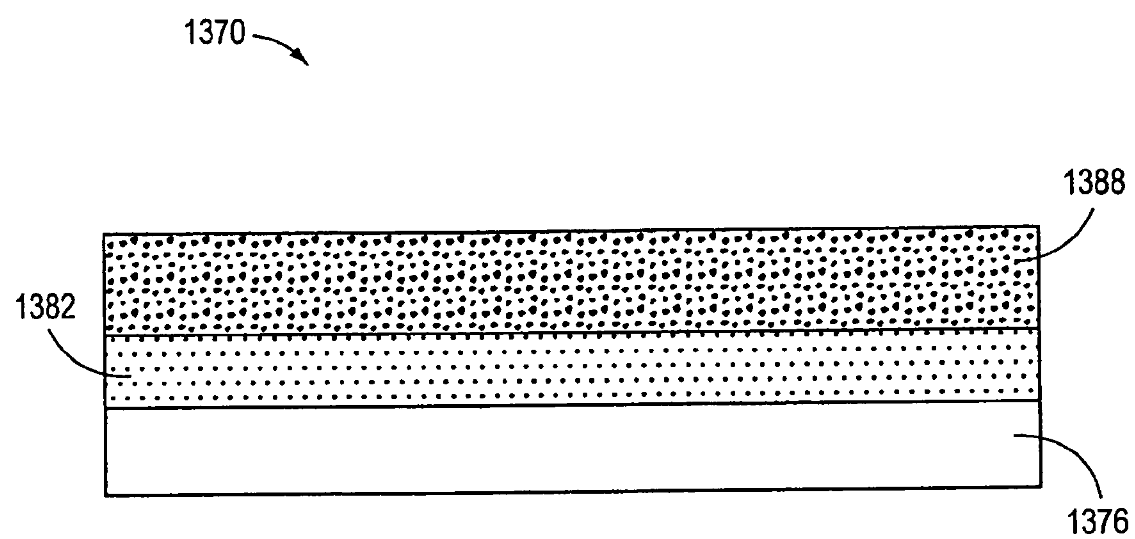
FIG. 17 depicts an illustrative embodiment of the coating of a semiconductor primer layer coating, according to the invention.

In another illustrative embodiment, the invention provides semiconductor oxide materials and methods of coating semiconductor oxide nanoparticle layers on a base material to form DSSCs. FIG. 17 depicts an illustrative embodiment 1370 of the coating process, according to the invention. In this illustrative embodiment, a base material 1376 is coated with a first primer layer 1382 of a semiconductor oxide, and then a suspension of nanoparticles 1388 of the semiconductor oxide is coated over the primer layer 1382. The primer layer 1382 may include a vacuum-coated semiconductor oxide film (e.g., a $TiO_2$ film). Alternatively, the primer layer 1382 may include a thin coating with fine particles of a semiconductor oxide (e.g. $TiO_2$, $SnO_2$). The primer layer 1382 may also include a thin layer of a polylinker or precursor solution, one example of which is the Ti (IV) butoxide polymer 400 shown in FIG. 4 above. According to one illustrative embodiment of the invention, the base material 1376 is the first flexible, significantly light transmitting substrate 609 referred to in FIG. 6. Additionally, the base material 1376 is a transparent, conducting, plastic substrate. According to this illustrative embodiment, the suspension of nanoparticles 1388 is the photosensitized interconnected nanoparticle material 603 of FIG. 6. Numerous semiconducting metal oxides, including $SnO_2$, $TiO_2$, $Ta_2O_5$, $Nb_2O_5$, and ZnO, among others, in the form of thin films, fine particles, or precursor solutions may be used as primer layer coatings using vacuum coating, spin coating, blade coating or other coating methods.

The primer layer 1382 improves the adhesion of nanostructured semiconductor oxide films, like layer 1388, to the base material 1376. Enhancements in the performance of DSSCs with such primer layers have been observed and will be described below. The enhancement arises from an increase in the adhesion between the semiconductor oxide nanoparticles (or photoelectrodes) and the transparent conducting oxide coated plastic substrates, as well as from higher shunt resistance.

Examples of various illustrative embodiments of this aspect of the invention, in the context of a DSSC including a titanium dioxide nanoparticle layer, are as follows.

Example 18

Vacuum Coated $TiO_2$ as Prime Layers for Nanoparticle $TiO_2$ Photoelectrodes

In this illustrative example, thin $TiO_2$ films with thicknesses ranging from 2.5 nm to 100 nm were sputter-coated under vacuum on an ITO layer coated on a polyester (here, PET) substrate. A water based $TiO_2$ (P25, with an average particle size of 21 nm) slurry was spin-coated on both the ITO/PET with sputter-coated thin $TiO_2$ and on the plain ITO/PET (i.e., the portion without sputter-coated thin $TiO_2$). The coated films were soaked in poly $[Ti(OBu)_4]$ solution in butanol and then heat treated at 120° C. for 2 minutes. The low-temperature reactively interconnected films were placed into an aprotic, polar solvent-based N3 dye solution (8 mM) for 2 minutes. Photovoltaic cells were made with platinum (Pt) counter-electrodes, an $I^-/I_1^-$ liquid electrolyte, 2 mil SURLYN, and copper conducting tapes. I-V characterization measurements were performed with a solar simulator.

Adhesion of nanostructured $TiO_2$ films from the P25 slurry coated on the ITO/PET with sputter-coated, thin $TiO_2$ was superior to films on the plain ITO/PET. Better photovoltaic performance was also observed from the PV cells prepared on the ITO/PET with sputter-coated, thin $TiO_2$ as compared to those on the plain ITO/PET. Improvement on the fill-factor was achieved as well. A FF as high as 0.67 was measured for the photovoltaic cells made on the ITO/PETs with sputter-coated, thin $TiO_2$. For the photovoltaic cells made on the plain ITO/PET, the FF observed was not greater than 0.60. Higher photovoltaic conversion efficiencies (about 17% higher than the photoelectrodes made from the plain ITO/PET) were measured for the photoelectrodes prepared on the ITO/PET with thin sputter-coated $TiO_2$. Improvement in shunt resistance was also observed for the photovoltaic cells made on the ITO/PET with thin sputter-coated $TiO_2$.

Example 19

Fine Particles of TiO2 as Primer Layer for $TiO_2$ Suspensions

In this illustrative example, fine particles of $TiO_2$, small enough such that they would stick in the valleys between spikes of ITO on the PET substrate, were prepared by hydrolyzing titanium (IV) isopropoxide. The fine particles were then spin coated at 800 rpm onto the ITO layer. A 37% $TiO_2$ (P25) suspension of approximately 21 nm average particle size was then spin coated at 800 rpm onto the fine particle layer. The coated $TiO_2$ was low temperature interconnected by dipping in 0.01 molar Ti (IV) butoxide polymer in butanol for 15 minutes followed drying on a slide warmer at 50° C. before heating at 120° C. for 2 minutes. The interconnected coating was dyed with N3 dye by dipping into an 8 mM aprotic polar solvent solution for 2 minutes, then rinsed with ethanol and dried on a slide warmer at 50° C. for 2 minutes. Control coatings were prepared in the same way, except without the fine particle prime coat. The cells' performance characteristics were measured using a solar simulator. Results for test and control are listed below in Table 19. Fine particles of tin oxide as primer coating for $TiO_2$ suspensions yielded similar improvements.

TABLE 19

| | $V_{oc}$ | $I_{sc}$ | η | FF |
|---|---|---|---|---|
| Control | 0.64 | 4.86 | 1.67% | 0.54 |
| Invention | 0.66 | 6.27 | 2.36% | 0.57 |

Example 20

Titanium (IV) Butoxide Polymer in Butanol (Precursor Solution) as Primer Layer for $TiO_2$ In another test, titanium (IV) butoxide polymer in butanol at 0.01 molar was spin coated on an ITO/PET plastic base at 800 rpm. A 43% $TiO_2$ (P25) suspension of approximately 21 nm average particle size was spin coated at 800 rpm. The coated $TiO_2$ was interconnected at low temperature by dipping in 0.01 M titanium (IV) butoxide polymer in butanol for 15 minutes and then drying on a slide warmer at 50° C. before heating at 120° C. for 2 minutes. The sintered coating was dyed with N3 dye by dipping into an 8 mM aprotic, polar solvent solution for 2 minutes, then rinsed with ethanol and dried on a slide warmer at 50° C. for 2 minutes. Control coatings were prepared in the same way only without the primer layer coating. The I-V properties of the cells were measured with a solar simulator. Results for test and control are listed below in Table 20.

TABLE 20

| | $V_{oc}$ | $I_{sc}$ | η | FF |
|---|---|---|---|---|
| Control | 0.66 | 7.17 | 2.62% | 0.56 |
| Invention | 0.70 | 8.11 | 3.38% | 0.59 |

F. Photovoltaic Cell Interconnection

Figure 18A:
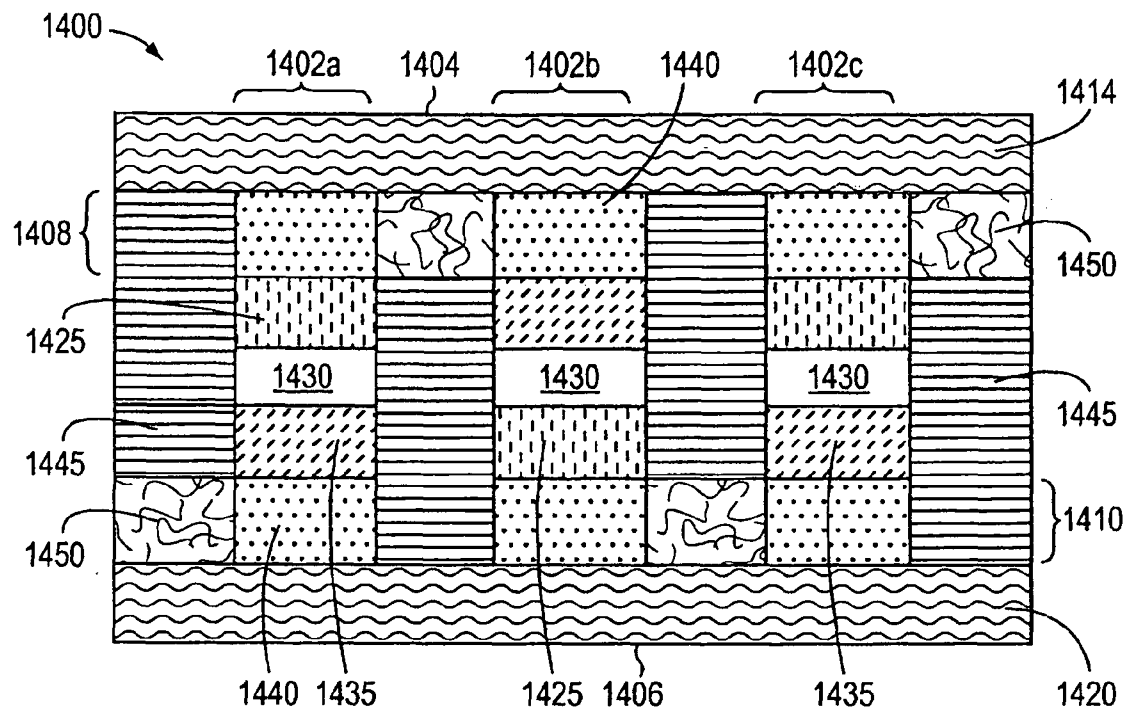
FIGS. 18A and 18B show side elevation views of interconnected photovoltaic modules in unflexed and flexed states, respectively, according to an illustrative embodiment of the invention.
Figure 18B:
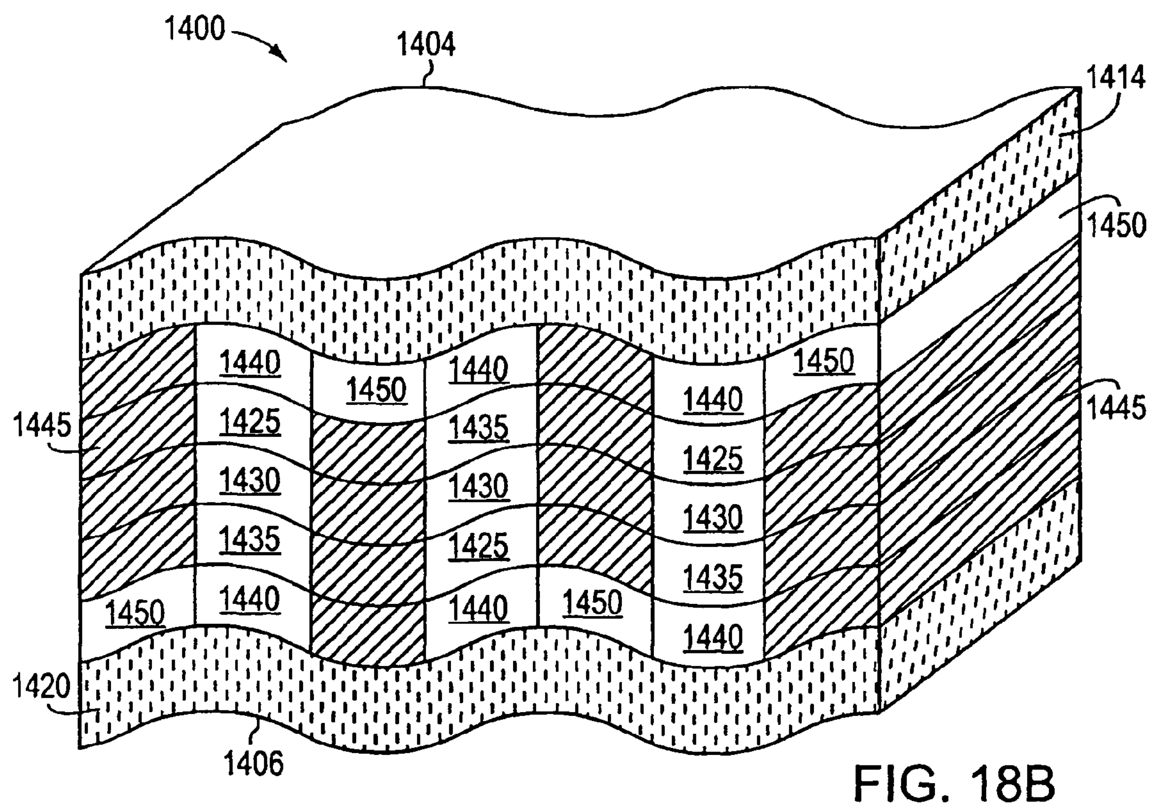

FIG. 18A depicts an illustrative embodiment of an interconnected photovoltaic module 1400 that includes a plurality of photovoltaic cells 1402*a*, 1402*b*, and 1402*c* (collectively "1402"). Three photovoltaic cells 1402 are shown for illustrative purposes only; the photovoltaic module 1400 is not restricted to that number. FIG. 18B shows the photovoltaic module 1400 in a flexed state. The photovoltaic module 1400 is suited for display arrangements where illumination may be incident on either the top 1404 or bottom 1406 surfaces. Referring to FIGS. 18A and 18B, the plurality of photovoltaic cells 1402 are disposed between a first electrical connection layer 1408 and a second electrical connection layer 1410. Preferably, the photovoltaic cells and electrical connection layers 1408 and 1410 are in turn disposed between a first substrate 1414 and a second substrate 1420. The photovoltaic cells 1402 include a photosensitized nanomatrix layer 1425 and a charge carrier medium 1430. Preferably, the photovoltaic cells also include a catalytic medium 1435. The electrical connection layers 1408 and 1410 include conductive regions 1440 and/or insulative regions 1445. In one illustrative embodiment, the electrical connection layers 1408 and 1410 also include linking conductive regions 1450. It is preferable in practice to minimize the width of the insulative regions 1445 and/or linking conductor regions 1450 relative to the conductive regions 1440.

The conductive 1440 and insulative 1445 regions of the electrical connection layers 1408 and 1410 may include transparent materials, such as, for example, ITO, a fluorine-doped tin oxide, tin oxide, zinc oxide, and the like. In one illustrative embodiment, the conductive regions 1440 of the electrical connection layers 1408 and 1410 range in thickness between about 100 nm and about 400 nm. In another embodiment, the conductive regions 1440 are between about 150 nm and about 300 nm thick. According to an additional feature of the illustrative embodiment, a wire or lead line is connected to one or more conductive regions 1440 to electrically connect the photovoltaic module 1400 to an external load.

Preferably, the photovoltaic module 1400 is significantly light-transmitting. This is accomplished in some embodiments by forming all of the constituent layers and regions of the photovoltaic module 1400 from significantly light-transmitting materials. In other illustrative embodiments, the photovoltaic module 1400 is formed to be significantly light-transmitting even though some of the individual regions of the photovoltaic module's 1400 constituent layers are not significantly light-transmitting. Furthermore, the conductive regions 1440 of at least one of the electrical connection layers 1408 and 1410 may be significantly light-transmitting.

The electrical connection layers 1408 and 1410 may include a linking conductor region 1450 deposited between two or more of the conductive regions 1440. Preferably, the linking conductor region 1450 includes a conductive material, such as, for example, copper, silver, gold, platinum, nickel, palladium, iron, and alloys thereof. Other suitable conductive materials include, but are not limited to, ITO and conductive polymers such as polyaniline and aniline. In one illustrative embodiment, one or more of the linking conductor regions 1450 are substantially transparent. Alternatively, one or more of the linking conductive regions 1450 are opaque.

According to one feature, the photosensitized nanomatrix layer 1425 includes photosensitized nanoparticles, e.g., metal oxide nanoparticles, as discussed above. In one embodiment, the photosensitized nanomatrix layer 1425 includes nanoparticles with an average size of between about 2 and about 400 nm. More particularly, the nanoparticles have an average size of between about 10 nm and about 40 nm. In a preferred embodiment, the nanoparticles are titanium dioxide particles having an average particle size of about 20 nm.

In another illustrative embodiment, the photosensitized nanomatrix layer 1425 includes a heterojunction composite material. Examples of suitable heterojunction composite materials are fullerenes (e.g., $C_{60}$), fullerene particles, and carbon nanotubes. The heterojunction composite material may be dispersed in polythiophene or some other hole transport material. The fullerene particles may have an average size of between about 100 nm and about 400 nm. Other examples of suitable heterojunction composite materials are composites that include conjugated polymers, such as polythiophene and polyquinoline, and composites of conjugated polymers, such as polyphenylene vinylene, in conjunction with non-polymeric materials.

The charge carrier medium 1430 is preferably a polymeric and relatively viscous, e.g., jelly-like, material. In other embodiments, the charge carrier medium 1430 is a liquid. As a result, the charge carrier medium 1430 can be applied using various techniques suitable for applying gels and liquids known to those skilled in the art. These techniques include, for example, spray coating, roller coating, knife coating, and blade coating. The charge carrier medium 1430 may be prepared by forming a solution having an ion-conducting polymer, a plasticizer, and a mixture of iodides and iodine. The polymer provides mechanical and/or dimensional stability; the plasticizer helps the gel/liquid phase transaction temperature, and the iodides and iodine act as redox electrolytes.

In one illustrative embodiment, the charge carrier medium 1430 includes about 10% of polyethylene oxide, about 90% of 1:1 by weight mixture of ethyl carbonate:propylene carbonate, about 0.05 M iodine, and about 0.5 M lithium tetramethylammonium iodide. This polymeric electrolyte typically has a relatively long shelf life (e.g., up to a few years), experiences minimal phase segregation during processing or while the photovoltaic module is in use, and may be used without processing, such as melting, prior to deposition.

G. Rigid Substrates

According to another illustrative embodiment, the invention provides photovoltaic cells or modules with substantially rigid substrates or a combination of a substantially rigid substrate and a flexible substrate. For example, the low-temperature (<about 300° C.) sintering technique discussed above using polylinkers may be used to construct DSSCs utilizing substantially rigid substrates such as tempered glass plates. Alternatively, flexible photovoltaic cells, also made using the-low temperature sintering technique, may be disposed upon or incorporated between one or more substantially rigid substrates. That is, flexible and substantially rigid substrates can be combined with the other DSSC constituent elements described above to form a flexible or substantially rigid DSSC. One suitable substantially rigid substrate is the tempered glass product SOLARTEX (available from Ajiya Safety Glass, Johor, Malaysia). Generally, substantially rigid substrates are materials which possess physical durability characteristics similar to SOLARTEX. Materials that only lose their durability and other structurally desirable characteristics when exposed to temperatures outside the range of the low-temperature sintering processes described above are also suitable for use as substantially rigid substrates.

Tempered glass is significantly more resistant to thermal and mechanical stresses and strains than untempered glass. The application of dye-sensitized titania photovoltaic cells to glass plates requires sintering temperatures in excess of 400° C. using conventional methods. If the glass substrate includes tempered glass, the high temperatures required for sintering remove the temper from the glass plate and convert it to ordinary glass. This results in a substrate which can be shattered much more easily upon application of either a thermal or a mechanical stress. Given the breath of photovoltaic applications, substrate strength and structural integrity can be an important feature of a photovoltaic cell or module. Specifically, DSSC longevity and durability can be enhanced through the inclusion of substantially rigid substrates in the low-temperature sintering context. The low temperature range at which DSSCs can be fabricated allows tempered glass and other substrates to be used in various embodiments of the invention.

Referring back to FIG. 6, two rigid substrates may be substituted for the substrates 609 and 612 to form the photovoltaic cell 600, as described above. An anti-reflective coating may be applied to the rigid substrates to increase their ability to transmit radiation. Alternatively, tempered glass may be coated with a suspension of titania in the presence of a polylinker. The sintering is preferably accomplished at temperatures below about 150° C. This low-temperature range facilitates use of a broad class of substantially rigid substrates that would otherwise undergo physical and chemical changes at higher temperatures, which would diminish the intrinsic material strength of many substrates.

After sequentially adding sensitizing dye and electrolyte to the sintered titania, a second tempered glass plate, bearing a counter electrode (e.g., a very thin coating of platinum), is laminated to the first plate, thus forming a complete photovoltaic cell or module. A photovoltaic cell 600 may be formed using one rigid and one flexible substrate as well, according to the invention. In various embodiments, the substantially rigid substrate(s) is/are about 3 mm or less thick. In other embodiments, the substantially rigid substrate(s) may range in thickness from about 3 mm to about 0.5 inches in thickness.

Figure 19:
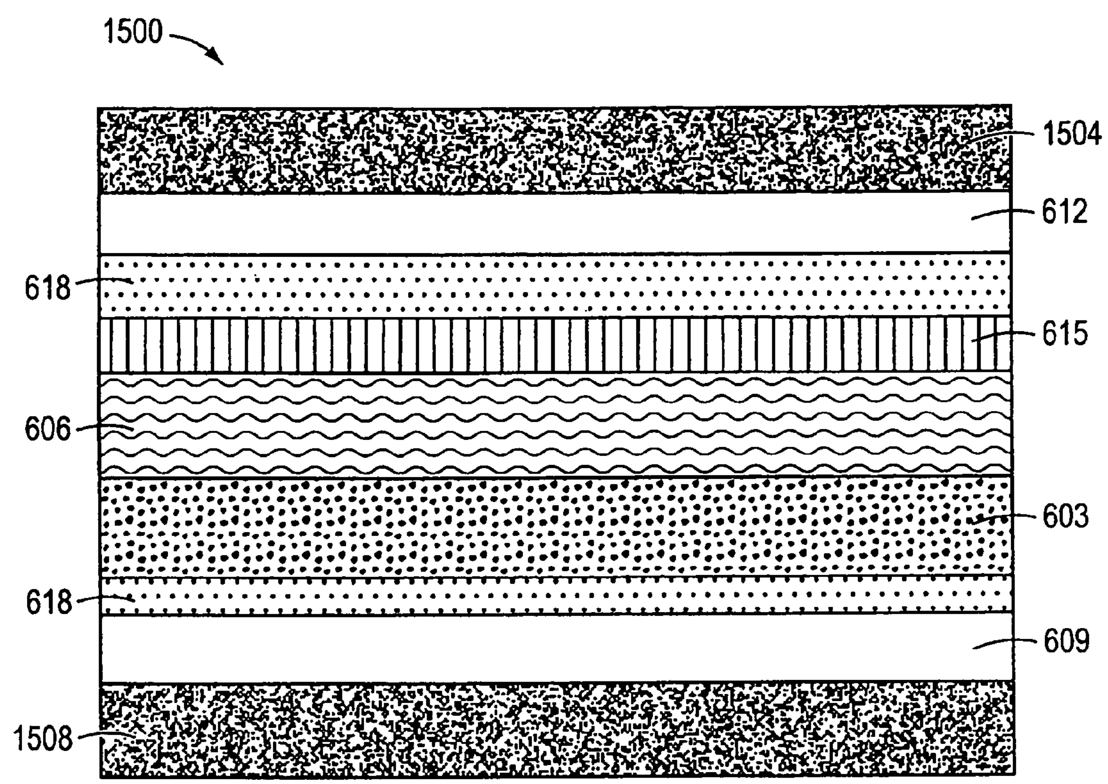
FIG. 19 depicts a cross-sectional view of a photovoltaic cell formed using rigid substrates, according to an illustrative embodiment of the invention.

FIG. 19 depicts another illustrative embodiment in which the photovoltaic cell 600 from FIG. 6 is sandwiched between two substantially rigid substrates 1504 and 1508 to form a rigid photovoltaic cell 1500. The remaining layers are described in detail above with reference to FIG. 6. The overall durability of the photovoltaic cell 600 shown in FIG. 6 is increased using this methodology. For example, the combination of a high speed, low cost, roll-to-roll manufacturing process with the shock resistance and gas barrier properties of tempered glass creates a unique photovoltaic system, suitable for outdoor applications. In a further illustrative embodiment, a suspension of titania is coated on a plastic substrate and sintered at low temperature by means of heating (<about 150° C.) in the presence of a polylinker, according to the invention. Sensitizing dye and electrolyte are added sequentially by standard coating techniques, and a counter electrode including a very thin coating of platinum on a coating of inert metal on a flexible plastic substrate is laminated to the first electrode, thereby creating a photovoltaic cell or module. The flexible cell or module is then laminated between two tempered glass plates or one tempered glass top plate (defined as the plate facing the light source) and a second support plate of another material.

Another advantage of the plastic-based PV module/tempered glass combination manifests itself in a lamination step. Typically, lamination of crystalline silicon cells and tempered glass is accomplished by applying vacuum while pressing the two materials together. In the illustrative embodiments described above, the lamination of the flexible photovoltaic cells or module to the tempered glass top plate may be performed at atmospheric pressure and room temperature (or elevated temperature) by applying an adhesive onto the glass plate with a laminating roller, without the requirement of vacuum. Thermal setting or photocuring of the adhesive is accomplished during or after the lamination step. Thus, substantially rigid substrates can provide both structural and manufacturing enhancements to existing DSSCs.

H. Methods for Scoring for Fabricating DSSCs

Figure 20A:
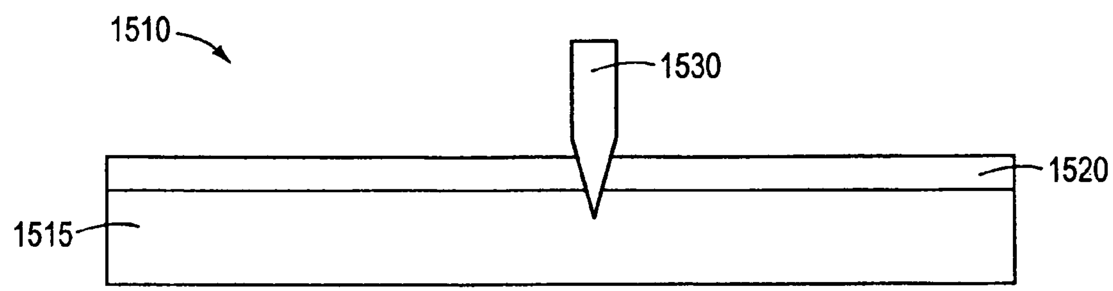
FIGS. 20A and 20B show the scoring of the base material of a photovoltaic cell or module, according to the invention.

In another illustrative embodiment, the invention provides methods that reduce the likelihood of cell contamination from debris when fabricating flexible photovoltaic cells and modules using a continuous manufacturing process, such as the one depicted in FIG. 7. FIG. 20A depicts a base material 1510 for a photovoltaic cell or module, where the base material 1510 is formed as a sheet or strip of material that includes a polymeric substrate 1515 and a conductive layer 1520. A heated stylus 1530 scores the polymeric substrate 1515 and the conductive layer 1520 by parting the conductive layer 1520 and, to some depth, melting the polymeric material of the substrate 1515. Scoring interrupts the electrical continuity of the otherwise continuous conductive layer 1520, and to a certain extent, encapsulates any debris from the conductive layer 1520 in the wake of the heated stylus 1530 when the polymeric substrate 1515 cools. Coating and entrapping conductive debris that may be in the melt of the polymeric substrate 1515 prevents these debris from interfering with the performance of the photovoltaic cell or module. The conductive layer 1520 may be semi conductive.

Figure 20B:
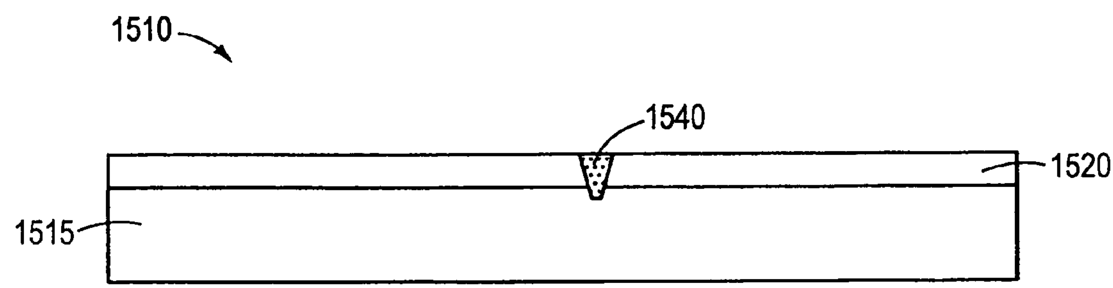

According to one illustrative embodiment, the heated stylus 1530 (which may be a soldering iron tip or a heated razor blade) is held in position by a fixed support system. For example, referring to FIGS. 7 and 20A, the heated stylus 1530 may be positioned to contact the advancing substrate 705 prior to the deposition of the photosensitized nanoparticle material 715. Preferably, by monitoring the temperature and geometry of the heated stylus 1530, the distance from the heated stylus 1530 to the advancing substrate 705, the pressure of the heated stylus 1530 on the advancing substrate 705, and the rate at which the advancing substrate 705 advances, the width and depth of the score mark 1540, for example as depicted in FIG. 20B, is determined.

Suitable polymeric substrate materials 1515, as described above, include, for example, PET, polyacrylonaphthalates, polyimides, PEN, polymeric hydrocarbons, cellulosics, and combinations thereof. Conductive layer 1520 materials include, but are not limited to, ITO and conductive polymers such as polyaniline and aniline, as described above. In various illustrative embodiments, the conductive layers 1520 are between about 0.5 microns and about 5 microns thick. Preferably, the conductive layers 1520 are between about 0.5 micron and about 1 micron thick. In addition, the conductive layers 1520 scored using this method may include a photosensitized nanomatrix layer, according to the invention.

I. Wire Interconnects for Fabricating DSSCs

Figure 21:
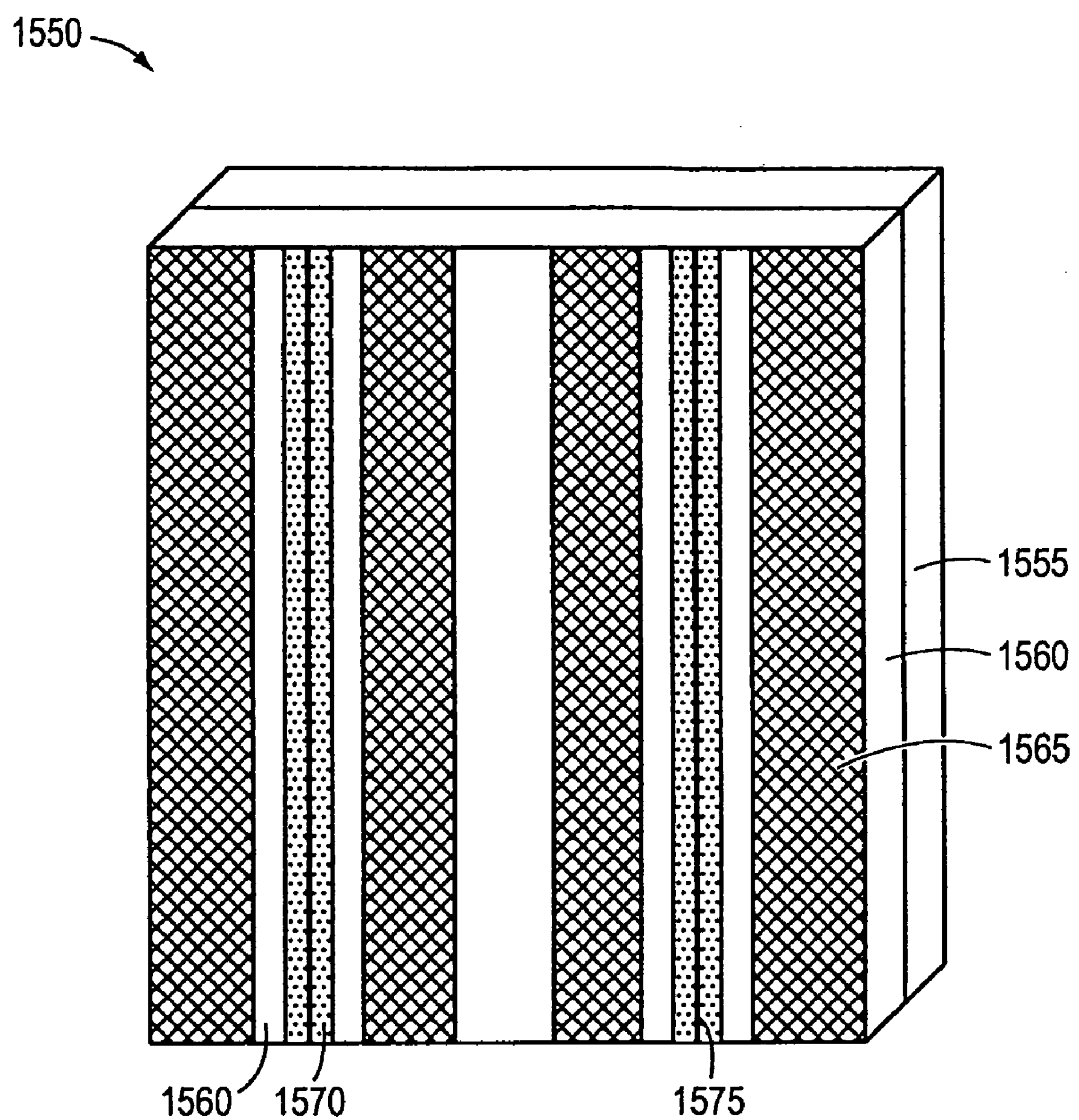
FIG. 21 depicts a base material suitable for forming a photovoltaic cell or module using wire interconnects, according to the invention.

In another illustrative embodiment, the invention provides methods of interconnecting photovoltaic cells (e.g., in parallel, in series, or combinations of both) to form photovoltaic modules using wire interconnects as part of a continuous manufacturing process, such as the one shown in FIG. 7. FIG. 21 depicts a base material 1550 suitable for forming a photovoltaic cell or module using wire interconnects. The base material 1550 includes a polymeric substrate 1555 and a conductive layer 1560, both in accordance with the invention. A portion of the base material 1550 is coated with a photoconductive layer 1565 (e.g., a photosensitized interconnected nanoparticle layer). A strip of hot melt adhesive 1570 is tacked to the conductive layer 1560, and a wire 1575 is placed over the strip of hot melt adhesive 1570.

Figure 22A:
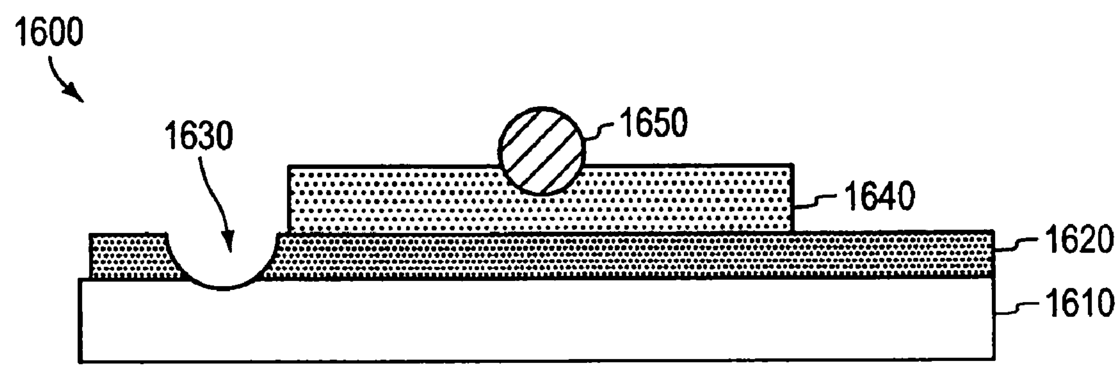
FIGS. 22A and 22B show an exemplary photovoltaic module formed using wire interconnects, according to the invention.
Figure 22B:
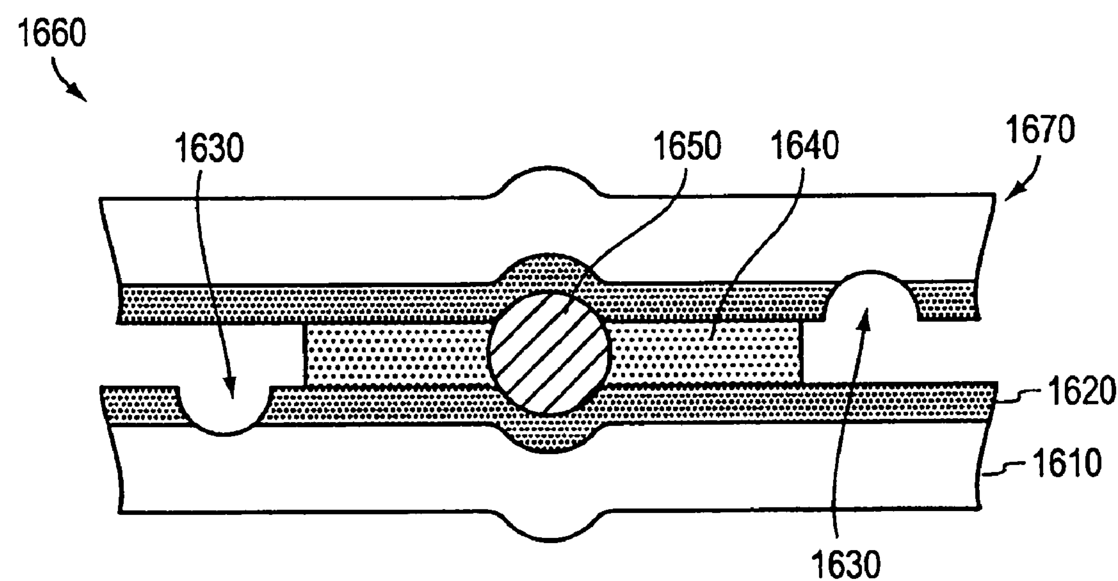

FIGS. 22A and 22B depict another illustrative embodiment of a photovoltaic module formed using wire interconnects. A first base material 1600 includes a polymeric substrate 1610 and a conductive layer 1620, as described above. A heated stylus, as described above, forms a score mark 1630 in the base material 1600, so that a plurality of discrete photovoltaic cells may be formed on a single base material 1600. The methods and structures described in detail above with respect to FIGS. 7 and 18 are used to complete the photovoltaic cells on the base material 1600. A strip of hot melt adhesive 1640 is then tacked to the conductive layer 1620, and a wire 1650 is placed over the strip of hot melt adhesive 1640.

Referring to FIG. 22B, the photovoltaic module 1660 is completed by placing a second base material 1670, including a polymeric substrate 1610, a conductive layer 1620, a score mark 1630, and a strip of hot melt adhesive 1640, on top of the first base material. The photovoltaic module 1660 is laminated together under heat and pressure to complete the structure. Under appropriate process conditions, the wire 1640 forces its way through the molten adhesive 1630, thus achieving electrical contact with both conductive layers 1620. After cooling, the adhesive 1630 solidifies, thereby trapping the wire 1650 in place. This results in a strong and conductive bond.

In one illustrative example, the thermal laminating step was performed with an aluminum strip machined to an appropriate size to match the size of the adhesive strips. The aligned sheets were placed in a thermal laminator and pressed together for 10 seconds at moderate pressure. The photovoltaic module 1660 was then moved to align the next adhesive strip with the press, and the process was repeated for each adhesive strip until the photovoltaic module 1660 was finished. The same adhesive and laminating procedure (without the wire interconnect) was used for the side seals of the photovoltaic module.

The embodiment illustrated in FIGS. 22A and 22B has been used to construct a working three stripe photovoltaic module. In one illustrative example, stripes of N3-dyed titania nanoparticles were coated onto an ITO coated polyester substrate. Score marks were made in the ITO to break the electrical continuity between the cells. Score marks were also made in the appropriate places in the conductive coating of a platinum/titanium counter electrode on the complimentary polyester substrate. The adhesive used was THERMO-BOND 615 adhesive (available from the 3M Corporation) in 2.5 mm thickness. THERMO-BOND 615 adhesive is a polyester-based hot melt adhesive supplied as a coated film on release paper. Strips of THERMO-BOND adhesive 615 were pretacked onto a platinum sheet by a brief cycle in a hot press at 120° C. The release paper was removed, and one strand of 3 mm 316 stainless steel wire was lightly pressed into the exposed adhesive strips between the cells.

The wire 1575 or 1650 is an electrical conductor, and preferably a metal electrical conductor. Suitable wire materials include, but are not limited to, copper, silver, gold, platinum, nickel, palladium, iron, and alloys thereof. In another illustrative embodiment, more than one wire is used for each interconnection. Further, although the wire is illustrated in FIGS. 22A and 22B as having a substantially circular cross-section, the cross-sectional shape of the wire is not limited to a substantially circular cross-section. Other suitable cross-sectional shapes of the wire include, those that are substantially square, rectangular, elliptical, triangular, trapezoidal, polygonal, arcuate, and even irregular shapes. In addition, the wire may be a single stranded wire or a multi-stranded wire (e.g., a plurality of wires twisted together).

The hot melt adhesive 1570 and 1640 is not limited to THERMO-BOND adhesive 615. Other hot melt adhesives (e.g., BYNEL adhesive available from DuPont) that are thermally activated may be applied as a strip or film. The wire 1575 and 1650 may be coated with the adhesive 1570 and 1640, applied under the adhesive 1570 and 1640, over the adhesive 1570 and 1640, or pre-embedded in a strip of adhesive 1570 and 1640. In addition, curing adhesives (e.g., epoxies) may be used. Preferably, the interconnection region is held in the desired final configuration during the cure cycle when curing adhesives are used.

Wire interconnects are typically quite tolerant with respect to alignment. Furthermore, the wire providing the interconnection is protected by a nonconductive adhesive. As a result, if a minor misalignment occurs and the adhesive bridges are scored, an electrical short will not result. Wire interconnects also facilitate the reduction of gaps between cells, which typically leads to higher overall photovoltaic module efficiency.

J. DSSCs with Metal Foil

Figure 23:
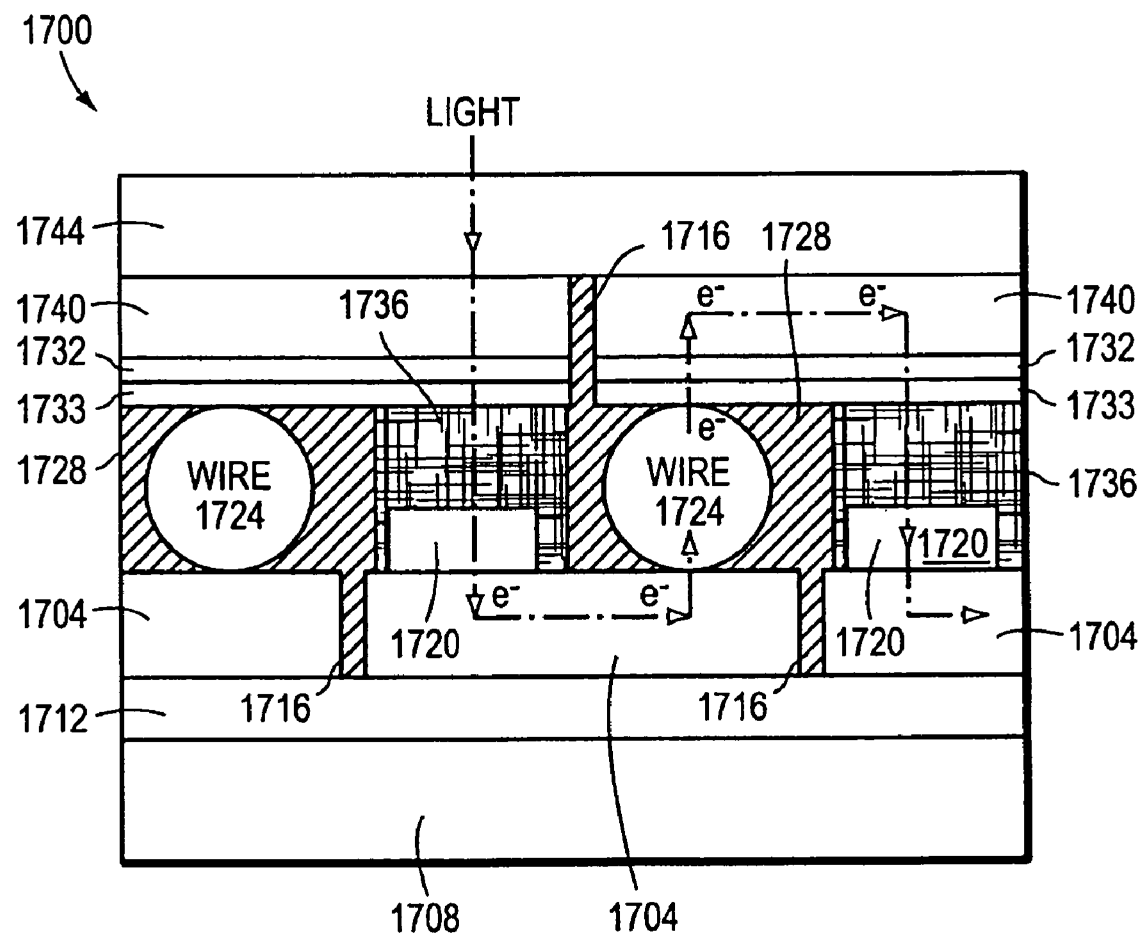
FIG. 23 shows a photovoltaic module formed using a metal foil coated with a photosensitized nanoparticle material, according to the invention.

According to another illustrative embodiment, a flexible photovoltaic module is formed using conventional methods (i.e., temperatures>about 400° C.) by first forming the interconnected nanoparticle layer on a flexible, metal foil, which is then laminated to a flexible substrate. The nanoparticle layer may be interconnected at low temperatures (<about 300° C.) as well. In either temperature range, a continuous manufacturing process, such as a roll-to-roll process, may be used. FIG. 23 depicts a photovoltaic module 1700 including a metal foil 1704. More particularly, the metal foil 1704 is laminated to a first flexible substrate 1708 using a first adhesive 1712. Score marks 1716 formed in the metal foil 1704 using a heated stylus serve to break the electrical continuity of the metal foil 1704, thus enabling a plurality of photovoltaic cells to be formed on a single substrate. A photosensitized nanoparticle material 1720, according to the invention, is disposed on the metal foil 1704. According to the illustrative embodiment, the photovoltaic module 1700 includes wire interconnects 1724 embedded in a second adhesive layer 1728 to form an electrical connection between the metal foil 1704 and a platinum-coated 1732 counter electrode 1733. The photovoltaic module 1700 also includes a charge carrier material 1736 and a conductive layer 1740 coated on a second substrate 1744. The metal foil 1704 may be any suitable conductive metal such as, for example, titanium, copper, silver, gold, platinum, nickel, palladium, iron, and alloys thereof, Suitable materials for the adhesive layer 1728 include BYNEL and THERMO-BOND, which are described above. Thermoplastic and thermoset may also eb used as the adhesive layer. According to one illustrative embodiment, the counter electrode 1733 includes a patterned-semiconductor, an adhesive layer, and a wire interconnect all formed on a flexible, transparent substrate.

According to the illustrative embodiment and using methods described above, a nanoparticle layer is coated on the metal foil 1704 in a continuous, intermittent, or patterned format. The nanoparticle layer is sintered at either low or high temperatures. The metal foil 1704 is then scored to break the electrical continuity. The separated metal foil 1704 strips are thereupon laminated, according to the invention, to the nonconductive substrate 1708. A sensitizing dye and/or co-sensitizer may be applied to the nanoparticle layer to complete the photosensitized nanoparticle material 1720. A charge carrier material 1736 is coated over the photosensitized nanoparticle material 1720, and an adhesive layer 1728 and wire interconnect 1724 are added to couple the metal foil 1704 to the counter electrode 1733. A second flexible substrate coated with a conductive layer is laminated to complete the photovoltaic module.

In a preferred embodiment, the metal foil 1704 is titanium, the photosensitized nanoparticle material 1720 includes sintered titania, the conductive layer 1740 is ITO, and the second substrate 1744 is PET. The photovoltaic module may be constructed using a continuous manufacturing process, such as the one depicted in FIG. 7. Such a process (e.g., a roll-to-roll process) includes the step of (1) coating a titania dispersion continuously, intermittently, or in a patterned format (e.g., to discrete portions) on the metal foil; (2) in line high or low temperature sintering of the titania coated metal foil; (3) in line sensitization of the titania coating; (4) slitting (e.g., by an ultrasonic slitting technique described in more detail below) the metal foil into strips; (5) separating the strips, or ribbons, to a finite spacing by using a sequentially positioned series of guide roller or by simply conveying the slit strips over a contoured roll that provides lateral spreading and separation of the strips at a finite distance; and (6) laminating the strips to a first flexible, substrate. An electrolyte, counter electrode, and second substrate including a conductive layer may be laminated to the metal-foil-coated first substrate to complete the photovoltaic cell or module.

Figure 24:
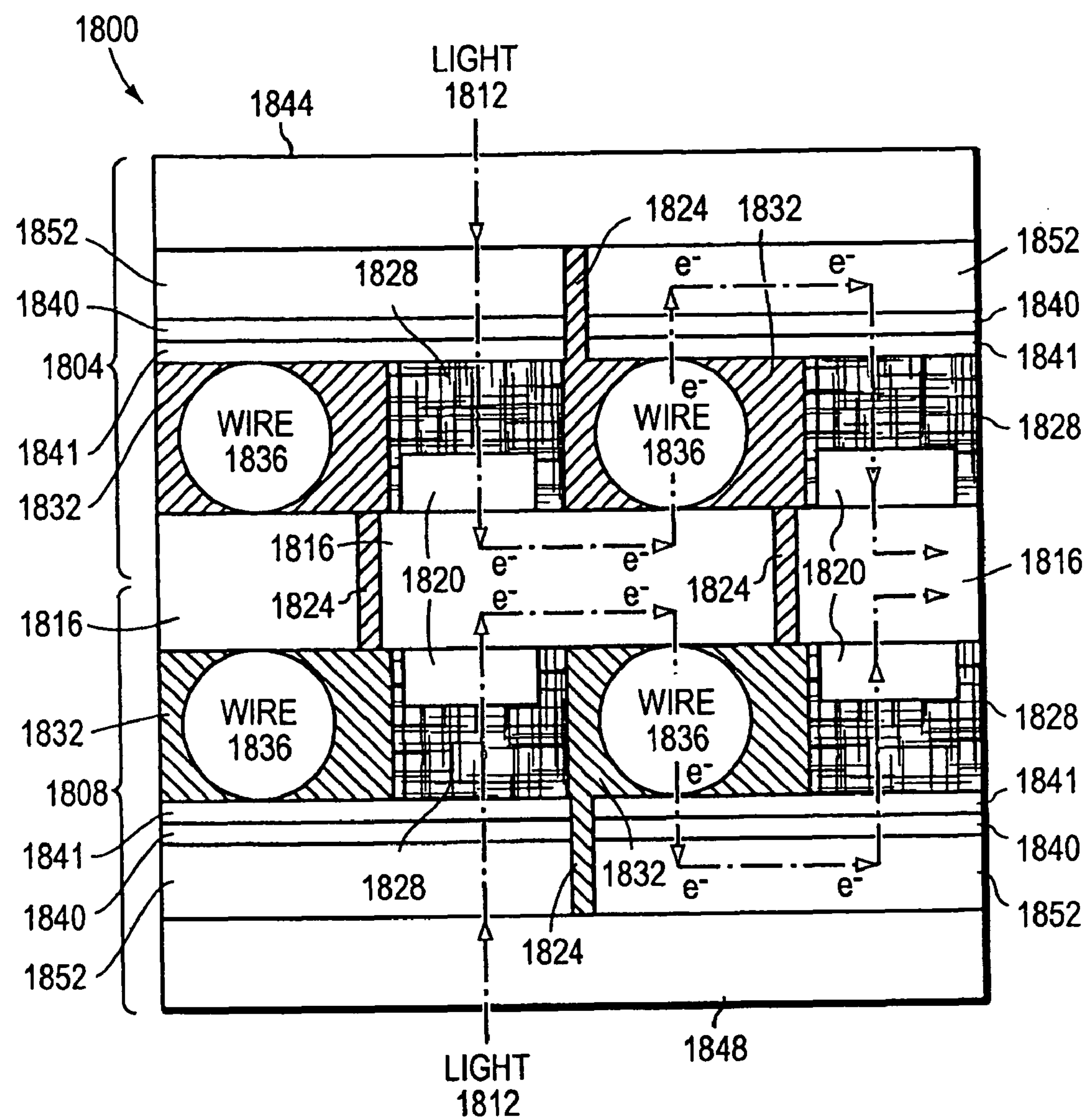
FIG. 24 depicts an exemplary photovoltaic module capable of receiving radiation through two surfaces, according to the invention.

FIG. 24 depicts, according to another illustrative embodiment, a metal-foil photovoltaic module 1800 that includes two photovoltaic modules 1804 and 1808 sandwiched together, thus permitting radiation 1812 to be received through two surfaces. The photovoltaic module 1800 may be formed using a continuous manufacturing process. According to the illustrative embodiment, a metal foil 1816 includes a photosensitized nanoparticle material 1820 disposed on two surfaces. The metal foil 1816 is scored as indicated at 1824 to disrupt the electrical continuity, and an electrolyte 1828, an adhesive layer 1832, a wire interconnect 1836, and a platinum-coated 1840 counter electrode 1841 are all disposed between the metal foil 1816 and two flexible substrates 1844 and 1848, thus completing the two photovoltaic modules. According to one illustrative embodiment, a conductive layer 1852 is disposed on the flexible substrates 1844 and 1848. In a preferred embodiment, the metal foil 1816 is titanium, the photosensitized nanoparticle material 1820 includes sintered titania, the conductive layer 1852 is ITO, and the two flexible substrates 1844 and 1848 are PET.

K. Ultrasonic Welding

According to another illustrative embodiment, an ultrasonic slitting device is used to slit the leading and the trailing edge of a flexible photovoltaic module as it advances during a continuous manufacturing process, such as the one depicted in FIG. 7. For example, the slitting device 740 may be translated across the advancing sheet of photovoltaic cells or modules after the second flexible substrate 735 is applied to the advancing substrate sheet 705. In one illustrative embodiment, the photovoltaic cell or modules include a metal foil coated with a photosensitized nanomatrix material.

The ultrasonic slitting device 740 may be a Branson Model FS-90. Preferably, the FS-90 is set to an amplitude of 50%, a pressure of 50-60 PSI, a speed of 5-10, and an anvil specification of 90°. The device 740 creates friction that melts the photovoltaic cell or module, thus simultaneously cutting and sealing the material. This prevents the electrolyte from leaking and precludes the atmosphere from penetrating the photovoltaic cell or module. Furthermore, the process interrupts conductive layers coated on the substrate.

L. Wire Interconnects with Metal Coatings

Figure 25:
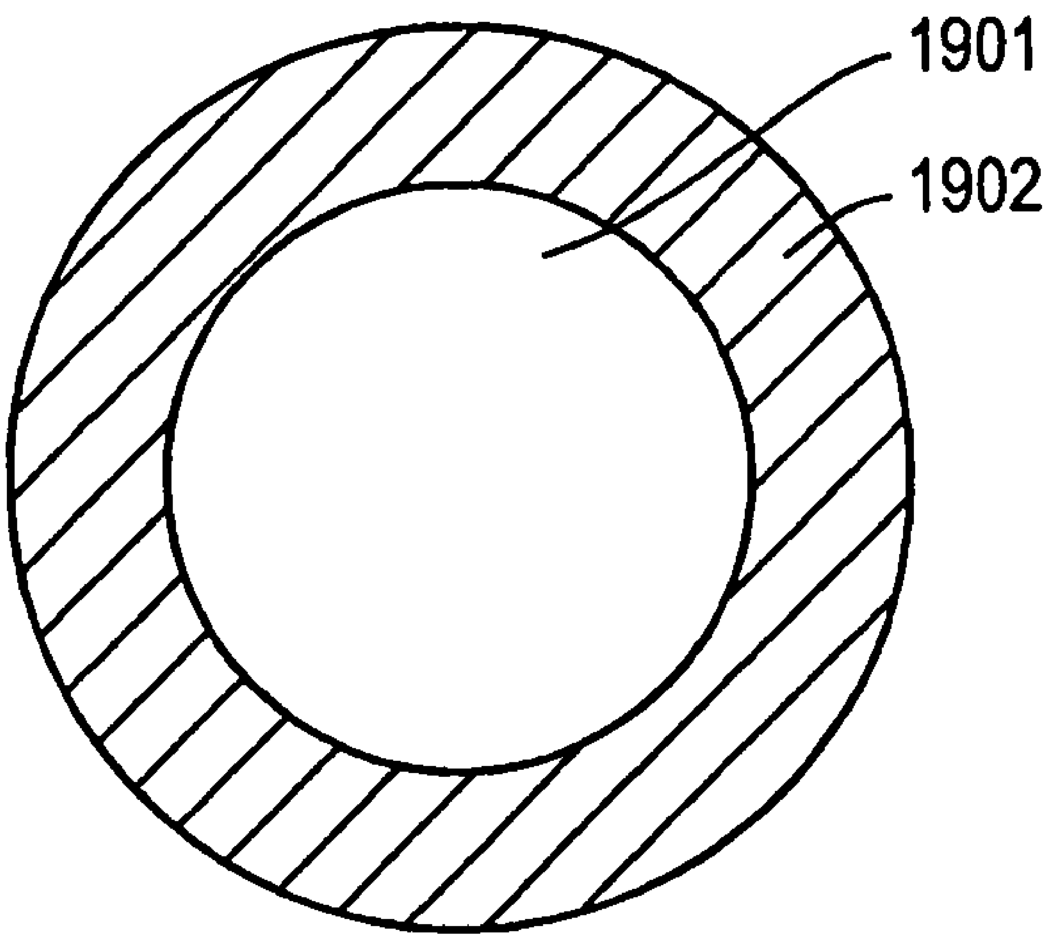
FIG. 25 depicts a metal wire coated with a metal having a low melting temperature, according to the invention.

In another illustrative embodiment, the invention provides a method of coating a wire interconnect with a metal or metal alloy with a low melting temperature. The metal or metal alloy melts during the lamination process, providing a more uniform contact between the two joined substrates. The improved contact enhances both the mechanical adhesion and the electrical connection. FIG. 25 depicts a cross-section of a wire 1901 coated with a surrounding layer of a metal 1902 with a low melting temperature. The metal 1902 may be a metal alloy. According to one illustrative embodiment, the coated wire is substituted for the uncoated wire shown in FIG. 21, 22, or 23.

Figure 26:
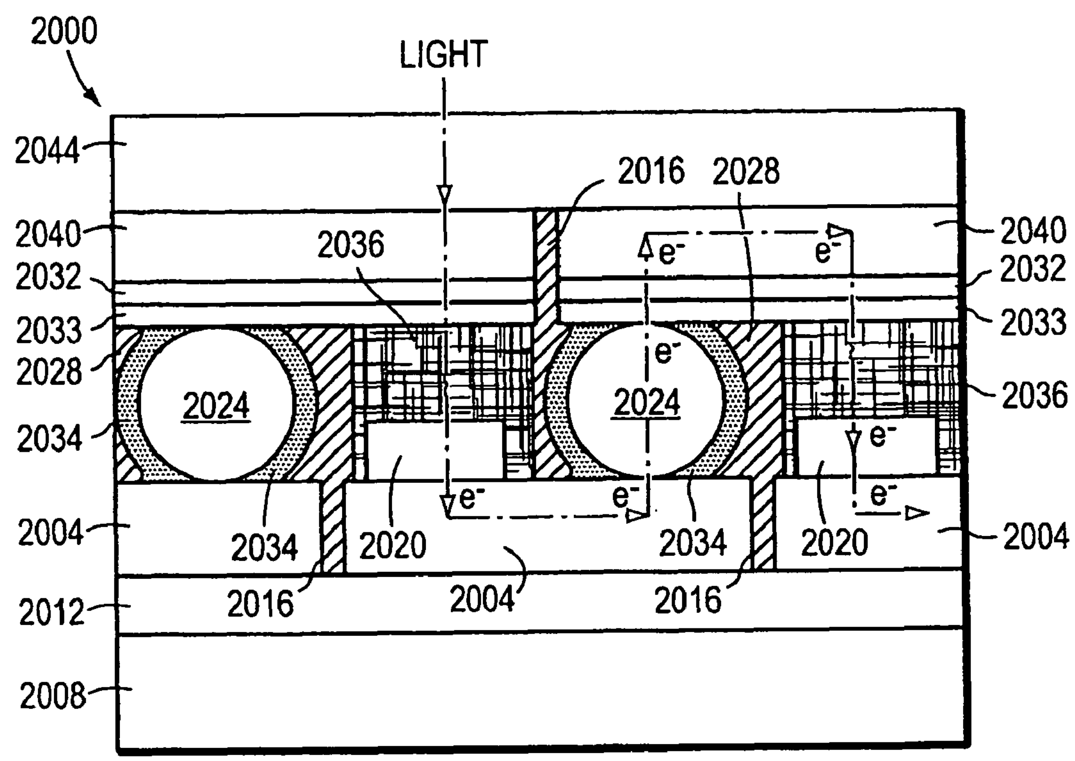
FIG. 26 shows an exemplary photovoltaic module with a wire interconnect including a metal coated wire, according to the invention.

FIG. 26 depicts exemplary photovoltaic module 2000 including a metal foil 2004. More particularly, the metal foil 2004 is laminated to a first flexible substrate 2008 using a first adhesive 2012. Score marks 2016 fonned in the metal foil 2004 using a heated stylus to break the electrical continuity of the metal foil 2004, thus enabling a plurality of photovoltaic cells to be formed on a single substrate. A photosensitized nanoparticle material 2020, according to the invention, is disposed on the metal foil 2004. According to the illustrative embodiment, the photovoltaic module 2000 includes wire interconnects 2024 embedded in a second adhesive layer 2028 to form an electrical connection between the metal foil 2004 and a counter electrode 2033 coated with platinum 2032. The wire 2024 is coated with a low melting temperature metal 2034. During lamination, the metal 2034 melts and flows, thus forming a more uniform contact with the metal foil 2004 and the counter electrode 2033. The photovoltaic module 2000 also includes a charge carrier material 2036 and a conductive layer 2040 coated on a second substrate 2044.

The wire 2024, as describe above, may be copper, titanium, stainless steel, or other suitable wire. In a preferred embodiment, the wire is a 3 mil copper wire, and is coated with a eutectic mixture of bismuth-tin. The melting temperature of bismuth-tin is 138° C. A thin sheet of BYNEL adhesive (ethylene maleic anhydride) is disposed between the metal foil and the counter electrode. The melting temperature of the adhesive is 126° C. The adhesive and coated metal wire are then thermally laminated (hot bar laminator at a temperature of about 150° C.) between two PET substrates with ITO conductive layers. Suitable metals have melting temperatures in the range of about 50° C. to about 250° C. Preferably, the melting temperatures are in the range of about 75° C. to about 180° C., and the adhesive melts at a lower temperature than the metal coating.

While the invention has been particularly shown and described with reference to specific illustrative embodiments, it should be understood that various changes in form and detail may be made without departing from the spirit and scope of the invention as defined by the appended claims. By way of example, any of the disclosed features may be combined with any of the other disclosed features to form a photovoltaic cell or module.

What is claimed is:

1. An article, comprising:

first and second significantly light-transmitting, glass substrates;

first and second significantly light-transmitting, polymer substrates, both of which are disposed between the first and second significantly light-transmitting, glass substrates; and a photoactive layer disposed between the first and second significantly light-transmitting, polymer substrates, the photoactive material comprising:

a photosensitized interconnected nanoparticle material; and a charge carrier material;

wherein:

the article is configured as a photovoltaic cell;

the photosensitized interconnected nanoparticle material comprises nanoparticles linked by a polymeric linking agent;

the polymeric linking agent has a backbone structure of the formula of $-[M-O-]_m-$;

M is a metal; and m is an integer greater than 4.

2. The article of claim 1, wherein the photosensitized interconnected nanoparticle material comprises particles with an average size in the range of about 5 nm to about 80 nm.

3. The article of claim 1, wherein the photosensitized interconnected nanoparticle material is selected from the group consisting of titanium oxides, zirconium oxides, zinc oxides, tungsten oxides, niobium oxides, lanthanum oxides, tin oxides, tantalum oxides, terbium oxides, and combinations thereof.

4. The article of claim 1, wherein the photosensitized interconnected nanoparticle material comprises a photosensitizing agent that comprises a molecule selected from the group consisting of xanthines, cyanines, merocyanines, phthalocyanines, and pyrroles.

5. The article of claim 1, wherein the photosensitized interconnected nanoparticle material comprises a photosensitizing agent that comprises a metal ion selected from the group consisting of divalent and trivalent metals.

6. The article of claim 1, wherein the photosensitized interconnected nanoparticle material comprises a photosensitizing agent that comprises at least one of a ruthenium transition metal complex, an osmium transition metal complex, and an iron transition metal complex.

7. The article of claim 1, wherein the charge carrier material comprises a redox electrolyte system.

8. The article of claim 1, wherein the charge carrier material comprises a polymeric electrolyte.

9. The article of claim 1, further comprising a catalytic media layer disposed between the first and second significantly light-transmitting, polymer substrates.

10. The article of claim 9, wherein the catalytic media layer comprises platinum.

11. The article of claim 1, further comprising an electrical conductor material applied to at least one of the first and second significantly light-transmitting, polymer substrates.

12. The article of claim 11, wherein the electrical conductor material comprises indium tin oxide.

13. The article of claim 1, wherein at least one of the first and second significantly light-transmitting, polymer substrates comprises a polyethylene naphthalate material or a polyethylene terephthalate material.

14. The article of claim 1, wherein the first and second significantly light-transmitting, glass substrates comprise tempered glass.

15. The article of claim 1, wherein the plurality of nanoparticles have the formula $M_xO_y$, wherein x and y are integers greater than zero.

16. An article, comprising:

first and second significantly light-transmitting, glass substrates;

first and second significantly light-transmitting, polymer substrates, both of which are disposed between the first and second significantly light-transmitting, glass substrates; and a photoactive layer disposed between the first and second significantly light-transmitting, polymer substrates, the photoactive material comprising:

a photosensitized interconnected nanoparticle material; and a charge carrier material;

wherein:

the article is configured as a photovoltaic cell;

the photosensitized interconnected nanoparticle material comprises nanoparticles linked by a polymeric linking agent;

the polymeric linking agent has the formula $—[O-M(OR)_i—]_m—$;

i is an integer greater than zero;

m is an integer greater than zero;

M is selected from the group consisting of Ti, Zr, Sn, W, Nb, Ta, and Tb; and

R is selected from the group consisting of hydrogen, alkyls, alkenes, alkynes, aromatics, and acyls.

17. The article of claim 16, wherein the plurality of nanoparticles have the formula $M_xO_y$, wherein x and y are integers greater than zero.

18. The article of claim 16, wherein the photosensitized interconnected nanoparticle material comprises particles with an average size in the range of about 5 nm to about 80 nm.

19. The article of claim 16, wherein the photosensitized interconnected nanoparticle material is selected from the group consisting of titanium oxides, zirconium oxides, zinc oxides, tungsten oxides, niobium oxides, lanthanum oxides, tin oxides, tantalum oxides, terbium oxides, and combinations thereof.

20. The article of claim 16, wherein the photosensitized interconnected nanoparticle material comprises a photosensitizing agent that comprises a molecule selected from the group consisting of xanthines, cyanines, merocyanines, phthalocyanines, and pyrroles.

21. The article of claim 16, wherein the photosensitized interconnected nanoparticle material comprises a photosensitizing agent that comprises a metal ion selected from the group consisting of divalent and trivalent metals.

22. The article of claim 16, wherein the photosensitized interconnected nanoparticle material comprises a photosensitizing agent that comprises at least one of a ruthenium transition metal complex, an osmium transition metal complex, and an iron transition metal complex.

23. The article of claim 16, wherein the charge carrier material comprises a redox electrolyte system.

24. The article of claim 16, wherein the charge carrier material comprises a polymeric electrolyte.

25. The article of claim 16, further comprising a catalytic media layer disposed between the first and second significantly light-transmitting, polymer substrates.

26. The article of claim 16, wherein the catalytic media layer comprises platinum.

27. The article of claim 16, further comprising an electrical conductor material applied to at least one of the first and second significantly light-transmitting, polymer substrates.

28. The article of claim 27, wherein the electrical conductor material comprises indium tin oxide.

29. The article of claim 16, wherein at least one of the first and second significantly light-transmitting, polymer substrates comprises a polyethylene naphthalate material or a polyethylene terephthalate material.

30. The article of claim 16, wherein the first and second significantly light-transmitting, glass substrates comprise tempered glass.

* * * * *